(12) United States Patent
Saito et al.

(10) Patent No.: US 6,742,675 B2
(45) Date of Patent: Jun. 1, 2004

(54) ELECTRONIC COMPONENT FEEDING APPARATUS

(75) Inventors: Koji Saito, Tokyo (JP); Atsuo Kamimura, Tokyo (JP)

(73) Assignee: Taiyo Yudan Co., Ltd, Tokyo (JP)

( * ) Notice: Subject to any disclaimer, the term of this patent is extended or adjusted under 35 U.S.C. 154(b) by 0 days.

(21) Appl. No.: 10/395,163

(22) Filed: Mar. 25, 2003

(65) Prior Publication Data

US 2003/0178438 A1 Sep. 25, 2003

Related U.S. Application Data

(63) Continuation of application No. 09/895,390, filed on Jul. 2, 2001, now Pat. No. 6,568,558.

(30) Foreign Application Priority Data

Jul. 3, 2000 (JP) ........................................ 2000-200716
Nov. 15, 2000 (JP) ........................................ 2000-348171

(51) Int. Cl.[7] ............................ B65G 3/60; G07F 11/00; G07F 11/26; B65H 5/00
(52) U.S. Cl. ........................ 221/200; 221/224; 221/236
(58) Field of Search ................................ 221/157, 200, 221/202, 211, 224, 236, 239, 251, 290

(56) References Cited

U.S. PATENT DOCUMENTS

| 1,632,852 | A | 6/1927 | Richter ........................ 221/251 |
| 4,763,812 | A | 8/1988 | Sekinoo et al. .............. 221/290 |
| 5,730,317 | A | 3/1998 | Mitsushima et al. ........ 221/236 |
| 5,934,505 | A | 8/1999 | Shimada ...................... 221/200 |
| 6,062,423 | A | 5/2000 | Saito et al. .................. 221/200 |
| 6,345,728 | B1 | 2/2002 | Kawaguchi et al. ......... 221/239 |

FOREIGN PATENT DOCUMENTS

| JP | 1-183200 | 7/1989 |
| JP | 6-232596 | 8/1994 |

Primary Examiner—Gene O. Crawford
(74) Attorney, Agent, or Firm—Lowe Hauptman Gilman & Berner, LLP

(57) ABSTRACT

An electronic component feeding apparatus comprises a feeding rotor having a recess for forming a parallel space with a plane orthogonal to the rotation axis. By oscillating a feeding rotor within a predetermined angular range, the apparatus takes the electronic components stored in bulk in a storeroom into the parallel space, and move the electronic components in the parallel space toward a feeding path each time the bottom of the parallel space tilts down toward the feeding path during an oscillation of the feeding rotor, and take the electronic components into the feeding path one by one, and allow the electronic component taken into the feeding path to move downward by gravity.

22 Claims, 41 Drawing Sheets

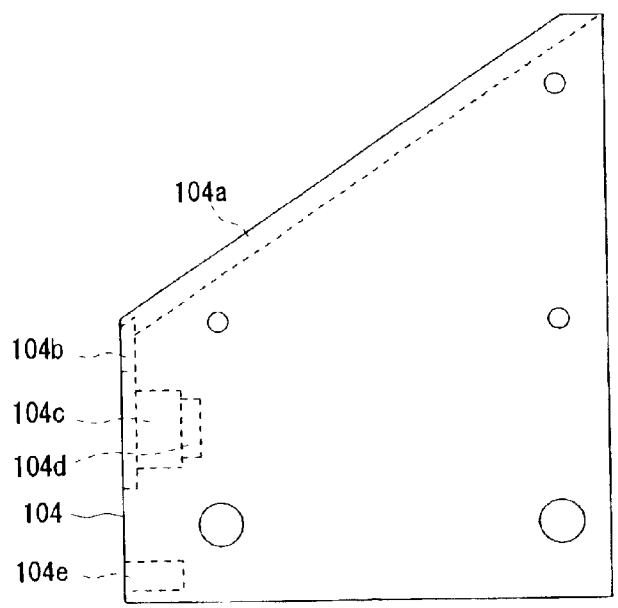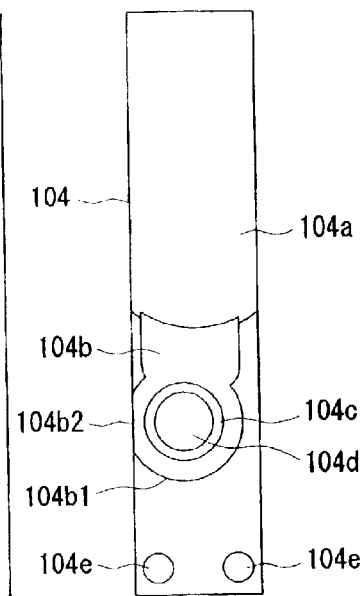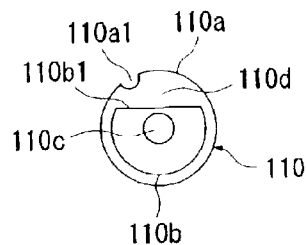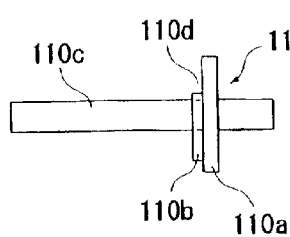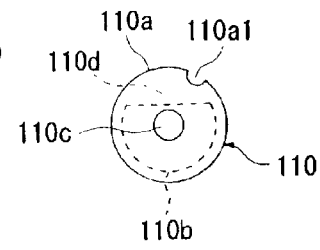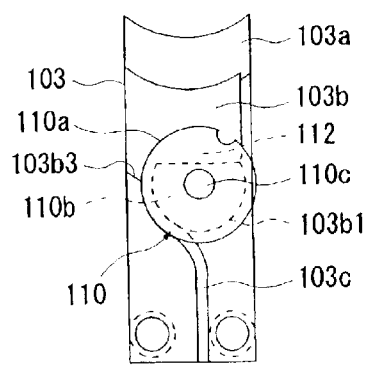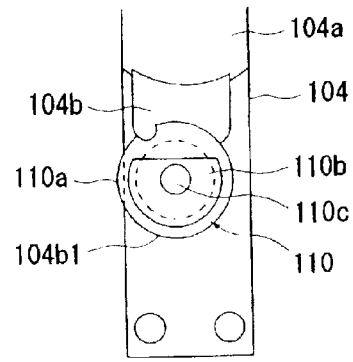

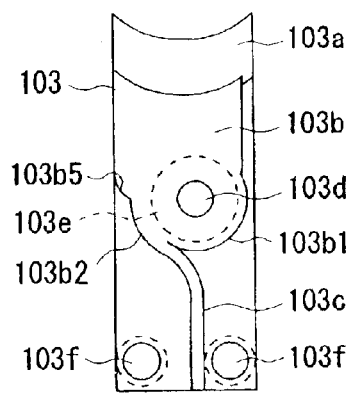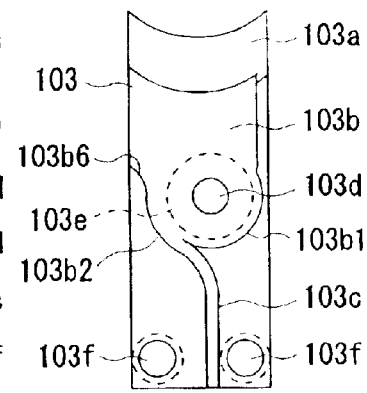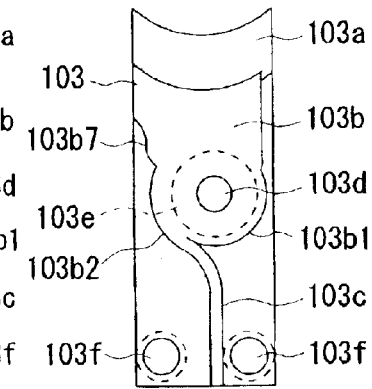
FIG. 18A  FIG. 18B  FIG. 18C
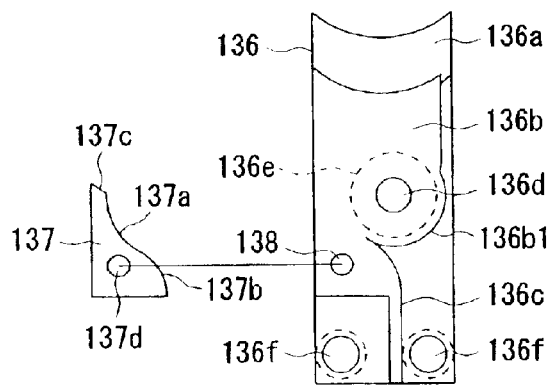
FIG. 19
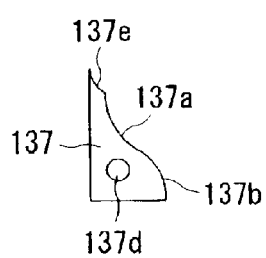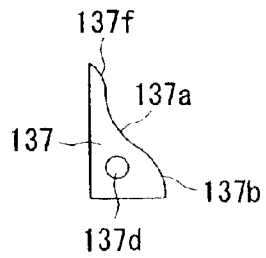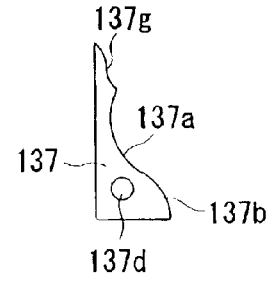
FIG. 20A  FIG. 20B  FIG. 20C

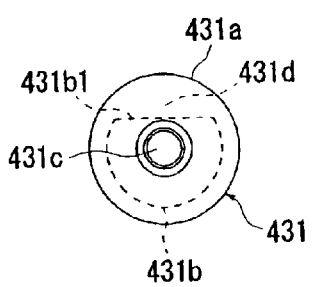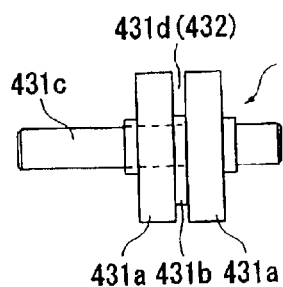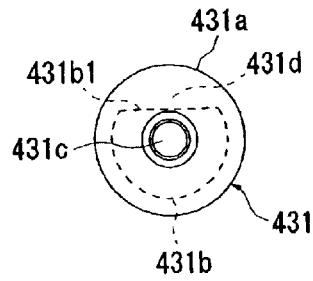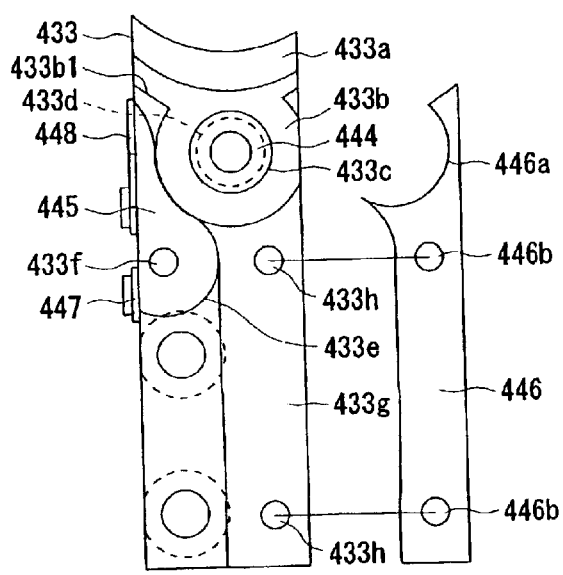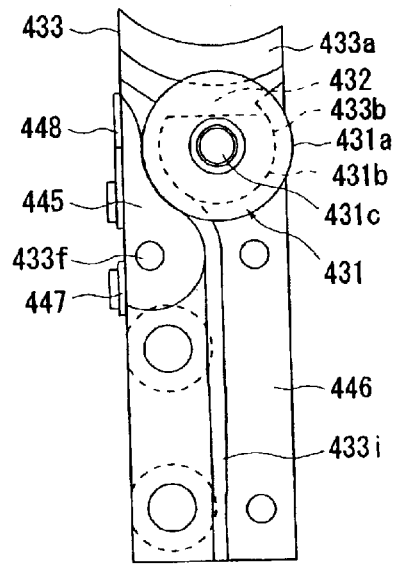

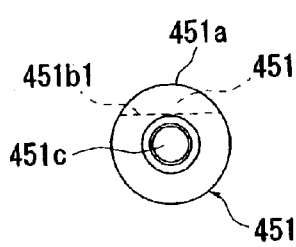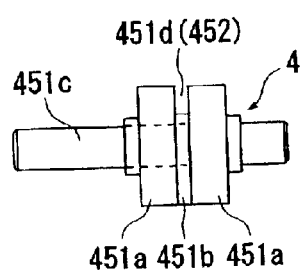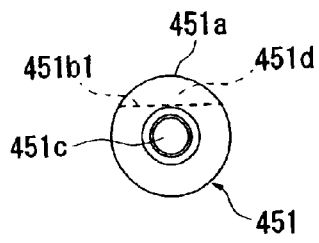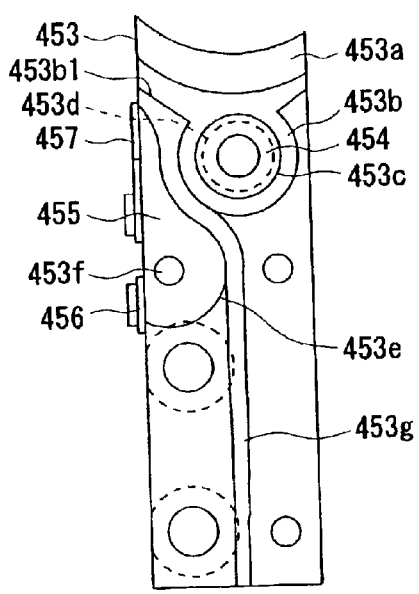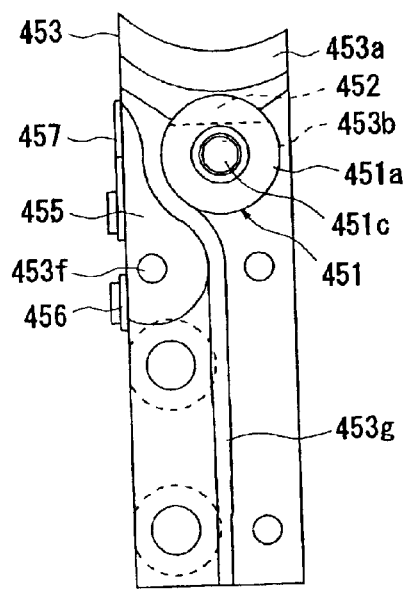

ELECTRONIC COMPONENT FEEDING APPARATUS

This application is a continuation of application Ser. No. 09/895,390 filed Jul. 2, 2001 now U.S. Pat. No. 6,568,558.

BACKGROUND OF THE INVENTION (1) Field of the Invention

The present invention relates to an electronic component feeding apparatus which ranges and feeds electronic components stored in bulk.

(2) Description of the Related Art

This type of electronic component feeding apparatus has been disclosed by Japanese Patent Laid-Open No. 6-232596. The apparatus disclosed in the specification takes chip components stored in bulk in a component storeroom into a component transport tube longitudinally, using the vertical travel of a component retrieval tube, discharges them from the component retrieval tube onto a belt, and transports them by the belt. The chip component transported into a predetermined position is taken out by a suction nozzle or the like and mounted on a substrate and the like.

With increases in the loading speed of components onto the substrate and the like, feeding performance capable of keeping pace with component retrieval in a fast-cycle time of 0.1 second or less is now required of this type of electronic component feeding apparatus. However, with the structure of the apparatus described above, it is difficult to enhance the efficiency with which components are taken into the component transport tube even if the vertical travel speed of the component retrieval tube is increased. Thus, enhancement of the feeding performance is structurally limited.

To meet the above demand, an apparatus is newly required that can efficiently feed electronic components such as chip components in the shape of a rectangular prism, a cylinder, or the like and keep pace with fast-cycle component retrieval.

SUMMARY OF THE INVENTION

An object of the present invention is to provide a novel electronic component feeding apparatus which can keep pace with fast-cycle component retrieval.

To attain the above object, an electronic component feeding apparatus of the present invention comprises: a storeroom for storing electronic components with a predetermined shape in bulk; a feeding rotor having a recess for forming a parallel space with a plane orthogonal to the rotation axis, said feeding rotor being rotatably disposed on the bottom of the storeroom in a state of facing a part of an outer periphery thereof onto the storeroom and communicating the parallel space with the storeroom, said parallel space capable of taking in a plurality of electronic components from the storeroom in a predetermined orientation; rotor driving means for oscillating the feeding rotor within a predetermined angular range; and a feeding path having a cross-sectional shape for allowing the electronic components to be taken in one by one in a predetermined orientation from the parallel space and allowing the electronic components to move downward by gravity.

By oscillating the feeding rotor within a predetermined angular range, this electronic component feeding apparatus can take the electronic components stored in bulk in the storeroom into the parallel space in such an orientation that the center line of the electronic components will be parallel to the parallel space, and move the electronic components in the parallel space toward the feeding path each time the bottom of the parallel space tilts down toward the feeding path during an oscillation of the feeding rotor, and take the electronic components into the feeding path one by one in such an orientation that the center line of the electronic components will be parallel to the feeding path, and allow the electronic component taken into the feeding path to move downward by gravity.

Thus, by simply oscillating the feeding rotor within a predetermined angular range, the apparatus can feed, in aligned form, the electronic components stored in bulk in the storeroom, in an efficient and stable manner. Therefore, the apparatus provides feeding performance capable of keeping pace with component retrieval in a fast cycle time of 0.1 second or less.

The above object, other objects, configuration features, and advantages of the present invention will be apparent from the following description taken in conjunction with the accompanying drawings.

BRIEF DESCRIPTION OF THE DRAWINGS

FIG. 5A is a left side view of the second support member shown in FIG. 3, and FIG. 5B is a front view thereof;

FIG. 6A is a front view of the feeding rotor shown in FIG. 3, FIG. 6B is a left side view thereof, and FIG. 6C is a rear view thereof;

FIG. 7A is a diagram showing the state in which the feeding rotor is placed in the first support member, and FIG. 7B is a diagram showing the state in which the feeding rotor is placed in the second support member;

FIGS. 18A to 18C are diagrams showing variations of the sliding surface of the first support member of the apparatus shown in FIG. 1;

FIG. 19 is a diagram showing a variation of the first support member of the apparatus shown in FIG. 1;

FIGS. 20A to 20C are diagrams showing variations of the sliding surface of the guide plate shown in FIG. 19;

FIG. 73A is a front view of a feeding rotor with a configuration different from those of the feeding rotors used in the first, second, and third apparatus, FIG. 73B is a left side view thereof, and FIG. 73C is a rear view thereof;

FIGS. 74A and 74B are diagrams showing the first support member used to mount the feeding rotor shown in FIGS. 73A to 73C;

FIG. 77A is a front view of a feeding rotor with a configuration different from those of the feeding rotors used in the first, second, and third apparatus, FIG. 77B is a left side view thereof, and FIG. 77C is a rear view thereof;

FIGS. 78A and 78B are diagrams showing the first support member used to mount the feeding rotor shown in FIGS. 77A to 77C;

DETAILED DESCRIPTION OF THE PREFERRED EMBODIMENTS

[First Embodiment]

Figure 1:
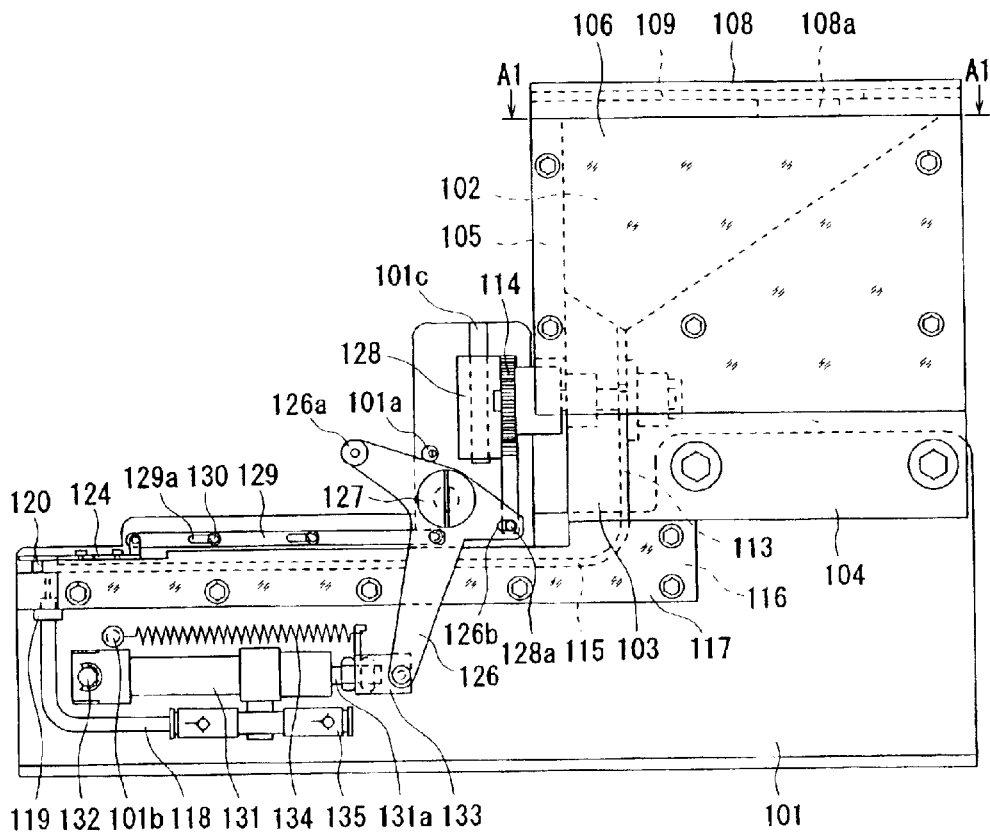
FIG. 1 is a left side view of a first apparatus according to the present invention.

FIGS. 1 to 17 show the configuration and operation of a first apparatus according to the present invention while FIGS. 18 to 22 show partial variations of the first apparatus. In the following description, the left side in FIG. 1 is referred to as the front, right side—as the rear, the near side—as the left, and the far side—as the right.

A frame 101 is prepared by punching a stainless steel or other metal plate and shaping it by bending or the like. The example shown in the figure has a bend on its lower edge to enhance its rigidity, but this bend is not strictly necessary. On the left flank of the frame 101 are a stopper pin 101a for a control lever, engagement pin 101b for a coil spring, and rail 101c for a rack.

A storeroom 102 for storing electronic components EC in bulk consists of a flat space enclosed by a first support member 103 and second support member 104 for rotatably supporting a feeding rotor 110, front side member 105, left side plate 106, right side plate 107, and upper side member 108. The second support member 104 is screwed to the frame 101, the first support member 103 is screwed to the second support member 104, the left side plate 106 and right side plate 107 are screwed to the second support member 104, the front side member 105 is screwed being sandwiched between the left side plate 106 and right side plate 107, and the upper side member 108 is screwed to the second support member 104 and front side member 105. At least one of the left side plate 106 and right side plate 107 is transparent or translucent, so that the stockpile of components in the storeroom 102 can be seen from outside. A supply port 108a is formed in the upper side member 108, and a lid member 109 for opening and closing the supply port 108a is slidably attached to the upper side member 108.

Figure 3:
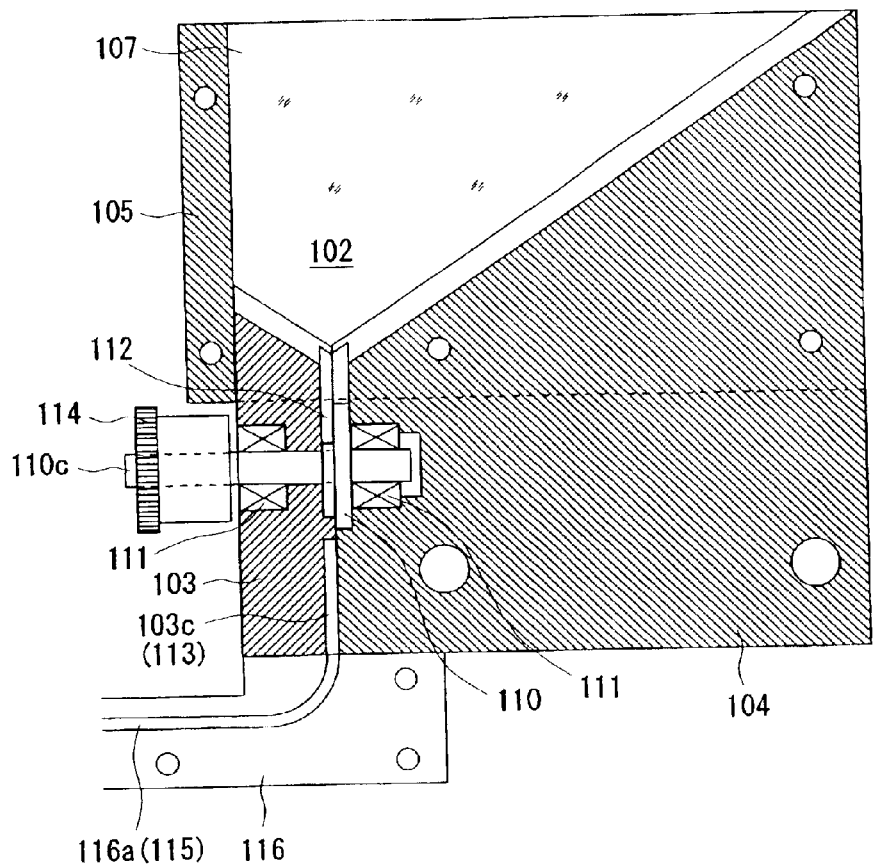
FIG. 3 is an enlarged partial longitudinal section of FIG. 1.
Figure 4A:
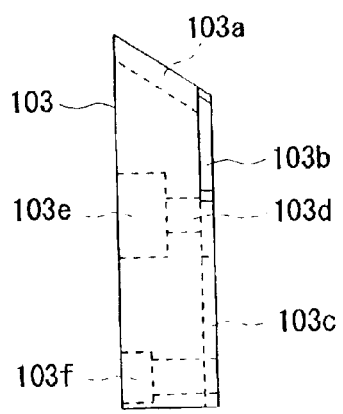
FIG. 4A is a left side view of the first support member shown in FIG. 3.
Figure 4B:
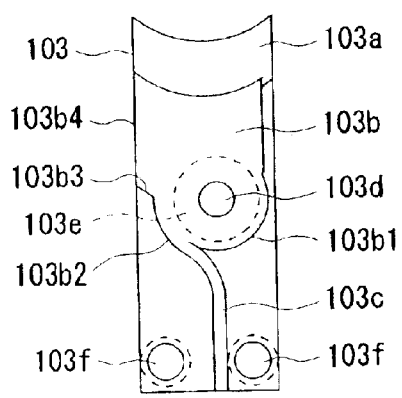
FIG. 4B is a rear view thereof.

As shown in FIGS. 3, 4A, and 4B, a concave sliding surface 103a sloping downward to the rear is formed on the topside of the first support member 103. In the rear face of the first support member 103 is a recess 103b whose depth is approximately equal to the thickness of a second disk 110b of the feeding rotor 110. In the lower right part of the recess 103b is a curved surface 103b1 with a curvature approximately corresponding to the radius of curvature of the second disk 110b. In the lower left part of the recess 103b are a curved surface 103b2 with a curvature approximately corresponding to the radius of curvature of the first disk 110a of the feeding rotor 110 and an adjoining sloped sliding surface 103b3. Above the sliding surface 103b3, the recess 103b has an opening 103b4. Also, in the rear face of the first support member 103 is a vertical groove 103c with a rectangular cross section approximately as deep as the recess 103b. The upper left flank of the groove 103c is curved, continuing from the curved surface 103b2. The upper right flank of the groove 103c is curved following suit with the upper left flank until it reaches the curved surface 103b1. Incidentally, the opening width of the groove 103c is approximately equal to the difference in the radius of curvature between the first disk 110a and second disk 110b of the feeding rotor 110. Also, in the rear face of the first support member 103, a circular hole 103d slightly larger in diameter than the shaft 110c of the feeding rotor 110 is formed concentrically with the centers of curvature of the curved surfaces 103b1 and 103b2. A circular recess 103e concentric with the circular hole 103d is formed in the front face of the first support member 103 to fit a bearing 111. Stepped through-holes 103f are formed in the lower part of the first support member 103.

As shown in FIGS. 3, 5A, and 5B, a concave sliding surface 104a sloping downward to the front is formed on the topside of the second support member 104. In the front face of the second support member 104 is a recess 104b whose depth is approximately equal to the thickness of the first disk 110a of the feeding rotor 110. In the lower part of the recess 104b is a curved surface 104b1 with a curvature approximately corresponding to the radius of curvature of the first disk 110a. An opening 104b2 is provided in the right side of the curved surface 104b1 of the recess 104b. A circular recess 104c concentric with the center of curvature of the curved surface 104b1 is formed inside the recess 104b to fit a bearing 111. Inside the circular recess 104c is a circular hole 104d concentric with the circular recess 104c and larger in diameter than the shaft 110c of the feeding rotor 110. Screw holes 104e corresponding to the stepped through-holes 103f in the first support member 103 are formed in the lower part of the second support member 104.

As shown in FIGS. 6A to 6C, the feeding rotor 110 comprises the first disk 110a, second disk 110b which has a radius of curvature smaller than that of the first disk 110a and which is installed concentrically on one surface of the first disk 10a, and shaft 110c installed coaxially with the centers of curvature of the first disk 110a and second disk 110b. Also, it has a recess 110d as thick as the second disk 110b, forming a parallel space 112 between itself and the recess 103*b* in the first support member 103. Besides, the first disk 110*a* has an agitator 110*a*1 consisting of a semi-circular groove in its outer periphery while the second disk 110*b* has a crena 110*b*1 corresponding to the recess 110*d*.

Although the feeding rotor 110 shown in the drawings is produced by inserting the shaft 110*c* prepared as an integral part of the first disk 110*a* into the center hole of the second disk 110*b*, it is also possible to produce the feeding rotor 110 by preparing the first disk 110*a*, second disk 110*b*, and shaft 110*c* as a single piece, or by inserting the shaft 110*c* into the center holes of the first disk 110*a* and second disk 110*b*, or by inserting the shaft 110*c* prepared as an integral part of the second disk 110*b* into the center hole of the first disk 110*a*.

To house the above described feeding rotor 110 in the first support member 103 and second support member 104, the respective bearings 111 are fitted in the circular recess 103*e* of the first support member 103 and the circular recess 104*c* of the second support member 104, one end of the shaft 110*c* is inserted in the circular hole 104*d* and bearing 111 in the second support member 104, the first disk 110*a* is inserted in the curved surface 104*b*1 of the recess 104*b* in the second support member 104, and then the first support member 103 is screwed to the second support member 104 with the rear face of the first support member 103 placed against the front face of the second support member 104 so that the other end of the shaft 110*c* will be inserted in the circular hole 103*d* and bearing 111 and that the second disk 110*b* will be inserted in the curved surface 103*b*1 of the recess 103*b*.

FIG. 7A shows the state in which the shaft 110*c* of the feeding rotor 110 is inserted in the circular hole 103*d* and bearing 111 in the first support member 103, and the second disk 110*b* is inserted in the curved surface 103*b*1 of the recess 103*b*. FIG. 7B shows the state in which the shaft 110*c* of the feeding rotor 110 is inserted in the circular recess 104*c* and bearing 111 in the second support member 104, and the first disk 110*a* is inserted in the curved surface 104*b*1 of the recess 104*b*.

The feeding rotor 110 housed in the first support member 103 and second support member 104 has its shaft 110*c* rotatably supported by the two bearings 111. As shown in FIG. 3, the second disk 110*b* of the feeding rotor 110 rotatably contacts the inner surface of the recess 104*b* in the second support member 104, and the parallel space 112 with a width defined by the thickness of the second disk 110*b* is formed by the recess 110*d* between one surface of the first disk 110*a* and the inner surface of the recess 104*b* in the second support member 104. Besides, the recess 103*b* in the first support member 103 and the recess 104*b* in the second support member 104 form a cavity between the feeding rotor 110 and storeroom 102. Consequently, part of the outer periphery of the first disk 110*a* faces on the storeroom 102 through this cavity and the parallel space 112 communicates with the storeroom 102 through this cavity. The groove 103*c* in the first support member 103 is covered by the front face of the second support member 104, forming a feeding path 113 with a rectangular cross section. The second disk 110*b* of the feeding rotor 110 has a radius of curvature smaller than that of the first disk 110*a*. Consequently, a curved path with the same cross-sectional shape as the feeding path 113 is formed, continuing from the feeding path 113, between the curved surface 103*b*2 of the groove 103*c* in the first support member 103 and the outer periphery of the second disk 110*b* facing each other. In this apparatus, the curved path is used as the upper part of the feeding path 113. Part of the outer periphery of the first disk 110*a* of the feeding rotor 110 sticks out from the opening 104*b*2 of the recess 104*b* in the second support member 104. Incidentally, the opening 103*b*4 of the recess 103*b* in the first support member 103 is blocked by the left side plate 106. Besides, as shown in FIG. 3, a pinion 114 is installed on the part sticking out from the first support member 103 for the shaft 110*c* of the feeding rotor 110.

As shown in FIG. 1 and FIGS. 8 to 11, a transport path 115 continuous with the above described feeding path 113 consists of a path block 116 and a cover 117 covering its left flank. In the left flank of the path block 116 is a horizontal groove 116*a* with an opening whose width is approximately equal to the depth of the groove 103*c* in the first support member 103 and with a rectangular cross section whose depth is approximately equal to the opening width of the groove 103*c*. To connect the vertical feeding path 113 and horizontal transport path 115, the rear of the groove 116*a* is curved with a predetermined radius of curvature at the center of the path within an angular range of 90 degrees. The path block 116 is screwed to the left flank of the frame 101 together with the cover 117. The above described transport path 115 is formed by covering the groove 116*a* in the path block 116 with the cover 117. The transport path 115 formed in this way is connected with the above described feeding path 113 without a step. If transparent material is used for the cover 117, the electronic components EC transported in the transport path 115 can be seen from outside. A component output port 115*a* is formed in the upper front side of the transport path 115 to take out the headmost electronic component EC transported.

As shown in FIGS. 8 to 11, a recess 116*b* is formed in the upper front part of the path block 116 to install a shutter 124. Ahead of it is an L-shaped recess 116*c* with a bottom continuous with the bottom of the groove 116*a* (transport path 115). Two suction holes 116*d* are formed in the front part of the path block 116 such that part of their upper openings appear at the bottom behind the front opening of the transport path 115. A tube connector 119 is installed just under the two suction holes 116*d* in the path block 116 to merge the lower openings of the two suction holes 116*d* into an air tube 118.

Figure 9:
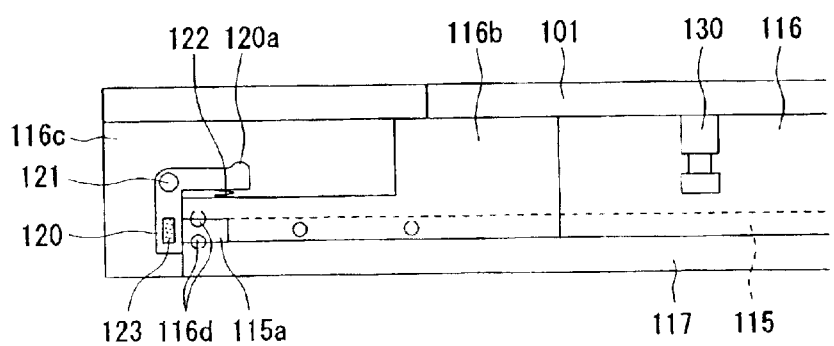
FIG. 9 is a diagram showing the view of FIG. 8 from which the shutter and drive plate have been removed.
Figure 10:
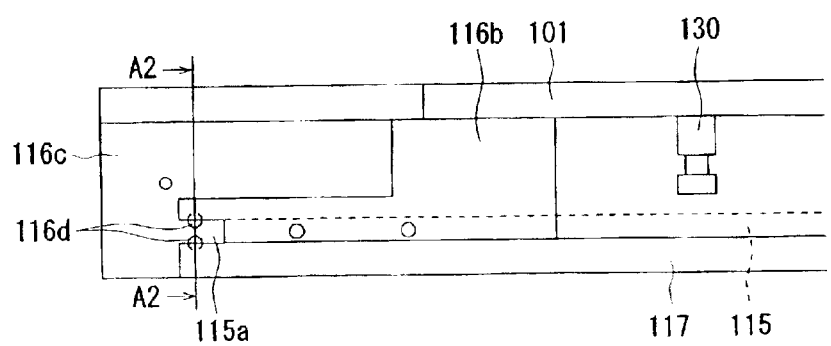
FIG. 10 is a diagram showing the view of FIG. 9 from which the component stopper has been removed.
Figure 11:
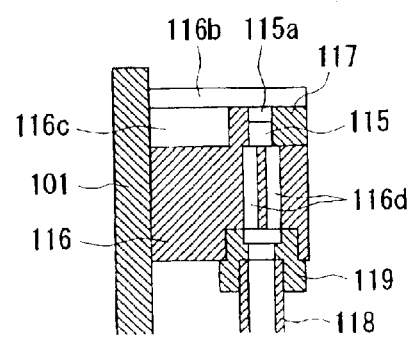
FIG. 11 is a view of the A2—A2 section of FIG. 10.

As shown in FIG. 9, a roughly L-shaped component stopper 120 made of non-magnetic material such as stainless steel is rotatably supported by a support shaft 121, is secured to the recess 116*b* in the path block 116 and, is pressed by a coil spring 122 in the counterclockwise direction in the figure. The component stopper 120, which has a thickness approximately equal to the depth of the recess 116*c*, can block the front opening of the transport path 115 and front end of the component output port 115*a*. To attract the headmost electronic component EC in the transport path 115 to the component stopper 120, a permanent magnet 123 such as a samarium-cobalt magnet is embedded in that end of the component stopper 120 which is facing the front opening of the transport path 115, in such a way that the north or south pole will face the front opening of the transport path 115. A curved surface 120*a* that can come into contact with a protrusion 124*c* of the shutter 124 is provided at the other end of the component stopper 120.

Figure 8:
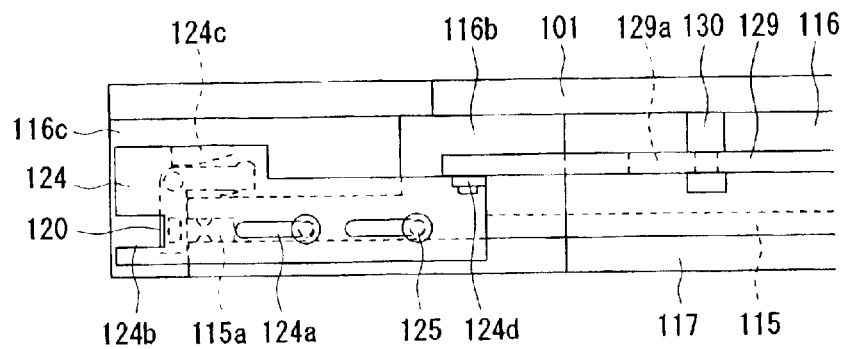
FIG. 8 is an enlarged partial top view of FIG. 1.

As shown in FIG. 8, the shutter 124 has two guide holes 124*a* extending in the front/rear direction. They are supported by a support shaft 125 secured to the recess 116*a* in the path block 116, such that they can move back and forth. Their undersides are in contact with the bottom face of the recess 116*a*. In the front part of the shutter 124 is an opening 124*b* where the above described component output port 11*a* can be opened. Also, on the underside of the shutter 124 is the tapered protrusion 124*c* which can be rotated clockwise with the curved surface 120*a* of the component stopper 120 pressed against it when the shutter 124 retracts. Furthermore, in the rear part of the shutter 124 is a connecting piece 124d for connection with a drive plate 129.

As shown in FIG. 1, a control lever 126 is supported rotatably by a support shaft 127 secured to the frame 101. On the front end of the control lever 126 is a roller 126a to which an external force can be applied while in the rear end is a slot 126b to be engaged with a drive pin 128a of a rack 128. Also, the lower end of the control lever 126 is rotatably coupled to a connecting plate 133 mounted on the tip of a rod 131a of an air cylinder 131.

Figure 2:
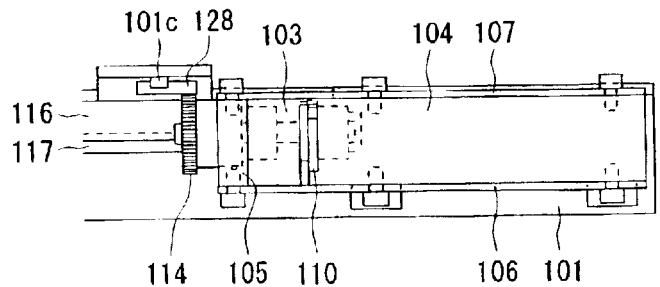
FIG. 2 is a view of the Al—Al section of FIG. 1.

As shown in FIGS. 1 and 2, the rack 128 is mounted on the rail 101c on the frame 101 such that it can move up and down, with the drive pin 128a at the lower end engaged with the slot 126b in the control lever 126. The rack 128 is engaged with the pinion 114 mounted on the shaft 110c of the feeding rotor 110.

As shown in FIGS. 1 and 8, the drive plate 129 has two guide holes 129a extending in the front/rear direction and is supported by a support shaft 130 secured to the frame 101, in such a way that it can move back and forth. The drive plate 129 has its rear end coupled rotatably to the control lever 126, and the front end coupled rotatably to the connecting piece 124d of the shutter 124.

As shown in FIG. 1, the air cylinder 131 is a double-acting type with two intake/exhaust ports. It has its front end rotatably supported by a support shaft 132 secured to the frame 101. The tip of the rod 131a of the air cylinder 131 is fitted with the connecting plate 133, which is rotatably coupled to the lower end of the control lever 126. Also, a coil spring 134 is mounted between the connecting plate 133 and the engagement pin 101b on the frame 101 to return the rod 131a to the advanced position.

One intake/exhaust port of the air cylinder 131 is connected with a control valve 135, as shown in FIG. 1, to branch the intake and exhaust ports. Specifically, as indicated by valve symbols in FIG. 1, the control valve 135 is structured such that its rear side serves as the exhaust port when the rod 131a retracts and that its front side serves as the intake port when the rod 131a advances from the retracted position. The intake port of the control valve 135 is connected with the other end of the above described air tube 118, and the exhaust port is open to the air.

The above described apparatus can handle electronic components EC in the shape of a rectangular prism with predetermined width, height, and length as well as electronic components EC in the shape of a cylinder with predetermined diameter and length. The electronic components EC are chip components such as chip capacitors, chip resistors or chip inductors; composite parts such as LC filters; array components such as capacitor arrays or inductor arrays; or other types of electronic component.

A rectangular cross section can be adopted for the feeding path 113 and transport path 115 regardless of the shape of the electronic components EC. However, it is necessary to adjust the thickness of the second disk 110b of the feeding rotor 110, which defines the width of the parallel space 112, and adjust the difference in the radius of curvature between the first disk 110a and second disk 110b of the feeding rotor 110, the dimensions of the feeding path 113, and the dimensions of the transport path 115 according to the width or height of the electronic component EC if the electronic component has a shape of a rectangular prism or according to the diameter of the electronic component EC if the electronic component has a cylindrical shape.

For example, when feeding an electronic component EC in the shape of a rectangular prism which has a dimensional relationship "length>width=height," the thickness of the second disk 110b of the feeding rotor 110 is set slightly larger than the width or height of the electronic component EC, the difference in the radius of curvature between the first disk 110a and second disk 110b of the feeding rotor 110 is set slightly larger than the width or height of the electronic component EC, the front-to-back spacing and side-to-side spacing of the feeding path 113 are set slightly larger than the width or height of the electronic component EC, and the vertical spacing and side-to-side spacing of the transport path 115 are set slightly larger than the width or height of the electronic component EC.

Also, when feeding an electronic component EC in the shape of a rectangular prism which has a dimensional relationship "length>width>height," the thickness of the second disk 110b of the feeding rotor 110 is set slightly larger than the height and smaller than the width of the electronic component EC, the difference in the radius of curvature between the first disk 110a and second disk 110b of the feeding rotor 110 is set slightly larger than the width of the electronic component EC, the front-to-back spacing of the feeding path 113 is set slightly larger than the height and smaller than the width of the electronic component EC, the side-to-side spacing of the feeding path 113 is set slightly larger than the width of the electronic component EC, the vertical spacing of the transport path 115 is set slightly larger than the height and smaller than the width of the electronic component EC, and the side-to-side spacing of the transport path 115 is set slightly larger than the width of the electronic component EC.

Besides, when feeding a cylindrical electronic component EC, the thickness of the second disk 110b of the feeding rotor 110 is set slightly larger than the diameter of the electronic component EC, the difference in the radius of curvature between the first disk 110a and second disk 110b of the feeding rotor 110 is set slightly larger than the diameter of the electronic component EC, the front-to-back spacing and side-to-side spacing of the feeding path 113 are set slightly larger than the diameter of the electronic component EC, and the vertical spacing and side-to-side spacing of the transport path 115 are set slightly larger than the diameter of the electronic component EC.

The operation of the above described apparatus will be described below with reference to FIGS. 12 to 17, taking the case of an electronic component EC in the shape of a rectangular prism which has a dimensional relationship "length>width=height," for the sake of convenience.

To feed components, the above described apparatus, which is in the stand-by state shown in FIG. 1, starts operation with thousands to tens of thousands of electronic components EC stored in bulk in the storeroom 102. When the operation starts, the roller 126a of the control lever 126 is pressed down for a predetermined distance by the application of an external force as shown in FIG. 12, and then the force is removed to return the control lever 126 under the force of the coil spring 134: this cycle is repeated at a predetermined frequency.

Figure 12:
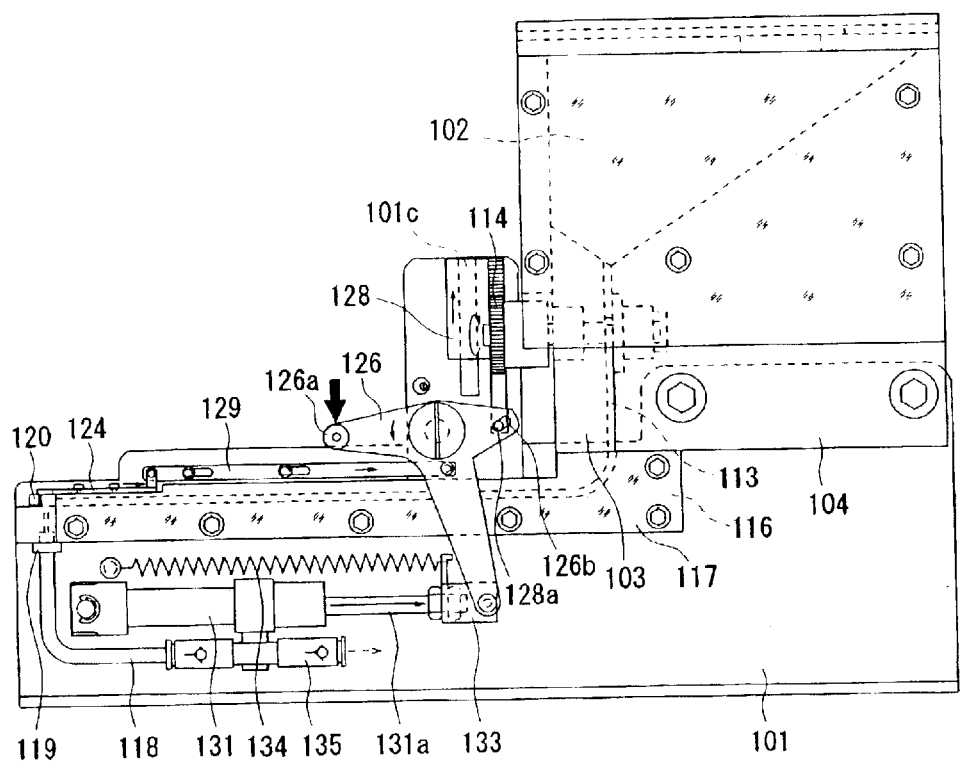
FIG. 12 is a diagram illustrating the operation of the apparatus shown in FIG. 1.

Referring to FIG. 12, when the roller 126a of the control lever 126 is pressed down, the control lever 126 rotates counterclockwise by a predetermined angle, which causes the rack 128 to ascend a predetermined distance, the drive plate 129 to retract a predetermined distance, the rod 131a of the air cylinder 131 to retract a predetermined distance. On the other hand, when the force is removed from the roller 126a of the control lever 126, the control lever 126 returns by rotating in reverse under the force of the coil spring 134.

Consequently, the rack 128 returns by descending from the raised position, the drive plate 129 returns by advancing from the retracted position, and the rod 131a of the air cylinder 131 returns by advancing from the retracted position.

Figure 13:
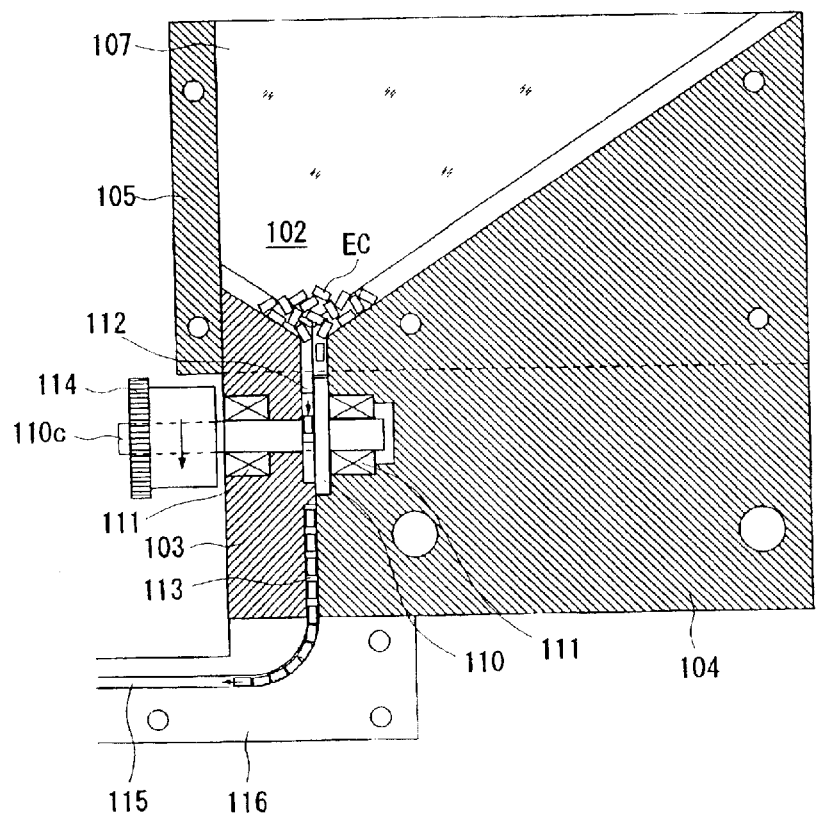
FIG. 13 is a diagram illustrating the operation of the apparatus shown in FIG. 1.

When the rack 128 ascends a predetermined distance, as shown in FIG. 13, the pinion 114 held in engagement with the rack 128 rotates clockwise as viewed from the front, by a predetermined angle, for example, by somewhere around 35 degrees, making the feeding rotor 110 rotate together in the same direction by the same angle. On the other hand, when the rack 128 returns by descending from the raised position, the pinion 114 held in engagement with the rack 128 returns by rotating in the opposite direction, making the feeding rotor 110 rotate together in the same direction by the same angle. In the figure, the position in which the bottom face of the parallel space 112 (crena of the second disk 110b) is approximately horizontal is established as the stand-by position of the feeding rotor 110 and the feeding rotor 110 oscillates between that position and a position in which the bottom face of the parallel space 112 becomes tilted. However, it is also possible to set the stand-by position of the feeding rotor 110 at a position where the bottom face of the parallel space 112 is tilted and to rotate the feeding rotor 110 until it tilts further. Of course, by reversing the rotational direction of the feeding rotor 110, it is also possible to set the stand-by position of the feeding rotor 110 at a position where the bottom face of the parallel space 112 is tilted and to rotate the feeding rotor 110 until the bottom face of the parallel space 112 becomes approximately horizontal.

Figure 14A:
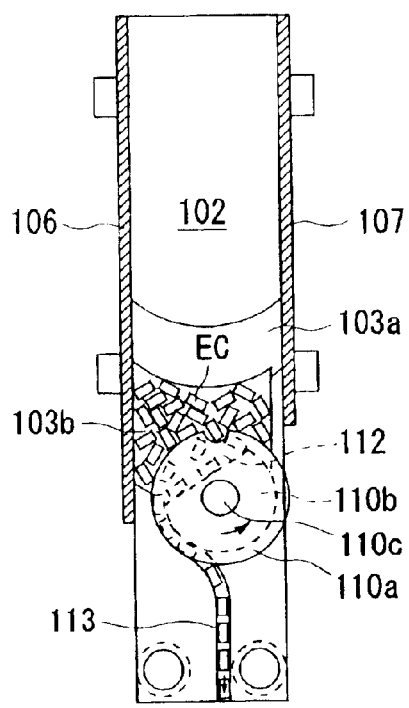
FIGS. 14A and 14B are diagrams illustrating the operation of the apparatus shown in FIG. 1.
Figure 14B:
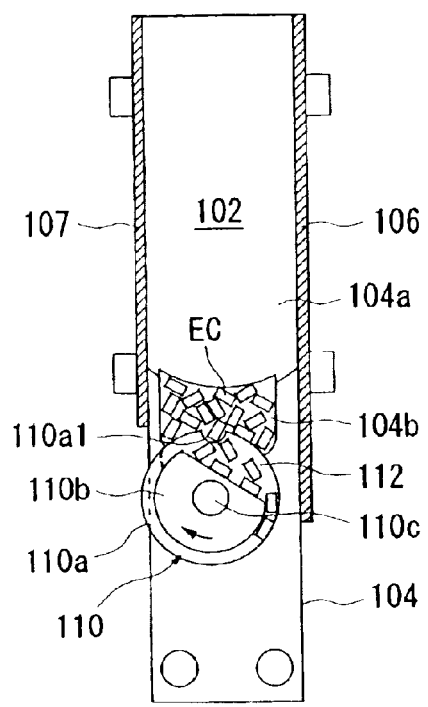

As shown in FIGS. 13, 14A, and 14B, the electronic components EC stored in bulk in the storeroom 102 move downward along the slopes of the sliding surface 103a of the first support member 103 and the sliding surface 104a of the second support member 104. A plurality of electronic components EC enter the cavity formed by the recess 103b in the first support member 103 and the recess 104b in the second support member 104 and reach the outer periphery of the first disk 110a of the feeding rotor 110.

In this state, as the feeding rotor 110 oscillates within a predetermined angular range, the electronic components EC on the upper side of the first disk 110a are agitated by the agitator 110a1 and the agitated electronic components EC are taken into the parallel space 112 with one of their four side faces approximately parallel to the front face of the first disk 110a. A plurality of electronic components EC can be taken simultaneously into the parallel space 112, which has a sufficiently large extent. The position of the parallel space 112 changes with the rotation of the feeding rotor 110, but components continue to be taken into the parallel space 112 regardless of this change.

During the oscillation of the feeding rotor 110, when the bottom face of the parallel space 112 (crena of the second disk 110b) tilts down toward the feeding path 113, the electronic components EC taken into the parallel space 112 move along the bottom slope toward the upper end of the feeding path 113, and being guided by the sliding surface 103b3, they are taken one by one into the feeding path 113 with their four side faces approximately parallel to the four faces of the feeding path 113.

Since the feeding rotor 110 oscillates at a predetermined frequency, the process of taking components from the storeroom 102 into the parallel space 112 and the process of taking components from the parallel space 112 into the feeding path 113 are performed practically continuously. The electronic components EC taken into the feeding path 113 move downward along the vertical feeding path 113 by gravity, have their attitude changed from vertical to horizontal while they are passing through the curve in the back of the transport path 115, and then taken into the horizontal transport path 115.

Incidentally, when feeding an electronic component EC in the shape of a rectangular prism which has a dimensional relationship "length>width=height," the components can be taken in similarly even if the thickness of the second disk 110b of the feeding rotor 110, difference in the radius of curvature between the first disk 110a and second disk 110b of the feeding rotor 110, and front-to-back spacing and side-to-side spacing of the feeding path 113 described above are set slightly larger than the diagonal on the end face of the electronic component EC and smaller than twice the width or height of the electronic component EC. In that case, the electronic components EC will be taken into the parallel space 112 and feeding path 113 with one of their four side faces forming an angle of up to 45 degrees with the front face of the first disk 110a. However, this will not hinder component feeding because the orientation of the electronic components will be corrected to make their four side faces approximately parallel to the four faces of each path when the electronic components EC pass through the feeding path 113 or the curve in the transport path 115.

When the rod 131a of the air cylinder 131 retracts a predetermined distance, since the rear side of the control valve 135 serves as an exhaust port, air is released outside through the exhaust port along with the retraction of the rod 131a. On the other hand, when the rod 131a of the air cylinder 131 returns by advancing from the retracted position, since the front side of the control valve 135 serves as an intake port, an air suction force works to suck air into the transport path 115 through the air tube 118 and through the two suction holes 116d in the path block 116 along with the advancement of the rod 131a. Incidentally, it is not that this air suction force is generated at the same time as the rod 131a of the air cylinder 131 starts to advance. Actually, the air suction force begins to be generated later than the rod 131a starts to advance.

Figure 15:
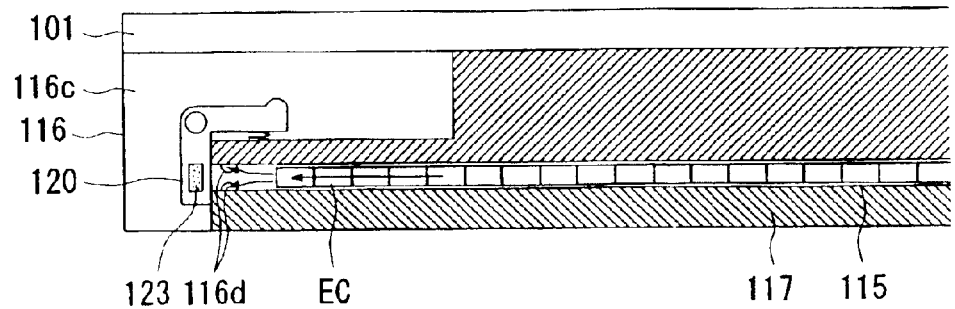
FIG. 15 is a diagram illustrating the operation of the apparatus shown in FIG. 1.
Figure 16:
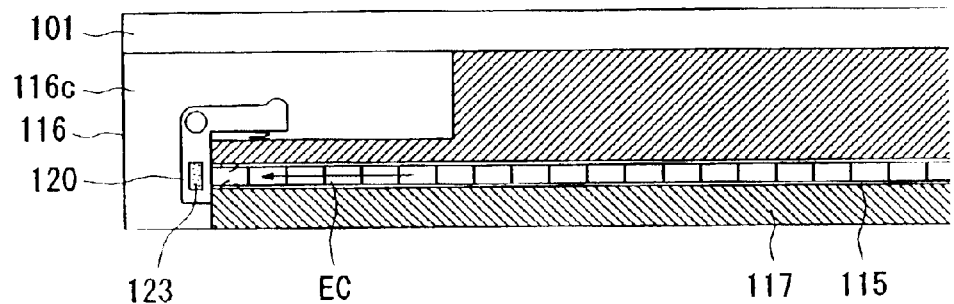
FIG. 16 is a diagram illustrating the operation of the apparatus shown in FIG. 1.

If the air suction force acts in the transport path 115 with the component output port 115a covered by the shutter 124 and with the front opening of the transport path 115 and front end of the component output port 115a blocked by the component stopper 120 as shown in FIG. 8, an air flow as indicated by the solid arrow in FIG. 15 is generated in the transport path 115. Consequently, the electronic components EC taken into the horizontal transport path 115 are drawn forward by the air flow and transported forward in aligned form in the transport path 115. The electronic components EC transported forward in aligned form in the transport path 115 stop when the headmost electronic component EC touches the component stopper 120 as shown in FIG. 16. Then the headmost electronic component EC is drawn to the component stopper 120 by means of the permanent magnet 123.

Figure 17:
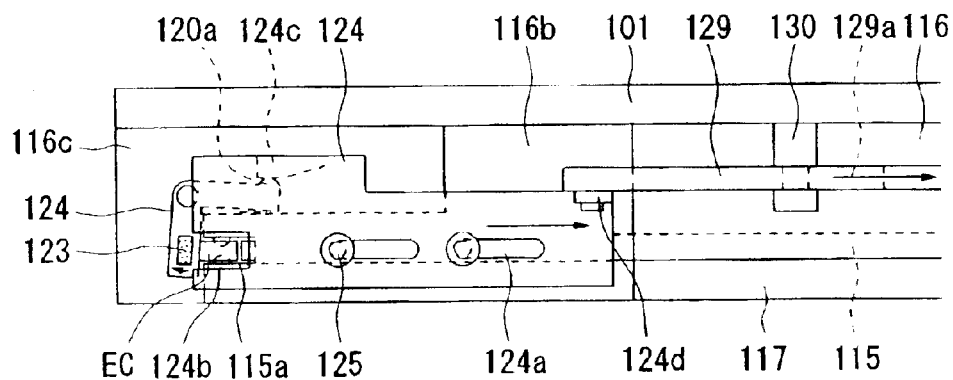
FIG. 17 is a diagram illustrating the operation of the apparatus shown in FIG. 1.

When the drive plate 129 retracts a predetermined distance, the shutter 124 coupled with the drive plate 129 as shown in FIG. 17 retracts the same distance. On the other hand, when the drive plate 129 returns by advancing from the retracted position, the shutter 124 coupled with the drive plate 129 returns by advancing from the retracted position.

When the shutter 124 retracts a predetermined distance with the electronic components EC lined up in the transport path 115 and with the headmost electronic component EC placed in contact with the component stopper 120 as shown in FIG. 16, the opening 124b in the shutter 124 aligns with the component output port 115a to open up the component output port 115a as shown in FIG. 17. Simultaneously, the protrusion 124c on the shutter 124 presses against the curved surface 120a of the component stopper 120 leftward, the component stopper 120 is rotated by a predetermined angle clockwise, the headmost electronic component EC sticking to the component stopper 120 moves slightly forward to be separated from the succeeding electronic components EC, and a gap is formed between the headmost electronic component EC and the next electronic component EC. The separated headmost electronic component EC is taken out, in the state shown in FIG. 17, through the component output port 115a by a suction nozzle or the like.

After the separated headmost electronic component EC is taken out, when the shutter 124 returns by advancing from the retracted position, the component output port 115a is covered by the shutter 124 again. Also, the protrusion 124c stops pressing against the curved surface 120a of the component stopper 120, the component stopper 120 returns by rotating in reverse under the force of the coil spring 122, and the front opening of the transport path 115 and front end of the component output port 115a are blocked again.

Thus, by oscillating the feeding rotor 110 within a predetermined angular range, the electronic component feeding apparatus described above can take the electronic components EC stored in bulk in the storeroom 102 into the parallel space 112 in such an orientation that the center line of the electronic components EC will be parallel to the parallel space 112, and each time the bottom of the parallel space 112 tilts down toward the feeding path 113 during an oscillation of the feeding rotor 110, the apparatus can move the electronic components EC in the parallel space 112 toward the feeding path 113, take one electronic component EC at a time into the feeding path 113 in such an orientation that the center line of the electronic component EC will be parallel to the parallel space 112, and allow the electronic component EC taken into the feeding path 113 to move downward under its own weight. Thus, by simply oscillating the feeding rotor 110 within a predetermined angular range, the apparatus can feed, in aligned form, the electronic components EC stored in bulk in the storeroom 102, in an efficient and stable manner. In this way, the apparatus provides feeding performance capable of keeping pace with component retrieval in a fast cycle time of 0.1 second or less.

Also, since the present invention can perform the aligned feeding described above by using only the feeding rotor 110, it can simplify and downsize the configuration of the feeding means existing between the storeroom 102 and feeding path 113 and eventually contribute to simplification, downsizing, and cost reduction of the apparatus.

Furthermore, by adjusting the thickness of the second disk 110b of the feeding rotor 110, which defines the width of the parallel space 112, and adjusting the difference in the radius of curvature between the first disk 110a and second disk 110b of the feeding rotor 110, the dimensions of the feeding path 113, and the dimensions of the transport path 115, it is possible to handle electronic components EC in the shape of a rectangular prism which has a dimensional relationship "length>width=height," electronic components EC in the shape of a rectangular prism which has a dimensional relationship "length>width>height," or electronic components EC in the shape of a cylinder.

Furthermore, since the agitator 110a1 consisting of a semicircular groove is provided in the outer periphery of the first disk 110a of the feeding rotor 110, the electronic components EC on the upper side of the first disk 110a can be agitated efficiently while the feeding rotor 110 oscillates within a predetermined angular range, facilitating the process of taking the electronic components EC into the parallel space 112.

Furthermore, the feeding mechanism including the feeding rotor 110 can be exposed by removing the first support member 103 from the second support member 104. This makes the maintenance and repair of the feeding mechanism easier to perform.

Furthermore, since part of the outer periphery of the first disk 110a of the feeding rotor 110 sticks out from the opening 104b2 in the second support member 104, dirt, component particles, etc. can be discharged through the gap between the first disk 110a and opening 104b2 during the rotation of the feeding rotor 110.

Furthermore, since the air cylinder 131 is used to provide the air suction force for transporting the electronic components EC taken into the transport path 115 from the feeding path 113, and it is mounted on the frame 101 so that it can be operated with a control lever 126, there is no need to install a separate suction source such as a vacuum pump for generating the suction force within the transport path 115 or to install complicated air piping from such a suction source. This also contributes to simplification, downsizing, and cost reduction of the apparatus.

Furthermore, after the electronic components EC transported forward in aligned form through the transport path 115 are stopped by the component stopper 120, the headmost electronic component EC sticking to the component stopper 120 by the magnetic force of the permanent magnet 123 can be separated from the succeeding electronic components EC by moving it slightly forward together with the component stopper 120 being rotated by a predetermined angle. This prevents the headmost electronic component EC from interfering with the succeeding electronic components EC when it is taken out through the component output port 115a by a suction nozzle or the like, and thus ensures proper component retrieval operations.

Incidentally, although the apparatus described above employs the double-acting type air cylinder 131 comprising two intake/exhaust ports, connecting one of them with the control valve 135 and exposing the other to the air, it is also possible to install a filter at the exposed intake/exhaust port to avoid drawing dust into the air cylinder 131 together with air during the retraction of the rod 131a. Also, a filter may be installed in the air tube 118 or at the intake port of the control valve 135 to avoid drawing dust into the control valve 135 or air cylinder 131 together with the air drawn into the control valve 135 through the air tube 118. Of course, the air cylinder 131 may be a single-acting type with a single intake/exhaust port.

Also, in the apparatus described above, the first support member 103 and second support member 104 for the feeding rotor 110 are screwed together detachably. If a positioning pin and a positioning hole are provided on/in the rear face of the first support member 103 and the front face of the second support member 104, respectively, or vice versa, the positioning accuracy in joining the first support member 103 and second support member 104 can be improved. Besides, the first support member 103 and the second support member 104 may be joined not only by screws, but also, for example, by attraction between permanent magnets or by attraction between a permanent magnet and ferromagnetic material as long as the required bonding power is ensured.

Furthermore, although in the apparatus described above, the headmost electronic component EC sticking to the component stopper 120 by the magnetic force of the permanent magnet 123 is separated from the succeeding electronic components EC by moving it slightly forward together with the component stopper 120, it is also possible to use the component stopper 120 without the permanent magnet 123. Then, the force applied to the headmost electronic component EC can be removed by taking away the component stopper 120 from the headmost electronic component EC.

Furthermore, although in the apparatus described above, the feeding rotor 110 is arranged with its shaft 110*c* placed approximately horizontal, similar feed operation can be performed even if the feeding rotor 110 is arranged with its shaft 110*c* tilted or if it is arranged such that the feeding path 113 will tilt together with the feeding rotor 110.

Furthermore, although the apparatus described above transports electronic components EC by supplying air suction force into the transport path 115 through its front end, it is also possible to transport electronic components EC by blowing air into the transport path 115 through its rear end.

FIGS. 18A to 18C show variations of the sliding surface 103*b*3 of the first support member 103.

In FIG. 18A, a sliding surface 103*b*5 consists of a concave curved surface. In FIG. 18B, a sliding surface 103*b*6 consists of a convex curved surface. In FIG. 18C, a sliding surface 103*b*7 is composed of concave and convex curved surfaces and the curved surface 103*b*2 is extended upward.

FIG. 19 shows a variation of the first support member 103.

A concave sliding surface 136*a* sloping downward to the rear is formed on the topside of a first support member 136. In the rear face of the first support member 136 is a recess 136*b* whose depth is approximately equal to the thickness of the second disk 110*b* of the feeding rotor 110. On the right side of the recess 136*b* is a curved surface 136*b*1 with a curvature approximately corresponding to the radius of curvature of the second disk 110*b*. In the lower left part of the recess 136*b* is a pin 138 for positioning a guide plate 137. Also, in the rear face of the first support member 136 is a vertical groove 136*c* with a rectangular cross section approximately as deep as the recess 136*b*. The upper right flank of the groove 136*c* is curved, reaching the curved surface 136*b*1. Incidentally, the opening width of the groove 136*c* is approximately equal to the difference in the radius of curvature between the first disk 110*a* and second disk 110*b* of the feeding rotor 110. Also, in the rear face of the first support member 136, a circular hole 136*d* slightly larger in diameter than the shaft 110*c* of the feeding rotor 110 is formed concentrically with the center of curvature of the curved surface 136*b*1. A circular recess 136*e* concentric with the circular hole 136*d* is formed in the front face of the first support member 136 to fit the bearing 111. Stepped through-holes 136*f* are formed in the lower part of the first support member 136.

The guide plate 137 has a thickness approximately equal to the depth of the recess 136*b* in the first support member 136. On its right edge, it has a curved surface 137*a* whose curvature almost corresponds to the radius of curvature of the first disk 110*a* of the feeding rotor 110, a curved surface 137*b* with a predetermined radius of curvature, extending from the lower end of the curved surface 137*a* to the upper end of the left flank of the groove 136*c* in the first support member 136, a sliding surface 137*c* sloping up to the left from the upper end of the curved surface 137*a*, and a hole 137*d* capable of fitting over a pin 138 installed on the first support member 136. The guide plate 137 is fixed on the first support member 136 by fitting the pin 138 into the hole 137*d*.

FIGS. 20A to 20C show variations of the sliding surface 137*c* of the guide plate 137 described above. In FIG. 20A, a sliding surface 137*e* consists of a concave curved surface. In FIG. 20B, a sliding surface 137*f* consists of a convex curved surface. In FIG. 20C, a sliding surface 137*g* is composed of concave and convex curved surfaces and the curved surface 137*a* is extended upward.

FIGS. 21A to 21D show a variation of the above described first support member 103.

Figure 21A:
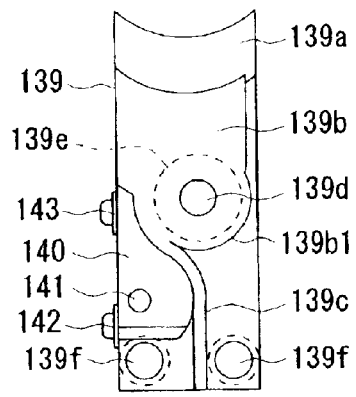
FIGS. 21A to 21D are diagrams showing a variation of the first support member of the apparatus shown in FIG. 1.
Figure 21B:
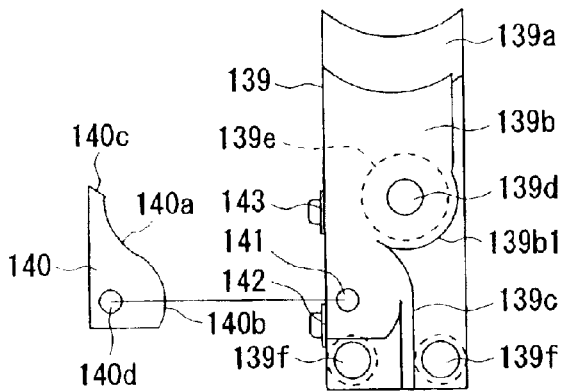
Figure 21C:
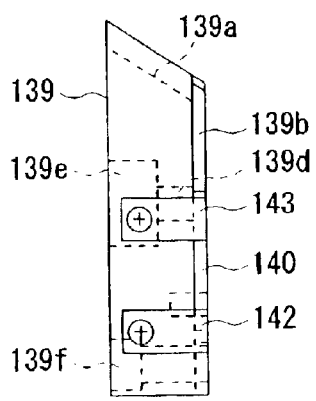

A concave sliding surface 139*a* sloping downward to the rear is formed on the topside of a first support member 139 shown in FIGS. 21A to 21C. In the rear face of the first support member 139 is a recess 139*b* whose depth is approximately equal to the thickness of the second disk 110*b* of the feeding rotor 110. On the right side of the recess 139*b* is a curved surface 139*b*1 with a curvature approximately corresponding to the radius of curvature of the second disk 110*b*. In the lower left part of the recess 139*b* is a pin 141 for rotatably supporting a guide plate 140. Also, in the rear face of the first support member 139 is a vertical groove 139*c* with a rectangular cross section approximately as deep as the recess 139*b*. The upper right flank of the groove 139*c* is curved, reaching the curved surface 139*b*1. Incidentally, the opening width of the groove 139*c* is approximately equal to the difference in the radius of curvature between the first disk 110*a* and second disk 110*b* of the feeding rotor 110. Also, in the rear face of the first support member 139, a circular hole 139*d* slightly larger in diameter than the shaft 110*c* of the feeding rotor 110 is formed concentrically with the center of curvature of the curved surface 139*b*1. A circular recess 139*e* concentric with the circular hole 139*d* is formed in the front face of the first support member 139 to fit the bearing 111. Stepped through-holes 139*f* are formed in the lower part of the first support member 139. Furthermore, a board 142 that defines the stationary position of the guide plate 140 is screwed to the left flank of the first support member 139 and a plate spring 143 that supports the upper left edge of the guide plate 140 is screwed above it.

The guide plate 140 has a thickness approximately equal to the depth of the recess 139*b* in the first support member 139. On its right edge, it has a curved surface 140*a* whose curvature almost corresponds to the radius of curvature of the first disk 110*a* of the feeding rotor 110, a curved surface 140*b* with a predetermined radius of curvature, extending from the lower end of the curved surface 140*a* to the upper end of the left flank of the groove 139*c* in the first support member 139, and a sliding surface 140*c* sloping up to the left from the upper end of the curved surface 140*a*. Besides, at the center of curvature of the curved surface 140*b* is a hole 140*d* capable of fitting over the pin 141 installed on the first support member 139. The guide plate 140 is rotatably mounted on the first support member 139 by fitting the pin 141 into the hole 140*d*.

Figure 21D:
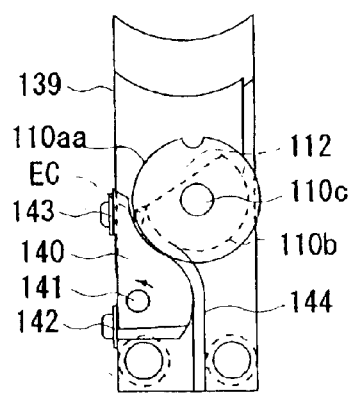

According to the above configuration, as shown in FIG. 21D, when an electronic component EC is taken out of the parallel space 112 into the feeding path 144, if the electronic component EC is disoriented and pinched between the second disk 110*b* of the feeding rotor 110 and the guide plate 140, resulting in so-called galling, the guide plate 140 rotates counterclockwise against the force of a plate spring 143 to evacuate its upper part from the second disk 110*b*. If galling occurs when an electronic component EC is taken out of the parallel space 112 into a feeding path 144, the guide plate 140 can be evacuated according to the load imposed on it, and thus the electronic component EC pinched between the second disk 110*b* and guide plate 140 can be protected from excessive force, preventing damage to the electronic component EC and the feeding rotor 110. The guide plate 140 powered by the plate spring 143 automatically corrects the attitude of the electronic component EC pinched between the second disk 110b of the feeding rotor 110 and the guide plate 140 and frees the pinched electronic component EC.

Figure 22A:
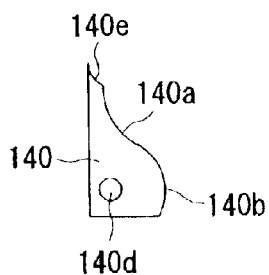
FIGS. 22A to 22c are diagrams showing variations of the sliding surface of the guide plate shown in FIGS. 21A to 21D.
Figure 22B:
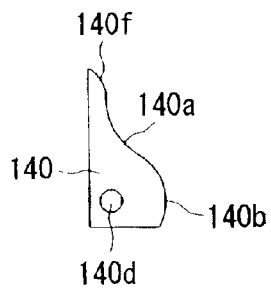
Figure 22C:
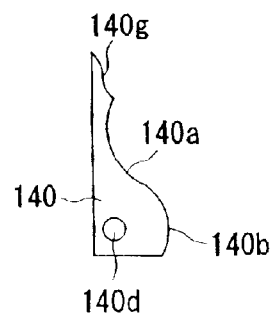

FIGS. 22A to 22C show variations of the sliding surface 140c of the guide plate 140 described above. In FIG. 22A, a sliding surface 140e consists of a convex curved surface. In FIG. 22B, a sliding surface 140f consists of a convex curved surface. In FIG. 22C, a sliding surface 140g is composed of concave and convex curved surfaces and the curved surface 140a is extended upward.

[Second Embodiment]

Figure 23:
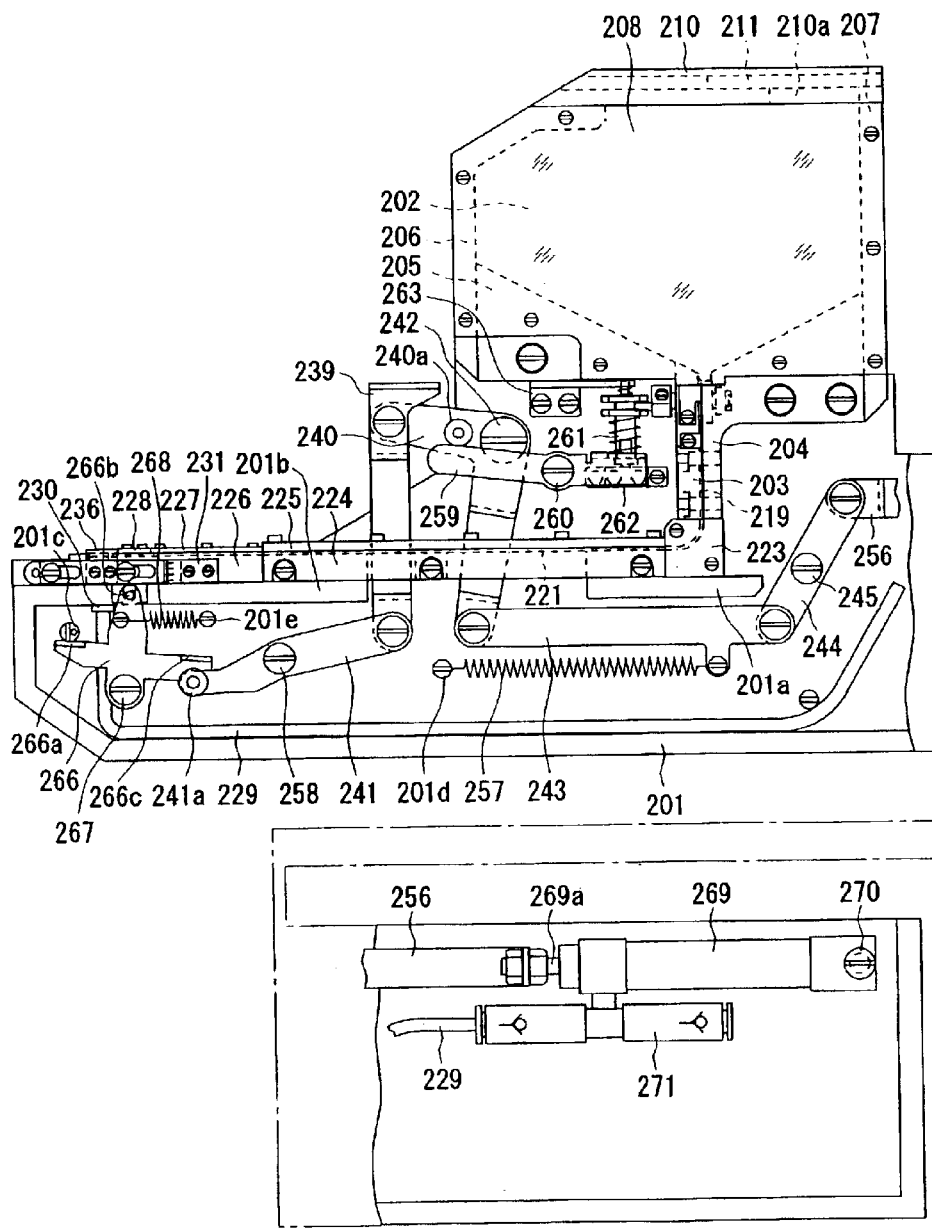
FIG. 23 is a left side view of a second apparatus according to the present invention.
Figure 24:
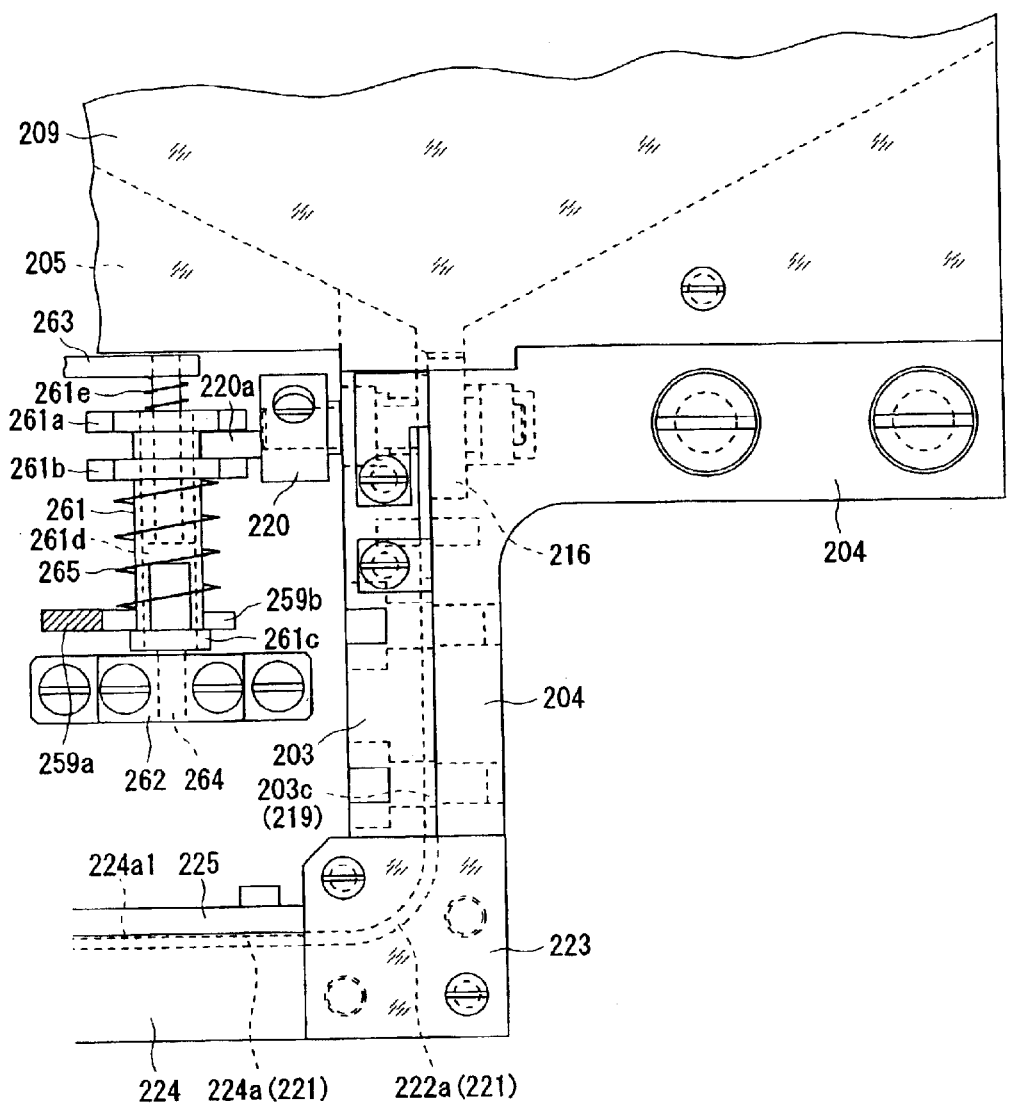
FIG. 24 is an enlarged partial view of FIG. 23.

FIGS. 23 to 42 show the configuration and operation of a second apparatus according to the present invention. In the following description, the left side in FIG. 23 is referred to as the front, right side—as the rear, the near side—as the left, and the far side—as the right.

A frame 201 is prepared by die-casting a metal material such as an aluminum alloy. On the left side of the frame 201 are a first support 201a and second support 201b for supporting path blocks 222, 224, and 226; a stopper pin 201c for a second drive lever; engagement pins 201d and 201e for coil springs.

A storeroom 202 for storing electronic components EC in bulk consists of a flat space enclosed by a first support member 203 and second support member 204 for rotatably supporting a feeding rotor 110, guide member 205, front side member 206, rear side member 207, left side plate 208, right side plate 209, and upper side member 210. The first support member 203 and second support member 204 are screwed to the frame 201, the first support member 203 is screwed to the second support member 204, the left side plate 208 and right side plate 209 are screwed to the first support member 203 and second support member 204, the front side member 206 is screwed being sandwiched between the left side plate 208 and right side plate 209, the rear side member 207 is screwed being sandwiched between the left side plate 208 and right side plate 209, and the upper side member 210 is screwed to the front side member 206 and rear side member 207. At least one of the left side plate 208 and right side plate 209 is transparent or translucent, so that the stockpile of components in the storeroom 202 can be seen from outside. A supply port 210a is formed in the upper side member 210, and a lid member 211 for opening and closing the supply port 210a is slidably attached to the upper side member 210.

Figure 25:
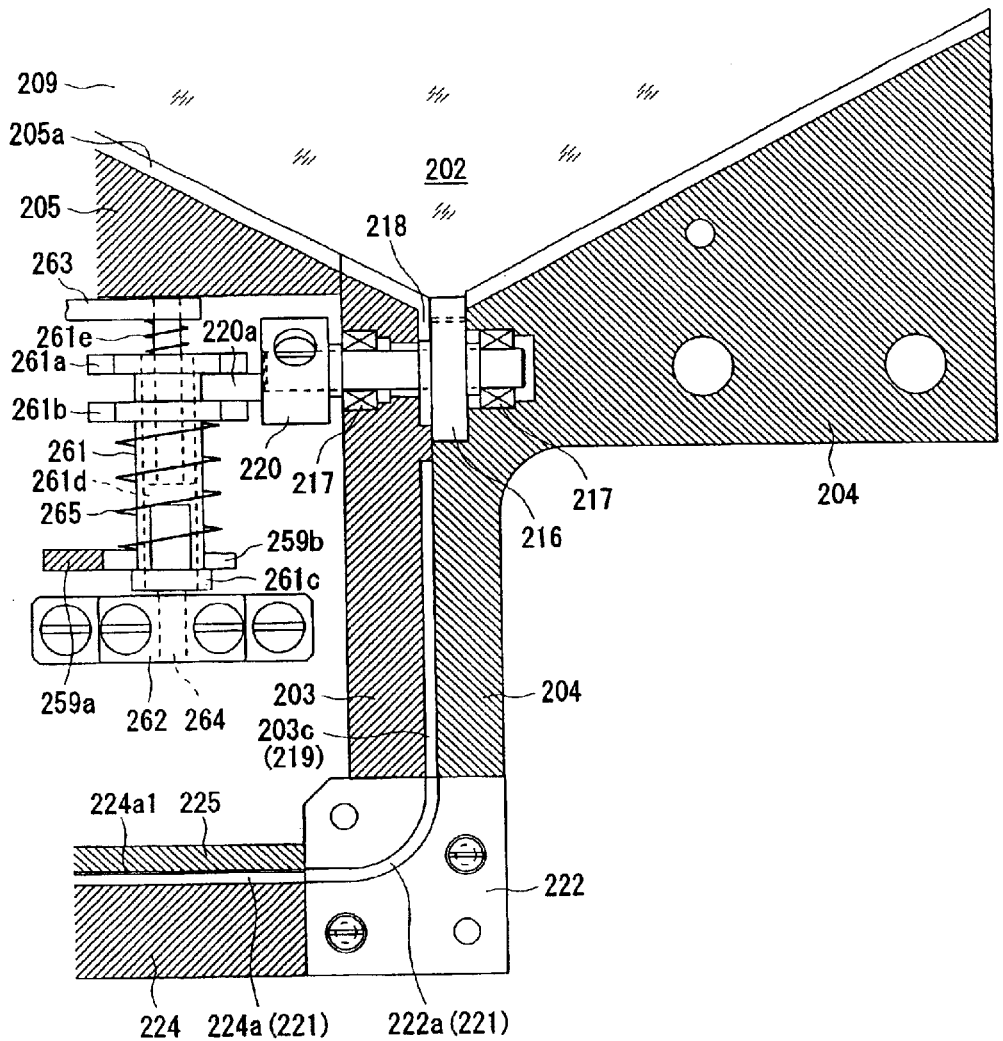
FIG. 25 is a longitudinal section of FIG. 24.
Figure 26A:
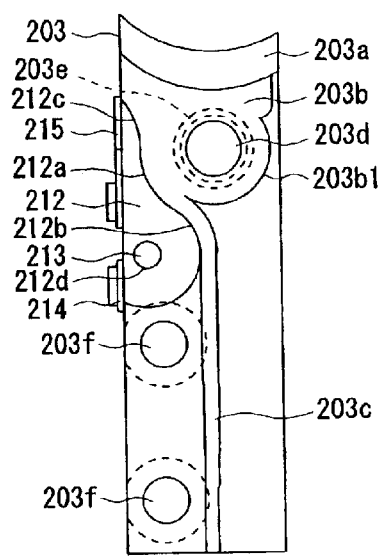
FIG. 26A is a rear view of the first support member shown in FIG. 24.

As shown in FIGS. 25 to 26A, a concave sliding surface 203a sloping downward to the rear is formed on the topside of a first support member 203. In the rear face of the first support member 203 is a recess 203b whose depth is approximately equal to the thickness of the second disk 216b of the feeding rotor 216. In the upper right part of the recess 203b is a curved surface 203b1 with a curvature approximately corresponding to the radius of curvature of the second disk 216b. In the lower left part of the recess 203b is a pin 213 for rotatably supporting a guide plate 212. Also, in the rear face of the first support member 203 is a vertical groove 203c with a rectangular cross section approximately as deep as the recess 203b. The upper right flank of the groove 203c is curved, reaching the curved surface 203b1. Incidentally, the opening width of the groove 203c is approximately equal to the difference in the radius of curvature between the first disk 216a and second disk 216b of the feeding rotor 216. Also, in the rear face of the first support member 203, a circular hole 203d larger in diameter than the shaft 216c of the feeding rotor 216 is formed concentrically with the center of curvature of the curved surface 203b1. A circular recess 203e concentric with the circular hole 203d is formed in the front face of the first support member 203 to fit a bearing 217. A stepped through-hole 203f is formed in the lower part of the first support member 203. Furthermore, a board 214 that defines the stationary position of the guide plate 212 is screwed to the left flank of the first support member 203 and a plate spring 215 that supports the upper left edge of the guide plate 212 is screwed above it.

The guide plate 212 has a thickness approximately equal to the depth of the recess 203b in the first support member 203. On its right edge, it has a curved surface 212a whose curvature almost corresponds to the radius of curvature of the first disk 216a of the feeding rotor 216, a curved surface 212b with a predetermined radius of curvature, extending from the lower end of the curved surface 212a to the upper end of the left flank of the groove 203c in the first support member 203, and a sliding surface 212c consisting of a convex curved surface continuous with the upper end of the curved surface 212a. Besides, at the center of curvature of the curved surface 212b is a hole 212d capable of fitting over the pin 213 installed on the first support member 203. The guide plate 212 is rotatably mounted on the first support member 203 by fitting the pin 213 into the hole 212d.

Figure 26B:
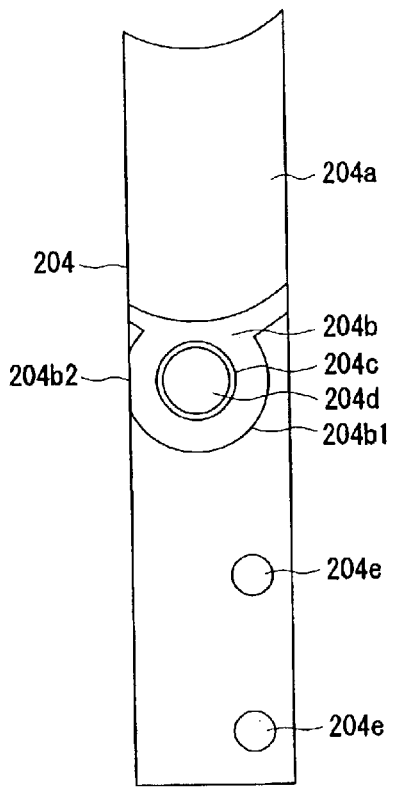
FIG. 26B is a front view of the second support member shown in FIG. 24.

As shown in FIGS. 25 and 26B, a concave sliding surface 204a sloping downward to the front is formed on the topside of the second support member 204. In the front face of the second support member 204 is a recess 204b whose depth is approximately equal to the thickness of the first disk 216a of the feeding rotor 216. In the lower part of the recess 204b is a curved surface 204b1 with a curvature approximately corresponding to the radius of curvature of the first disk 216a. An opening 204b2 is provided in the right side of the curved surface 204b1 of the recess 204b. A circular recess 204c concentric with the center of curvature of the curved surface 204b1 is formed inside the recess 204b to fit a bearing 217. Inside the circular recess 204c is a circular hole 204d concentric with the circular recess 204c and larger in diameter than the shaft 216c of the feeding rotor 216. A screw hole 204e corresponding to the stepped through-hole 203f in the first support member 203 is formed in the lower part of the second support member 204.

As shown in FIGS. 25 and 26B, on the topside of the guide member 205 is a sliding surface 205a connected smoothly with the sliding surface 204a of the second support member 204. The guide member 205 and first support member 203 in this apparatus are configured as separate pieces, but they may be configured as a single piece.

Figure 27A:
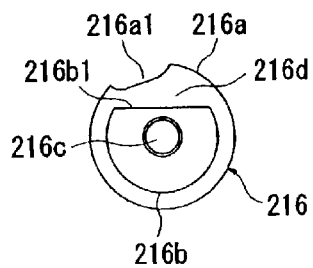
FIG. 27A is a front view of the feeding rotor shown in FIG. 24.
Figure 27B:
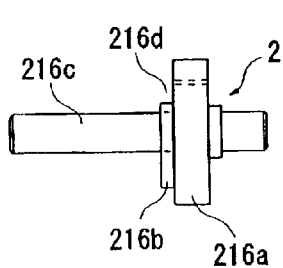
FIG. 27B is a left side view thereof.
Figure 27C:
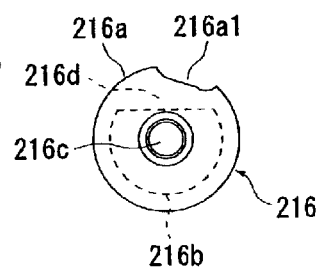
FIG. 27C is a rear view thereof.

As shown in FIGS. 27A to 27C, the feeding rotor 216 comprises the first disk 216a, second disk 216b which has a radius of curvature smaller than that of the first disk 216a and which is installed concentrically on one surface of the first disk 216a, and shaft 216c installed coaxially with the centers of curvature of the first disk 216a and second disk 216b. Also, it has a recess 216d as thick as the second disk 216b, forming a parallel space 218 in conjunction with the recess 203b in the first support member 203. Besides, the first disk 216a has an agitator 216a1 consisting of a roughly U-shaped groove in its outer periphery while the second disk 216b has a crena 216b1 corresponding to the recess 216d.

Although the feeding rotor 216 shown in the drawings is produced by inserting the shaft 216c prepared as an integral part of the first disk 216a into the center hole of the second disk 216b, it is also possible to produce the feeding rotor 216 by preparing the first disk 216a, second disk 216b, and shaft 216c as a single piece, or by inserting the shaft 216c into the center holes of the first disk 216a and second disk 216b, or by inserting the shaft 216c prepared as an integral part of the second disk 216b into the center hole of the first disk 216a.

To house the above described feeding rotor 216 in the first support member 203 and second support member 204, the respective bearings 217 are fitted in the circular recess 203e of the first support member 203 and the circular recess 204c of the second support member 204, one end of the shaft 216c is inserted in the circular hole 204d and bearing 217 in the second support member 204, the first disk 216a is inserted in the curved surface 204b1 of the recess 204b in the second support member 204, and then the first support member 203 is screwed to the second support member 204 with the rear face of the first support member 203 placed against the front face of the second support member 204 so that the other end of the shaft 216c will be inserted in the circular hole 203d and bearing 217 and that the second disk 216b will be inserted in the curved surface 203b1 of the recess 203b.

Figure 28A:
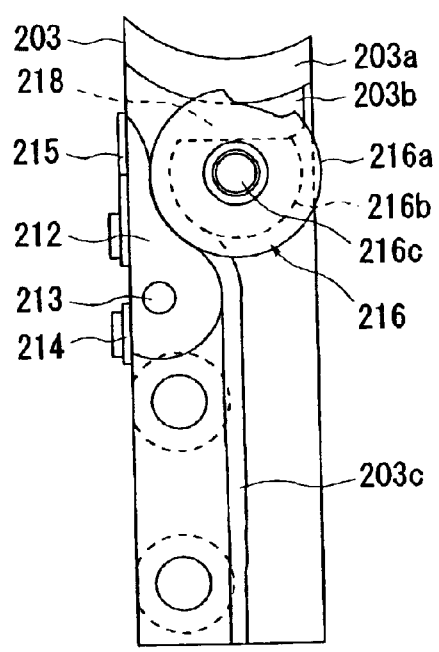
FIG. 28A is a diagram showing the state in which the feeding rotor is placed in the first support member.
Figure 28B:
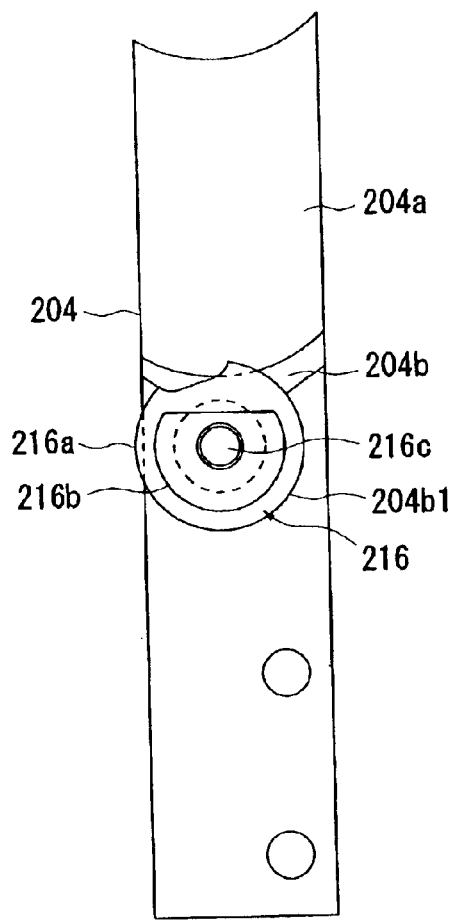
FIG. 28B is a diagram showing the state in which the feeding rotor is placed in the second support member.

FIG. 28A shows the state in which the shaft 216c of the feeding rotor 216 is inserted in the circular hole 203d and bearing 217 in the first support member 203, and the second disk 216b is inserted in the curved surface 203b1 of the recess 203b. FIG. 28B shows the state in which the shaft 216c of the feeding rotor 216 is inserted in the circular recess 204c and bearing 217 in the second support member 204, and the first disk 216a is inserted in the curved surface 204b1 of the recess 204b.

The feeding rotor 216 housed in the first support member 203 and second support member 204 has its shaft 216c rotatably supported by the two bearings 217. As shown in FIG. 25, the second disk 216b of the feeding rotor 216 rotatably contacts the inner surface of the recess 204b in the second support member 204, and the parallel space 218 with a width defined by the thickness of the second disk 216b is formed by the recess 216d between one surface of the first disk 216a and the inner surface of the recess 204b in the second support member 204. Besides, part of the outer periphery of the first disk 216a faces on the storeroom 202 through this cavity and the parallel space 218 communicates with the storeroom 202. The groove 203c in the first support member 203 is covered by the front face of the second support member 204, forming a feeding path 219 with a rectangular cross section. The second disk 216b of the feeding rotor 216 has a radius of curvature smaller than that of the first disk 216a. Consequently, a curved path with the same cross-sectional shape as the feeding path 219 is formed, continuing from the feeding path 219, between the curved surface 212a of the guide plate 212 and the outer periphery of the second disk 216b facing each other. In this apparatus, the curved path is used as the upper part of the feeding path 219. Part of the outer periphery of the first disk 216a of the feeding rotor 216 sticks out from the opening 204b2 of the recess 204b in the second support member 204. Incidentally, the opening in the upper side of the guide plate 212 formed by the recess 203b in the first support member 203 is blocked by the left side plate 208. Besides, as shown in FIG. 25, a driven member 220 with an eccentric pin 220a is installed on the part sticking out from the first support member 203 for the shaft 216c of the feeding rotor 216.

As shown in FIG. 23, FIG. 25, and FIGS. 29 to 34, a transport path 221 continuous with the above described feeding path 219 consists of the first path block 222 and a cover 223 covering its left flank, the second path block 224 and a cover 225 covering its topside, and the third path block 226 and two covers 227 and 228 covering its topside. In the left flank of the first path block 222 is a groove 222a having an opening whose width is approximately equal to the depth of the groove 203c in the first support member 203, a rectangular cross section whose depth is approximately equal to the opening width of the groove 203c, and a predetermined radius of curvature at the center of the path within an angular range of 90 degrees. In the topside of the second path block 224 is a horizontal groove 224a with approximately the same cross-sectional shape as the groove 222a in the first path block 222. Along the open edge of the groove 224a is a step 224a1 for an auxiliary air passage. In the topside of the third path block 226 is a horizontal groove 226a with approximately the same cross-sectional shape as the groove 222a in the first path block 222. Along the open edge of the groove 226a is a step 226a1 for an auxiliary air passage. The first path block 222 is screwed to the left flank of the frame 201, being supported by the first support 201a of the frame 201, and the cover 223 is screwed to the left flank of the first path block 222. The second path block 224 is screwed to the left flank of the frame 201, being supported by the first support 201a and second support 201b of the frame 201, and the cover 225 is screwed to the topside of the second path block 224. The third path block 226 is screwed to the left flank of the frame 201, being supported by the second support 201b of the frame 201, and the two covers 227 and 228 are screwed to the topside of the third path block 226. The above described transport path 221 is formed by covering the groove 222a of the first path block 222 with the cover 223, covering the groove 224a in the second path block 224 with the cover 225, and covering the groove 226a in the third path block 226 with the two covers 227 and 228. The transport path 221 thus formed does not have any step in itself and is connected with the above described feeding path 219 without a step. If transparent or translucent material is used for the covers 223, 225, 227, and 228, the electronic components EC transported in the transport path 221 can be seen from outside. As can be seen from FIGS. 33 and 34, the front end of the groove 226a in the third path block 226 is not covered by the front cover 228. It is used as a component output port of the transport path 221.

As shown in FIGS. 29 to 34, a recess 226b for installing a component stopper 233 is formed in the front part of the third path block 226, extending from its topside to its left flank. On the upper rear end of the recess 226b is a step 226b1 with a face continuous with the bottom face of the groove 226a (transport path 221). A suction hole 226c is formed in the bottom face of the recess 226b. Just under the suction hole 226c, a hole (not shown) continuous with the suction hole 226c is formed in the second support 201b of the frame 201. The lower end of this hole is fitted with a tube connector 230 for communicating the suction hole 226c with an air tube 229 (see FIG. 23). Besides, a spring holder 231 is screwed to the left flank of the third path block 226. Two coil springs 232 are supported by it, each sticking out one end.

Figure 35A:
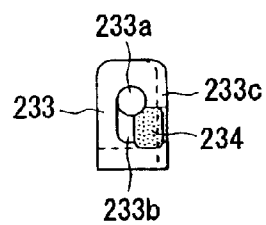
FIG. 35A is a top view of the component stopper shown in FIG. 29.
Figure 35B:
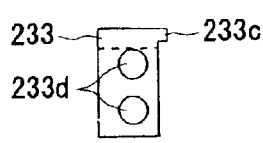
FIG. 35B is a left side view thereof.
Figure 35C:
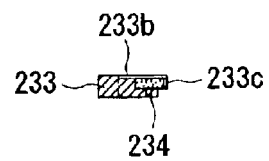
FIG. 35C is a longitudinal section thereof.

As shown in FIGS. 35A to 35C, the component stopper 233 is made of non-magnetic material such as stainless steel into an approximate L shape. The thickness of its top part is approximately equal to the depth of the upper part of the recess 226b in the third path block 226 while the thickness of its left flank is approximately equal to the depth of the left part of the recess 226b. The front-to-back dimensions of the top part and left flank of the component stopper 233 are smaller than the front-to-back dimension of the recess 226b. In the top part of the component stopper 233 is a suction hole 233a which can communicate with the suction hole 226c in the third path block 226. Also, there is an L-shaped groove 233*b* continuous with the upper end of the suction hole 233*a* and capable of facing the front end of the groove 226*a*. Besides, to attract the headmost electronic component EC in the transport path 221 to the component stopper 233, a permanent magnet 234 such as a samarium-cobalt magnet is embedded in the groove 233*b* of the component stopper 233 in such a way that the north or south pole will face the front end of the groove 226*a*. Furthermore, a jaw 233*c* is formed under the rear end of the top part of the component stopper 233. It has a thickness approximately equal to the depth of the step 226*b*1 in the recess 226*b* and a front-to-back dimension almost equal to the front-to-back dimension of the step 226*b*1. Besides, two screw holes 233*d* are made in the left flank of the component stopper 233. They are used to screw a guide plate 235 which has two guide holes 235*a* extending in the front/rear direction (see FIGS. 31 and 32).

Figure 36A:
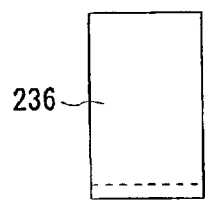
FIG. 36A is a top view of the shutter shown in FIG. 29.
Figure 36B:
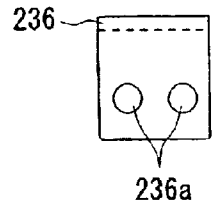
FIG. 36B is a left side view thereof.

As shown in FIGS. 36A and 36B, the shutter 236 has an approximate L shape. The front-to-back dimensions of its top part and left flank are larger than the front-to-back distance of the recess 226*b* in the third path block 226. In the left flank of the shutter 236 are screw holes 236*a*, which are used to screw a guide plate 237 that has two guide holes 237*a* extending in the front/rear direction, a roughly U-shaped engagement groove 237*b*, and a stopper pin 237*c* restricting the forward travel of the component stopper 233 guide plate 235 (see FIGS. 29 and 30).

Figure 29:
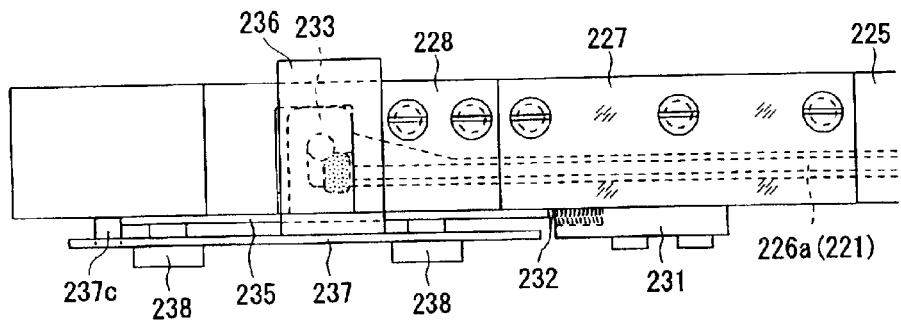
FIG. 29 is an enlarged partial top view of FIG. 23.
Figure 30:
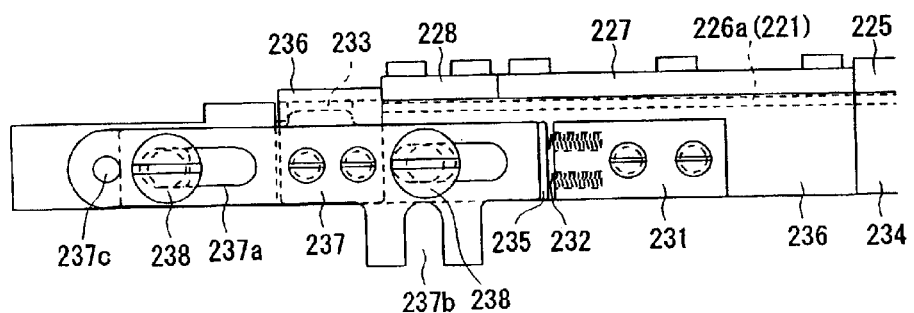
FIG. 30 is an enlarged partial side view of FIG. 23.
Figure 31:
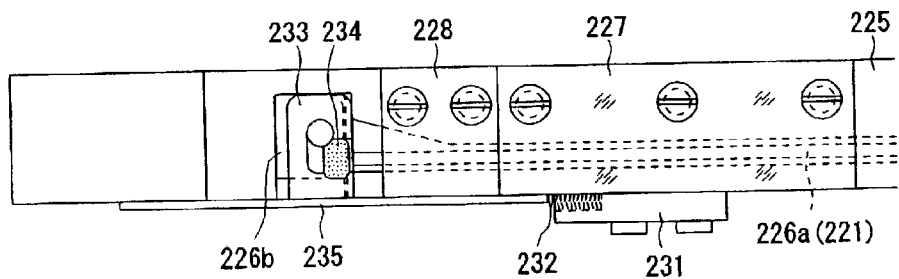
FIG. 31 is a diagram showing the view of FIG. 29 from which the shutter has been removed.
Figure 32:
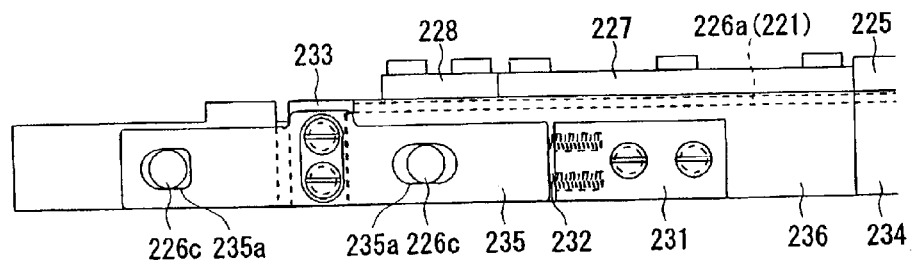
FIG. 32 is a diagram showing the view of FIG. 30 from which the shutter has been removed.
Figure 33:
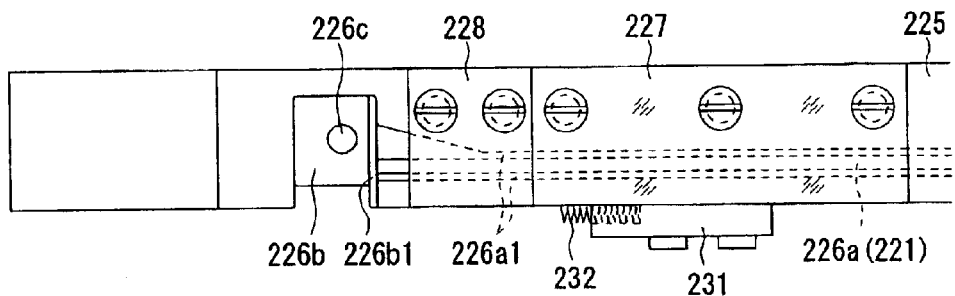
FIG. 33 is a diagram showing the view of FIG. 31 from which the component stopper has been removed.
Figure 34:
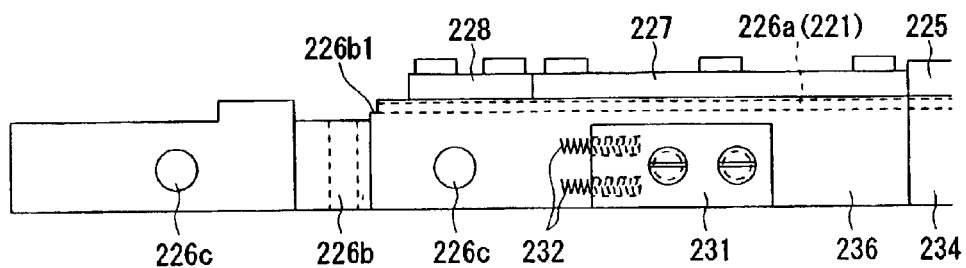
FIG. 34 is a diagram showing the view of FIG. 32 from which the component stopper has been removed.

The above described component stopper 233 and the above described shutter 236 are attached to the third path block 226 such that they can move back and forth, by placing the shutter 236 guide plate 237 on the component stopper 233 guide plate 235, inserting support shafts 238 into the guide holes 235*a* and guide holes 237*a* of the guide plate 235 and guide plate 237, and securing the support shafts 238 into screw holes 226*d* made in the left flank of the third path block 226. When the shutter 236 is at its retracted position, the component stopper 233 guide plate 235 is pressed backward by the stopper pin 237*c* of the shutter 236 guide plate 237 against the forces of the coil springs 232, keeping the rear end of the component stopper 233 jaw 233*c* in contact with front end of the transport path 221, as shown in FIGS. 29 and 30. The top part of the shutter 236 is covering the topside of the component stopper 233 and exposed front end of the transport path 221.

As shown in FIG. 23, a control lever 239 is disposed to the right of the second path block 224 and its cover 225. The front end of a roughly L-shaped first link 240 is rotatably coupled to its upper part while the rear end of a second link 241 is rotatably coupled to its lower end. The first link 240 is supported rotatably by a support shaft 242 secured to the frame 201 and is disposed to the right of the second path block 224 and its cover 225. In the upper part of the first link 240 is a roller 240*a* for driving a first drive lever 259 under pressure. Coupled rotatably to the lower end of the first link 240 is the front end of a third link 243. Coupled rotatably to the rear end of the third link 243 is the lower end of a fourth link 244, which is rotatably supported by a shaft 245 secured to the frame 201. Coupled rotatably to the upper end of the fourth link 244 is the front end of a fifth link 256. Incidentally, the third link 243 is pressed forward by a coil spring 257 mounted between itself and the engagement pin 201*d* on the frame 201. On the other hand, a second link 241 is rotatably supported by a shaft 258 secured to the frame 201 and has a roller 241*a* for driving under pressure a second drive lever 266 mounted on the front end.

As shown in FIG. 23, the first drive lever 259 is rotatably supported by a shaft 260 secured to the frame 201 and is disposed to the right of the first link 240. Behind the first drive lever 259 is a bend 259*a*, where a roughly U-shaped engagement groove 259*b* is formed (see FIG. 25).

A slider 261, cylindrical in shape, has collars 261*a* and 261*b* in the upper part and a smaller collar 261*c* in the lower part, as shown in FIGS. 23 and 25. The bore of the slider 261 is fitted with a bush 261*d*, above which is a coil spring 261*e*. The slider 261 is fitted vertically movably in a guide rod 264 via the bush 261*d* and pressed down by the coil spring 261*e*. The guide rod 264 is supported vertically by two rod holders 262 and 263, which are secured to the frame 201. The eccentric pin 220*a* of the driven member 220 mounted on the shaft 216*c* of the feeding rotor 216 is inserted between the upper collars 261*a* and 261*b* of the slider 261. Also, an overload protecting coil spring 265 is fitted between the upper collar 261*b* and lower collar 261*c* of the slider 261 while the engagement groove 259*b* of the first drive lever 259 is inserted between the lower collar 261*c* and the coil spring 265.

The second drive lever 266, which is roughly crossshaped, is rotatably supported by a support shaft 267 secured to the frame 201 as shown in FIG. 23. It has a bend 266*a* on the front end, a drive pin 266*b* on the upper end, and a bend 266*c* on the rear end. With the drive pin 266*b* inserted in the engagement groove 237*b* in the shutter 236 guide plate 237, the second drive lever 266 is pressed clockwise by a coil spring 268 mounted between itself and the engagement pin 201*e* on the frame 201, the front bend 266*a* contacts the stopper pin 201*c*, and the rear bend 266*c* faces the roller 241*a* of the second link 241 at an interval.

As shown in FIG. 23, an air cylinder 269 of a doubleacting type with two intake/exhaust ports, has its rear end rotatably supported by a support shaft 270 secured to the frame 201 and has the tip of its rod 269*a* coupled with the rear end of the above described fifth link 256.

One intake/exhaust port of the air cylinder 269 is connected with a control valve 271, as shown in FIG. 23, to branch the intake and exhaust ports. Specifically, as indicated by valve symbols in FIG. 23, the control valve 271 is structured such that its rear side serves as the exhaust port when the rod 269*a* advances and that its front side serves as the intake port when the rod 269*a* retracts from the advanced position. The intake port of the control valve 271 is connected with the other end of the above described air tube 229, and the exhaust port is open to the air.

The above described apparatus can handle electronic components EC in the shape of a rectangular prism with predetermined width, height, and length as well as electronic components EC in the shape of a cylinder with predetermined diameter and length. The electronic components EC are chip components such as chip capacitors, chip resistors or chip inductors; composite parts such as LC filters; array components such as capacitor arrays or inductor arrays; or other types of electronic component.

A rectangular cross section can be adopted for the feeding path 219 and transport path 221 regardless of the shape of the electronic components EC. However, it is necessary to adjust the thickness of the second disk 216*b* of the feeding rotor 216, which defines the width of the parallel space 218, and adjust the difference in the radius of curvature between the first disk 216*a* and second disk 216*b* of the feeding rotor 216, the dimensions of the feeding path 219, and the dimensions of the transport path 221 according to the width or height of the electronic component EC if the electronic component has a shape of a rectangular prism or according to the diameter of the electronic component EC if the electronic component has a cylindrical shape.

For example, when feeding an electronic component EC in the shape of a rectangular prism which has a dimensional relationship "length>width=height," the thickness of the second disk 216b of the feeding rotor 216 is set slightly larger than the width or height of the electronic component EC, the difference in the radius of curvature between the first disk 216a and second disk 216b of the feeding rotor 216 is set slightly larger than the width or height of the electronic component EC, the front-to-back spacing and side-to-side spacing of the feeding path 219 are set slightly larger than the width or height of the electronic component EC, and the vertical spacing and side-to-side spacing of the transport path 221 are set slightly larger than the width or height of the electronic component EC.

Also, when feeding an electronic component EC in the shape of a rectangular prism which has a dimensional relationship "length>width>height," the thickness of the second disk 216b of the feeding rotor 216 is set slightly larger than the height and smaller than the width of the electronic component EC, the difference in the radius of curvature between the first disk 216a and second disk 216b of the feeding rotor 216 is set slightly larger than the width of the electronic component EC, the front-to-back spacing of the feeding path 219 is set slightly larger than the height and smaller than the width of the electronic component EC, the side-to-side spacing of the feeding path 219 is set slightly larger than the width of the electronic component EC, the vertical spacing of the transport path 221 is set slightly larger than the height and smaller than the width of the electronic component EC, and the side-to-side spacing of the transport path 221 is set slightly larger than the width of the electronic component EC.

Besides, when feeding a cylindrical electronic component EC, the thickness of the second disk 216b of the feeding rotor 216 is set slightly larger than the diameter of the electronic component EC, the difference in the radius of curvature between the first disk 216a and second disk 216b of the feeding rotor 216 is set slightly larger than the diameter of the electronic component EC, the front-to-back spacing and side-to-side spacing of the feeding path 219 are set slightly larger than the diameter of the electronic component EC, and the vertical spacing and side-to-side spacing of the transport path 221 are set slightly larger than the diameter of the electronic component EC.

The operation of the above described apparatus will be described below with reference to FIGS. 37 to 42, taking the case of an electronic component EC in the shape of a rectangular prism which has a dimensional relationship "length>width=height," for the sake of convenience.

To feed components, the above described apparatus, which is in the stand-by state shown in FIG. 23, starts operation with thousands to tens of thousands of electronic components EC stored in bulk in the storeroom 202. When the operation starts, the upper end of the control lever 239 is pressed down for a predetermined distance by the application of an external force as shown in FIG. 37, and then the force is removed to return the control lever 239 under the force of the coil spring 257: this cycle is repeated at a predetermined frequency.

Figure 37:
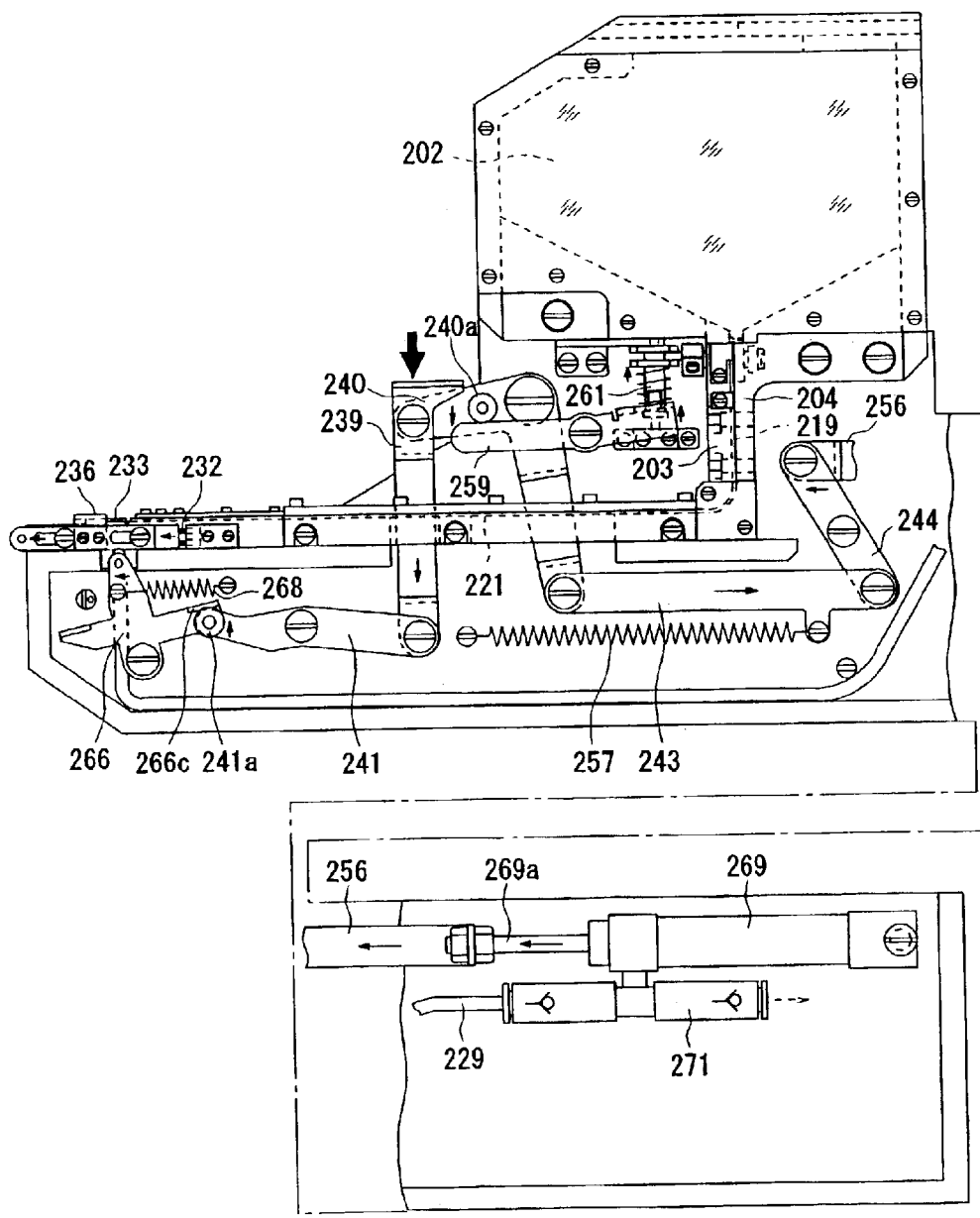
FIG. 37 is a diagram illustrating the operation of the apparatus shown in FIG. 23.

Referring to FIG. 37, when the upper end of the control lever 239 is pressed down, the first link 240 rotates counterclockwise by a predetermined angle, which causes the third link 243 to retract a predetermined distance against the force of the coil spring 257. This causes the fourth link 244 to rotate counterclockwise by a predetermined angle, which in turn causes the fifth link 256 to advance a predetermined distance, causing in turn the rod 269a of the air cylinder 269 to advance a predetermined distance. At the same time, the first drive lever 259 rotates counterclockwise by a predetermined angle, being pushed by the roller 240a of the first link 240. Also, the second link 241 rotates clockwise by a predetermined angle while the second drive lever 266 rotates counterclockwise by a predetermined angle against the force of the coil spring 268, being pushed by the roller 241a of the second link 241. On the other hand, when the force is removed from the upper end of the control lever 239; the first link 240, third link 243, fourth link 244, and fifth link 256 return to original position by traveling in reverse under the force of the coil spring 257, the control lever 239 returns by ascending from the lowered position, the first drive lever 259 returns by rotating in reverse under the force of the coil spring 265, and the rod 269a of the air cylinder 269 returns by retracting from the advanced position. With the return of the control lever 239, the second link 241 returns by rotating in reverse and the second drive lever 266 returns by rotating in reverse under the force of the coil spring 268.

Figure 38:
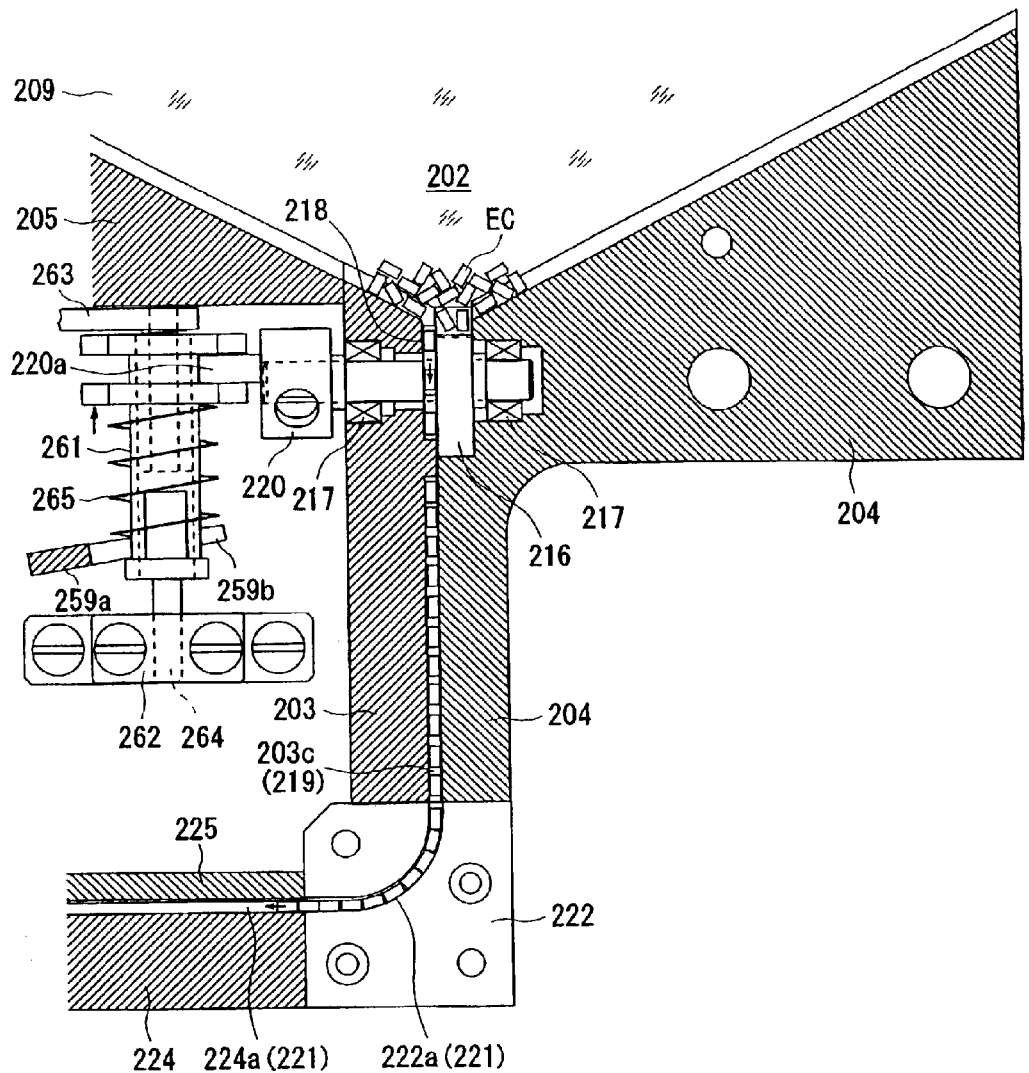
FIG. 38 is a diagram illustrating the operation of the apparatus shown in FIG. 23.

As shown in FIG. 38, when the first drive lever 259 rotates counterclockwise by a predetermined angle, the bend 259a of the first drive lever 259 raises the slider 261 via the coil spring 265 for a predetermined distance overcoming the force of the coil spring 261e. This forces up the eccentric pin 220a mounted between the upper collars 261a and 261b of the slider 261. Consequently, the driven member 220 rotates clockwise as viewed from the front, by a predetermined angle (e.g., somewhere around 45 degrees), making the feeding rotor 216 rotate together in the same direction by the same angle. Incidentally, the coil spring 265 mounted between the bend 259a of the first drive lever 259 and the slider 261 has the purpose of overload protection. If the ascending slider 261 is overloaded, the coil spring 265 compresses to suppress the ascent of the slider 261. On the other hand, when the first drive lever 259 returns by rotating in reverse, the slider 261 returns by descending from the raised position under the force of the coil spring 261e. This forces down the eccentric pin 220a mounted between the upper collars 261a and 261b of the slider 261. Consequently, the driven member 220 returns by rotating in reverse, making the feeding rotor 216 rotate together in the same direction by the same angle. In the figure, the position in which the bottom face of the parallel space 218 (crena of the second disk 216b) is approximately horizontal is established as the stand-by position of the feeding rotor 216 and the feeding rotor 216 oscillates between that position and a position in which the bottom face of the parallel space 218 becomes tilted. However, it is also possible to set the stand-by position of the feeding rotor 216 at a position where the bottom face of the parallel space 218 is tilted and to rotate the feeding rotor 216 until it tilts further. Of course, by reversing the rotational direction of the feeding rotor 216, it is also possible to set the stand-by position of the feeding rotor 216 at a position where the bottom face of the parallel space 218 is tilted and to rotate the feeding rotor 216 until the bottom face of the parallel space 218 becomes approximately horizontal.

Figure 39A:
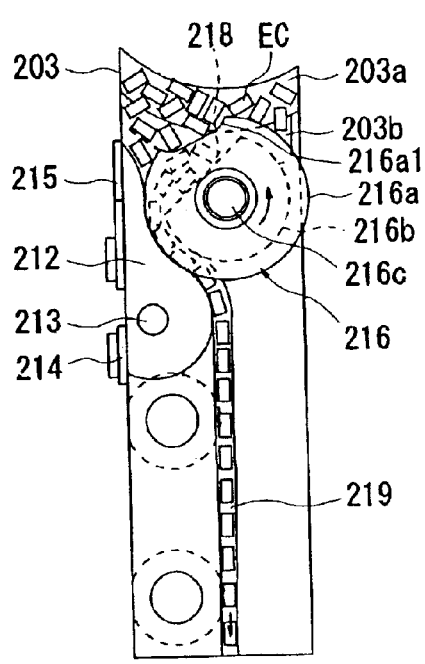
FIGS. 39A and 39B are diagrams illustrating the operation of the apparatus shown in FIG. 23.
Figure 39B:
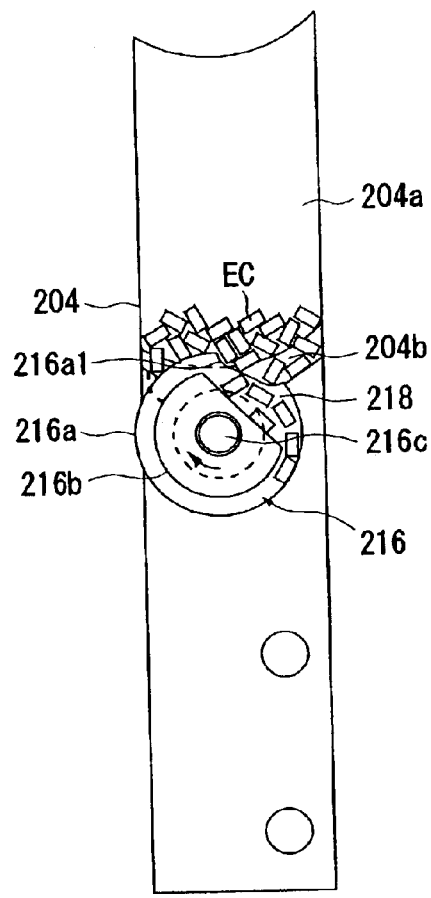

As shown in FIGS. 38, 39A, and 39B, the electronic components EC stored in bulk in the storeroom 202 move downward along the slopes of the sliding surface 203a of the first support member 203 and the sliding surface 204a of the second support member 204. A plurality of electronic components EC reach the outer periphery of the first disk 216a of the feeding rotor 216.

In this state, as the feeding rotor 216 oscillates within a predetermined angular range, the electronic components EC on the upper side of the first disk 216a are agitated by the agitator 216a1 and the agitated electronic components EC are taken into the parallel space 218 with one of their four side faces approximately parallel to the front face of the first disk 216a. A plurality of electronic components EC can be taken simultaneously into the parallel space 218, which has a sufficiently large extent. The position of the parallel space 218 changes with the rotation of the feeding rotor 216, but components continue to be taken into the parallel space 218 regardless of this change.

During the oscillation of the feeding rotor 216, when the bottom face of the parallel space 218 (crena of the second disk 216b) tilts down toward the feeding path 219, the electronic components EC taken into the parallel space 218 move along the bottom slope toward the upper end of the feeding path 219, and being guided by the sliding surface 212c of the guide plate 212, they are taken one by one into the feeding path 219 with their four faces approximately parallel to the side faces of the feeding path 219.

When an electronic component EC is taken out of the parallel space 218 into the feeding path 219, if the electronic component EC is pinched between the second disk 216b of the feeding rotor 216 and the guide plate 212, the guide plate 212 rotates counterclockwise against the force of a plate spring 215 to evacuate its upper part from the second disk 216b, as is the case with the first apparatus. This protects the electronic component EC pinched between the second disk 216b and guide plate 212 from excessive force, preventing damage to the electronic component EC and the feeding rotor 216. The guide plate 212 powered by the plate spring 215 automatically corrects the attitude of the electronic component EC pinched between the second disk 216b of the feeding rotor 216 and the guide plate 212 and frees the pinched electronic component EC.

Since the feeding rotor 216 oscillates at a predetermined frequency, the process of taking components from the storeroom 202 into the parallel space 218 and the process of taking components from the parallel space 218 into the feeding path 219 are performed practically continuously. The electronic components EC taken into the feeding path 219 move downward along the vertical feeding path 219 by gravity, have their attitude changed from vertical to horizontal while they are passing through the curve in the back of the transport path 221, and then taken into the horizontal transport path 221.

Incidentally, when feeding an electronic component EC in the shape of a rectangular prism which has a dimensional relationship "length>width=height," the components can be taken in similarly even if the thickness of the second disk 216b of the feeding rotor 216, difference in the radius of curvature between the first disk 216a and second disk 216b of the feeding rotor 216, and front-to-back spacing and side-to-side spacing of the feeding path 219 described above are set slightly larger than the diagonal on the end face of the electronic component EC and smaller than twice the width or height of the electronic component EC. In that case, the electronic components EC will be taken into the parallel space 218 and feeding path 219 with one of their four side faces forming an angle of up to 45 degrees with the front face of the first disk 216a. However, this will not hinder component feeding because the orientation of the electronic components will be corrected to make their four side faces approximately parallel to the four faces of each path when the electronic components EC pass through the feeding path 219 or the curve in the transport path 221.

When the rod 269a of the air cylinder 269 advances a predetermined distance, since the rear side of the control valve 271 serves as an exhaust port, air is released outside through the exhaust port along with the advancement of the rod 269a. On the other hand, when the rod 269a of the air cylinder 269 returns by retracting from the advanced position, since the front side of the control valve 271 serves as an intake port, an air suction force works to suck air into the transport path 221 through the air tube 229, through the suction hole 226c in the third path block 226 and through the suction hole 233a and groove 233b in the component stopper 233 along with the retraction of the rod 269a. Incidentally, it is not that this air suction force is generated at the same time as the rod 269a starts to advance. Actually, the air suction force begins to be generated later than the rod 269a starts to advance.

Figure 40:
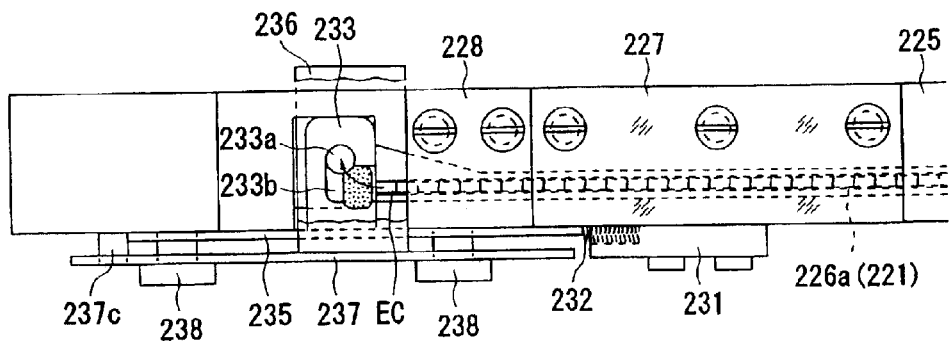
FIG. 40 is a diagram illustrating the operation of the apparatus shown in FIG. 23.

If the air suction force acts in the transport path 221 with the front end of the transport path 221 placed in contact with the rear end of the jaw 233c of the component stopper 233 and with the suction hole 233a and groove 233b in the component stopper 233 and the exposed front end (component output port) of the transport path 221 covered by the shutter 236 as shown in FIGS. 29 and 30, an air flow as indicated by the solid arrow in FIG. 40 is generated in the transport path 221 and in the auxiliary air passage (not indicated) formed by the step 226a1. Consequently, the electronic components EC taken into the horizontal transport path 221 are drawn forward by the air flow and transported forward in aligned form in the transport path 221. The electronic components EC transported forward in aligned form in the transport path 221 stop when the headmost electronic component EC touches the jaw 233c of the component stopper 233 as shown in FIG. 40. Then the headmost electronic component EC is drawn to the jaw 233c of the component stopper 233 by means of a permanent magnet 234.

Then, as the second drive lever 266 rotates counterclockwise by a predetermined angle against the force of the coil spring 268, the shutter 236 guide plate 237, with its engagement groove 237b in engagement with the drive pin 266b of the second drive lever 266, starts to advance from its retracted position while the component stopper 233 guide plate 235, whose forward travel was restricted by the guide plate 237 stopper pin 237c, starts to advance together with the component stopper 233, being driven by the forces of the coil springs 232. On the other hand, when the second drive lever 266 returns by rotating in reverse, being driven by the force of the coil spring 268, the guide plate 237 and shutter 236 return by retracting from their advanced position, and the guide plate 235 and component stopper 233 return by retracting from its advanced position, being pushed by the guide plate 237 stopper pin 237c.

Figure 41:
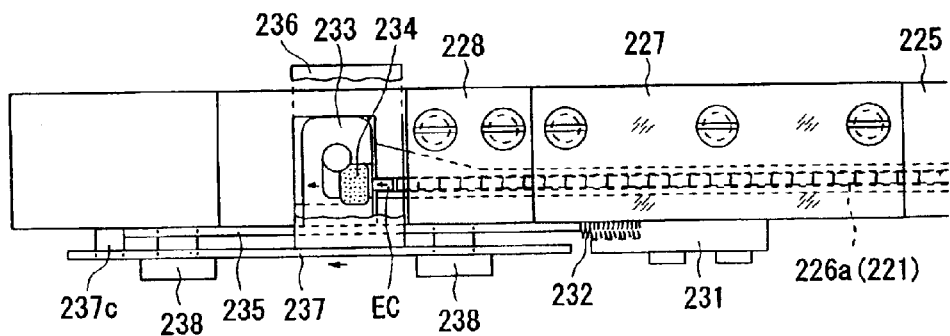
FIG. 41 is a diagram illustrating the operation of the apparatus shown in FIG. 23.
Figure 42:
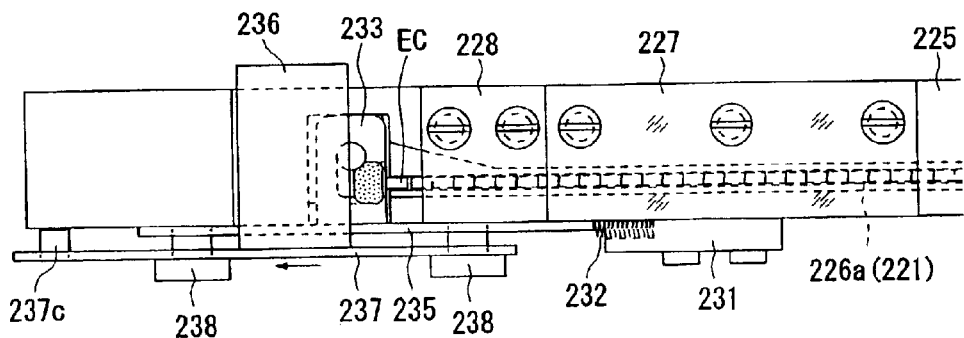
FIG. 42 is a diagram illustrating the operation of the apparatus shown in FIG. 23.

When the shutter 236 and guide plate 237 start to advance with the electronic components EC lined up in the transport path 221 and with the headmost electronic component EC placed in contact with the component stopper 233 jaw 233c as shown in FIG. 40, the component stopper 233 and guide plate 235 advance the distance defined by the clearance between the component stopper 233 and the recess 226b in the third path block 226 or clearance between the guide plate 235 guide holes 235a and the support shafts 238 as shown in FIG. 41, the component stopper 233 jaw 233c leaves the front end of the transport path 221, sliding over the step 226b1 on the recess 226b, the headmost electronic component EC sticking to the jaw 233c is separated from the succeeding electronic components EC by moving slightly forward sliding over the step 226b1, and a gap is formed between the headmost electronic component EC and the next electronic component EC. The shutter 236 and guide plate 237 advance further even after the component stopper 233 ceases to advance as shown in FIG. 42. This opens up the front end of the transport path 221 as well as part of the component stopper 233 groove 233b. The separated headmost electronic component EC is taken out, in the state shown in FIG. 42, through the front end (component output port) of the transport path 221 by a suction nozzle or the like.

After the separated headmost electronic component EC is taken out, when the shutter 236 and guide plate 237 return by retracting from their advanced position, the guide plate 235 and component stopper 233 return by retracting from their advanced position by the pressure of the guide plate 237 stopper pin 237c, and the suction hole 233a and groove 233b in the component stopper 233 and the front end of the transport path 221 are covered again by the shutter 236.

Thus, by oscillating the feeding rotor 216 within a predetermined angular range, the electronic component feeding apparatus described above can take the electronic components EC stored in bulk in the storeroom 202 into the parallel space 218 in such an orientation that the center line of the electronic components EC will be parallel to the parallel space 218, and each time the bottom of the parallel space 218 tilts down toward the feeding path 219 during an oscillation of the feeding rotor 216, the apparatus can move the electronic components EC in the parallel space 218 toward the feeding path 219, take one electronic component EC at a time into the feeding path 219 in such an orientation that the center line of the electronic component EC will be parallel to the feeding path 219, and allow the electronic component EC taken into the feeding path 219 to move downward under its own weight. Thus, by simply oscillating the feeding rotor 216 within a predetermined angular range, the apparatus can feed, in aligned form, the electronic components EC stored in bulk in the storeroom 202, in an efficient and stable manner. In this way, the apparatus provides feeding performance capable of keeping pace with component retrieval in a fast cycle time of 0.1 second or less.

Also, since the present invention can perform the aligned feeding described above by using only the feeding rotor 216, it can simplify and downsize the configuration of the feeding means existing between the storeroom 202 and feeding path 219 and eventually contribute to simplification, downsizing, and cost reduction of the apparatus.

Furthermore, by adjusting the thickness of the second disk 216b of the feeding rotor 216, which defines the width of the parallel space 218, and adjusting the difference in the radius of curvature between the first disk 216a and second disk 216b of the feeding rotor 216, the dimensions of the feeding path 219, and the dimensions of the transport path 221, it is possible to handle electronic components EC in the shape of a rectangular prism which has a dimensional relationship "length>width=height," electronic components EC in the shape of a rectangular prism which has a dimensional relationship "length>width>height," or electronic components EC in the shape of a cylinder.

Furthermore, since the agitator 216a1 consisting of a roughly U-shaped groove is provided in the outer periphery of the first disk 216a of the feeding rotor 216, the electronic components EC on the upper side of the first disk 216a can be agitated efficiently while the feeding rotor 216 oscillates within a predetermined angular range, facilitating the process of taking the electronic components EC into the parallel space 218.

Furthermore, the feeding mechanism including the feeding rotor 216 can be exposed by removing the first support member 203 from the second support member 204. This makes the maintenance and repair of the feeding mechanism easier to perform.

Furthermore, since part of the outer periphery of the first disk 216a of the feeding rotor 216 sticks out from the opening 204b2 in the second support member 204, dirt, component particles, etc. can be discharged through the gap between the first disk 216a and opening 204b2 during the rotation of the feeding rotor 216.

Since part of the feeding path 219 adjacent to the feeding rotor 216 consists of the rotatable guide plate 212, if an electronic component EC is pinched between the second disk 216b of the feeding rotor 216 and the guide plate 212 when it is taken out of the parallel space 218 into the feeding path 219, the guide plate 212 can rotate counterclockwise against the force of the plate spring 215 to evacuate its upper part from the second disk 216b. This protects the electronic component EC pinched between the second disk 216b and guide plate 212 from excessive force, preventing damage to the electronic component EC and the feeding rotor 216. The guide plate 212 powered by the plate spring 215 automatically corrects the attitude of the electronic component EC pinched between the second disk 216b of the feeding rotor 216 and the guide plate 212 and frees the pinched electronic component EC.

Furthermore, since the air cylinder 269 is used to provide the air suction force for transporting the electronic components EC taken into the transport path 221 from the feeding path 219, and it is mounted on the frame 201 so that it can be operated with a control lever 239, there is no need to install a separate suction source such as a vacuum pump for generating the suction force within the transport path 221 or to install complicated air piping from such a suction source. This also contributes to simplification, downsizing, and cost reduction of the apparatus.

Furthermore, after the electronic components EC transported forward in aligned form through the transport path 221 are stopped by the component stopper 233, the headmost electronic component EC sticking to the component stopper 233 by the magnetic force of the permanent magnet 234 can be separated from the succeeding electronic components EC by moving it slightly forward together with the component stopper 233 being advanced a predetermined distance. This prevents the headmost electronic component EC from interfering with the succeeding electronic components EC when it is taken out from the front end of the transport path 221 by a suction nozzle or the like, and thus ensures proper component retrieval operations.

Incidentally, although the apparatus described above employs the double-acting type air cylinder 269 comprising two intake/exhaust ports, connecting one of them with the control valve 271 and exposing the other to the air, it is also possible to install a filter at the exposed intake/exhaust port to avoid drawing dust into the air cylinder 269 together with air during the retraction of the rod 269a. Also, a filter may be installed in the air tube 229 or at the intake port of the control valve 271 to avoid drawing dust into the control valve 271 or air cylinder 269 together with the air drawn into the control valve 271 through the air tube 229. Of course, the air cylinder 269 may be a single-acting type with a single intake/exhaust port.

Also, in the apparatus described above, the first support member 203 and second support member 204 for the feeding rotor 216 are screwed together detachably. If a positioning pin and a positioning hole are provided on/in the rear face of the first support member 203 and the front face of the second support member 204, respectively, or vice versa, the positioning accuracy in joining the first support member 203 and second support member 204 can be improved. Besides, the first support member 203 and the second support member 204 may be joined not only by screws, but also, for example, by attraction between permanent magnets or by attraction between a permanent magnet and ferromagnetic material as long as the required bonding power is ensured.

Furthermore, although in the apparatus described above, the headmost electronic component EC sticking to the component stopper 233 by the magnetic force of the permanent magnet 234 is separated from the succeeding electronic components EC by moving it slightly forward together with the component stopper 233, it is also possible to use the component stopper 233 without the permanent magnet 234. Then, the force applied to the headmost electronic component EC can be removed by taking away the component stopper 233 from the headmost electronic component EC.

Furthermore, although in the apparatus described above, the feeding rotor 216 is arranged with its shaft 216c placed approximately horizontal, similar feed operation can be performed even if the feeding rotor 216 is arranged with its shaft 216c tilted or if it is arranged such that the feeding path 219 will tilt together with the feeding rotor 216.

Furthermore, although the apparatus described above transports electronic components EC by supplying air suction force into the transport path 221 through its front end, it is also possible to transport electronic components EC by blowing air into the transport path 221 through its rear end.

[Third Embodiment]

Figure 43:
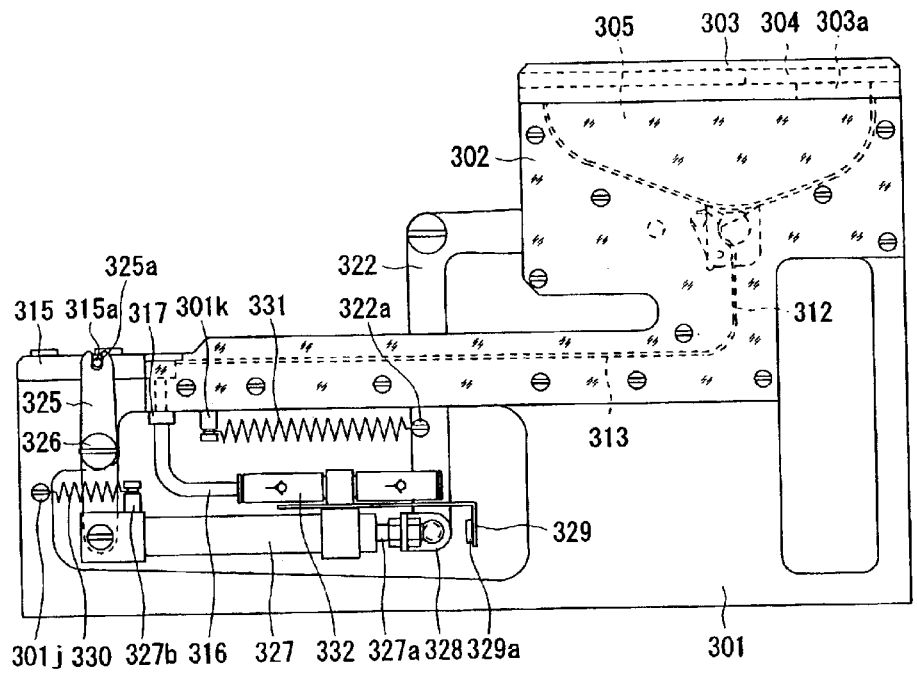
FIG. 43 is a left side view of a third apparatus according to the present invention.

FIGS. 43 to 67 show the configuration and operation of a third apparatus according to the present invention while FIG. 68 shows a partial variation. In the following description, the left side in FIG. 43 is referred to as the front, right side—as the rear, the near side—as the left, and the far side—as the right.

A frame 301 is prepared by die-casting a metal material such as an aluminum alloy. At the top right of the left flank of the frame 301 is a recess 301a, which forms a storeroom 305 as a cover 302 is screwed to the left flank of the frame 301 and an upper member 303 is screwed to the upper rear end of the frame 301. The bottom face of the recess 301a slopes down to the left. A supply port 303a is formed in the upper side member 303, and a lid member 304 for opening and closing the supply port 303a is slidably attached to the upper side member 303.

Figure 45:
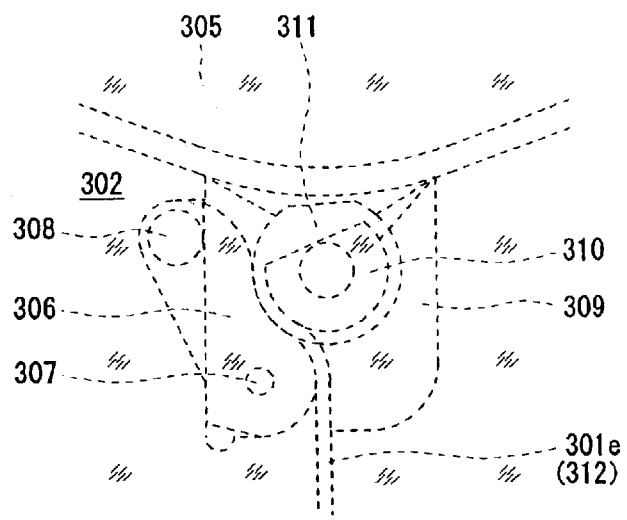
FIG. 45 is an enlarged partial view of FIG. 43.
Figure 46:
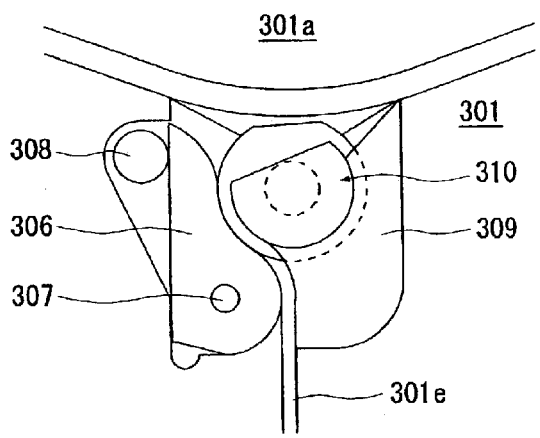
FIG. 46 is a diagram showing the view of FIG. 43 from which the cover has been removed.
Figure 47:
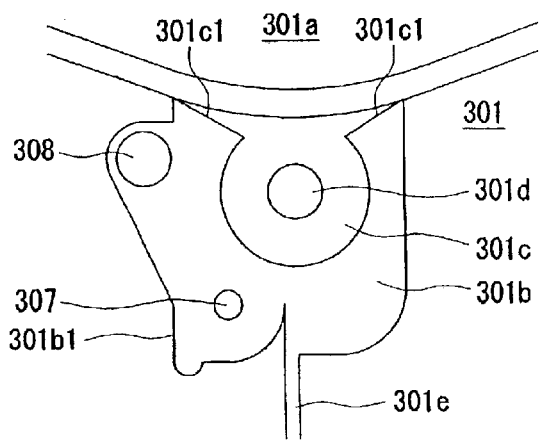
FIG. 47 is a diagram showing the view of FIG. 46 from which the feeding rotor, guide plate, and support plate have been removed.

As shown in FIGS. 45 to 47, just under the deepest part of the above described recess 301a in the left flank of the frame 301 is a recess 301b whose depth is approximately equal to the thickness of a second disk 310b of a feeding rotor 310. Inside the recess 301b is a circular recess 301c with a depth approximately equal to the thickness of a first disk 310a of the feeding rotor 310 and with a radius of curvature approximately equal to that of the first disk 310a. The upper part of the circular recess 301c is open to the recess 301a and on the open end is an inclined surface 301c1. Also, at the center of the circular recess 301c is a circular hole 301d larger in diameter than the shaft 310c of the feeding rotor 310.

Figure 48:
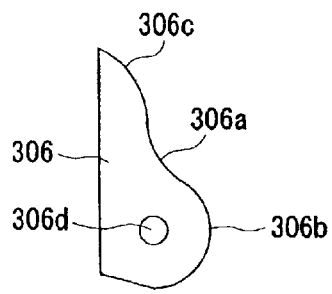
FIG. 48 is a left side view of the guide plate shown in FIG. 45.

That part of the recess 301b which is to the left of the circular recess 301c is used as mounting space for a guide plate 306 and contains a pin 307 for rotatably supporting the guide plate 306, elastic material 308 such as synthetic rubber or urethane resin for supporting the upper front edge of the guide plate 306, and a stopper surface 301b1 for restricting the rotation of the guide plate 306 in the direction of the feeding rotor. As shown in FIG. 48, the guide plate 306 has a thickness approximately equal to the depth of the recess 301b. On its rear edge are a curved surface 306a with a curvature approximately corresponding to the radius of curvature of the first disk 310a of the feeding rotor 310, a curved surface 306b with a predetermined radius of curvature, extending downward from the lower end of the curved surface 306a, and a sliding surface 306c, extending upward from the upper end of the curved surface 306a. Besides, at the center of curvature of the curved surface 306b is a hole 306d capable of fitting over the above described pin 307. As shown in FIG. 45, the guide plate 306 is rotatably disposed in the recess 301b by fitting the hole 306d over the pin 307. Incidentally, the stopper surface 301b1 restricts the rotation of the guide plate 306 in the direction of the feeding rotor, but allows the rotation in the reverse direction against the elasticity of the elastic material 308.

Figure 49:
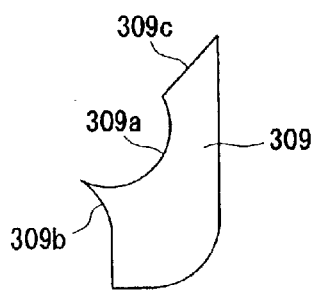
FIG. 49 is a left side view of the support plate shown in FIG. 45.

The remaining part of the recess 301b to the right of the circular recess 301c is used as mounting space for a support plate 309. As shown in FIG. 49, the support plate 309 has a thickness approximately equal to the depth of the recess 301b. On its front edge, it has a curved surface 309a with a curvature approximately corresponding to the radius of curvature of the second disk 310b of the feeding rotor 310, a curved surface 309b with a predetermined radius of curvature, extending downward from the lower end of the curved surface 309a, and a sliding surface 309c, sloping up to the rear from the upper end of the curved surface 309a. The geometry from the rear edge to the lower edge of the support plate 309 is approximately identical to that of the recess 301b. As shown in FIG. 45, the support plate 309, which is fitted into the rear flank of the recess 301b after the feeding rotor 310 is mounted, holds the outer periphery of the second disk 310b of the feeding rotor 310 on its curved surface 309a.

Figure 50A:
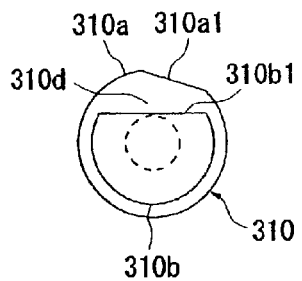
FIG. 50A is a left side view of the feeding rotor shown in FIG. 45.
Figure 50B:
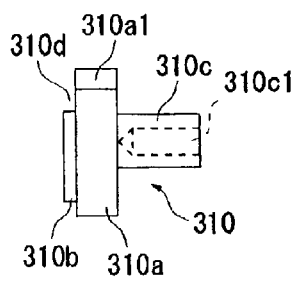
FIG. 50B is a rear view thereof.
Figure 50C:
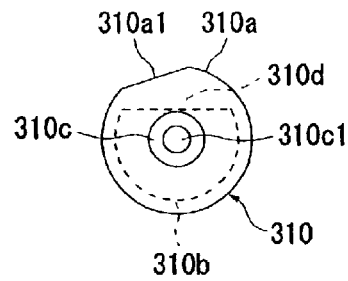
FIG. 50C is a right side view thereof.

As shown in FIGS. 50A to 50C, the feeding rotor 310 comprises the first disk 310a, second disk 310b which has a radius of curvature smaller than that of the first disk 310a and which is installed concentrically on one surface of the first disk 310a, and shaft 310c installed coaxially with the centers of curvature of the first disk 310a and second disk 310b. Also, it has a recess 310d as thick as the second disk 310b, forming a parallel space 311 between itself and a cover 302. Besides, the first disk 310a has an agitator 310a1 consisting of an inclined surface on its outer periphery while the second disk 310b has a crena 310b1 corresponding to the recess 310d. Furthermore, at an end of the shaft 310c is a screw hole 310c1.

Although the feeding rotor 310 shown in the drawings is produced by preparing the first disk 310a, second disk 310b, and shaft 310c as a single piece, it is also possible to produce the feeding rotor 310 by inserting the shaft 310c prepared as an integral part of the first disk 310a into the center hole of the second disk 310b, or by inserting the shaft 310c into the center holes of the first disk 310a and second disk 310b, or by inserting the shaft 310c prepared as an integral part of the second disk 310b into the center hole of the first disk 310a.

To house the above described feeding rotor 310 in the frame 301 and cover 302, the shaft 310c is inserted in the circular recess 301d of the frame 301 and the first disk 310a is inserted in the circular recess 301c, and then the support plate 309 is fitted in the rear flank of the recess 301b. The guide plate 306 may be installed in the recess 301b either before or after the insertion of the feeding rotor 310. Then the cover 302 is screwed to the frame 301. With the first disk 310a inserted in the circular recess 301c, the end of the shaft 310c sticks out from the right flank of the frame 301.

As shown in FIG. 45, the second disk 310b of the feeding rotor 310 rotatably contacts the inner surface of the cover 302, and the parallel space 311 with a width defined by the thickness of the second disk 310b is formed by the recess 310d between one surface of the first disk 310a and the inner surface of the cover 302. Besides, part of the outer periphery of the first disk 310a faces on the storeroom 305 and the parallel space 311 communicates with the storeroom 305.

Just under the above described recess 301b in the left flank of the frame 301, a groove 301e runs vertically. It has a rectangular cross section approximately as deep as the recess 301b. Incidentally, a similar groove is formed in the recess 301b if the support plate 309 is fitted in the rear flank of the recess 301b. At the lower end of the vertical part is a curve, ahead of which the groove 301e runs horizontally to the front part of the frame 301. When the cover 302 is screwed to the left flank of the frame 301, the vertical part of the groove 301e serves as a feeding path 312 and the curve and horizontal part of the groove 301e serve as a transport path 313. The second disk 310b of the feeding rotor 310 has a radius of curvature smaller than that of the first disk 310a. Consequently, a curved path with the same cross-sectional shape as the feeding path 312 is formed, continuing from the feeding path 312, between the curved surface 306a of the guide plate 306 and the outer periphery of the second disk 310 facing each other. In this apparatus, the curved path is used as the upper part of the feeding path 312. If transparent or translucent material is used for the cover 302, the stockpile of components in the storeroom 305, the condition of the electronic components EC in the parallel space 311 and feeding path 312, and the condition of the electronic components EC transported in the transport path 313 can be seen from outside.

As shown in FIGS. 53 to 58, a recess 301f is formed on the front top of the frame 301 to install a component stopper 314 and shutter 315. On the rear end of the recess 30 If is a step 301g with a face continuous with the top face of the groove 301e (transport path 313). As can be seen from FIGS. 57 and 58, the step 301g is roughly L-shaped when viewed from above. The front end of the groove 301e is exposed on the topside of the step 301g and used as a component output port of the transport path 313. A suction hole 301h is formed near the step 301g on the bottom face of the recess 301f. A tube connector 317 is installed just under the suction hole 301h for communicating the suction hole 301h with an air tube 316 (see FIG. 58). Besides, a stopper pin 318 is installed in front of the suction hole 301h on the bottom face of the recess 301f to restrict the forward travel of the component stopper 314.

Figure 59A:
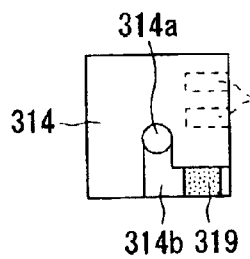
FIG. 59A is a top view of the component stopper shown in FIG. 53.
Figure 59B:
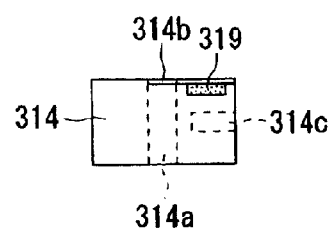
FIG. 59B is a left side view thereof.
Figure 59C:
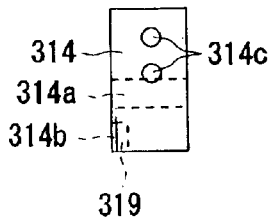
FIG. 59C is a rear view thereof.

As shown in FIGS. 59A to 59C, the component stopper 314 is made of non-magnetic material such as stainless steel into an approximate rectangular parallelepiped. It is approximately as high as the step 301g. In the component stopper 314 is a suction hole 314a which can communicate with the suction hole 301h in the frame 301. In the topside of the component stopper 314 is an L-shaped groove 314b continuous with the upper end of the suction hole 314a and capable of facing the front end of the groove 301e. Besides, to attract the headmost electronic component EC in the transport path 313 to the component stopper 314, a permanent magnet 319 such as a samarium-cobalt magnet is embedded in the groove 314b of the component stopper 314 in such a way that the north or south pole will face the front end of the groove 301e. Furthermore, a hole 314c for housing a coil spring 320 is formed in the rear face of the component stopper 314.

Figure 60A:
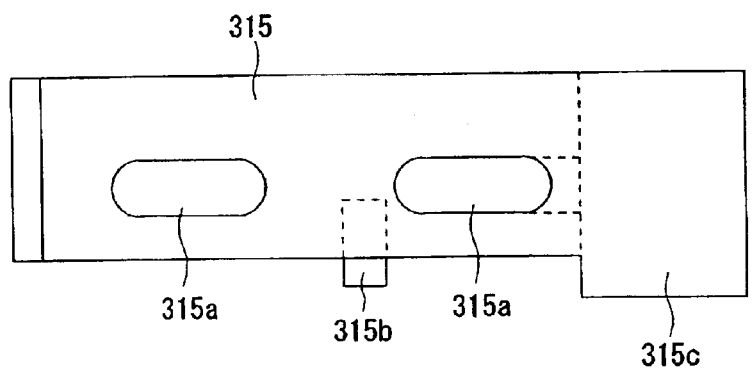
FIG. 60A is a top view of the shutter shown in FIG. 53.
Figure 60B:
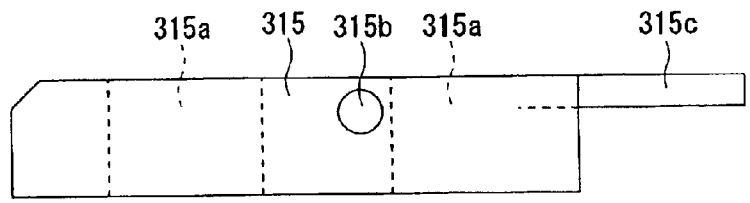
FIG. 60B is a left side view thereof.
Figure 60C:
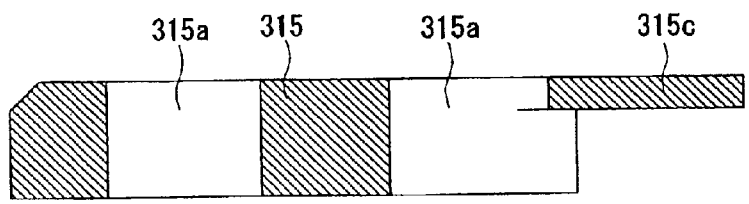
FIG. 60C is a longitudinal section thereof.

As shown in FIGS. 60A and 60B, the shutter 315 is made of non-magnetic material such as stainless steel. It has two guide holes 315a extending in the front/rear direction and a drive pin 315b located on the left flank. On the upper rear surface of the shutter 315 is a jaw 315c which can cover the topside of the component stopper 314 and surface of the step 301g.

Figure 53:
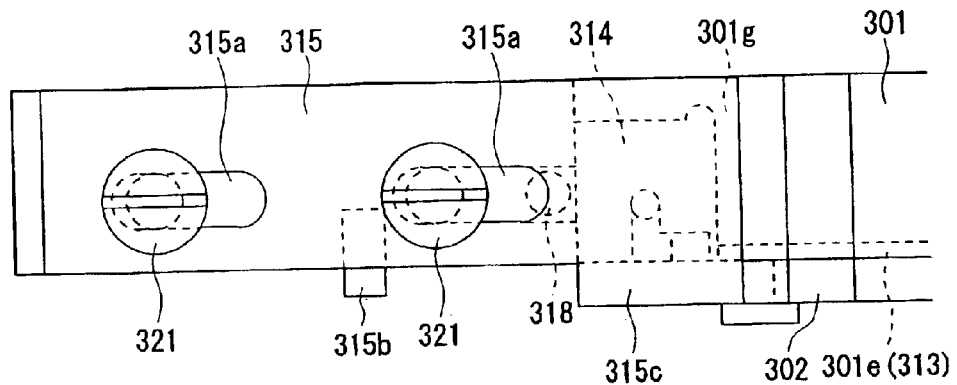
FIG. 53 is an enlarged partial top view of FIG. 43.
Figure 54:
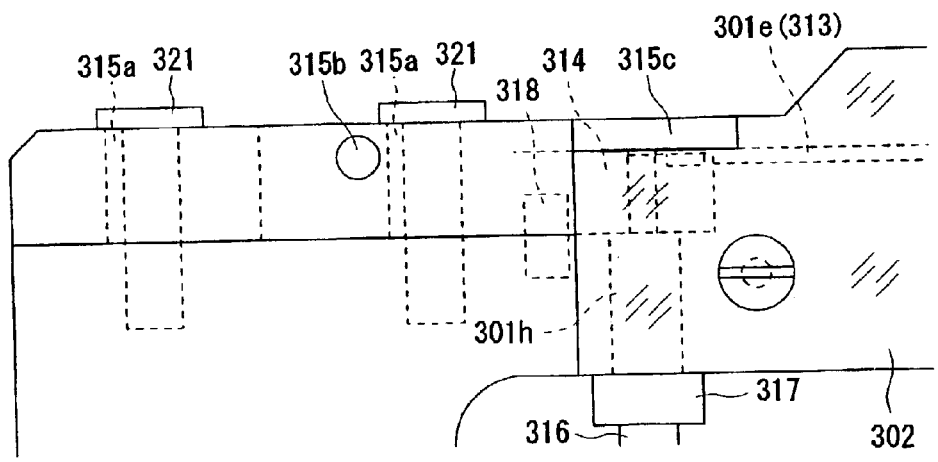
FIG. 54 is an enlarged partial side view of FIG. 43.
Figure 55:
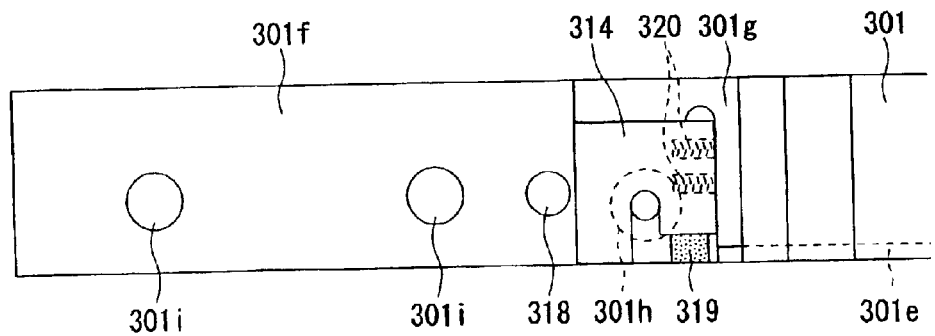
FIG. 55 is a diagram showing the view of FIG. 53 from which the shutter has been removed.
Figure 56:
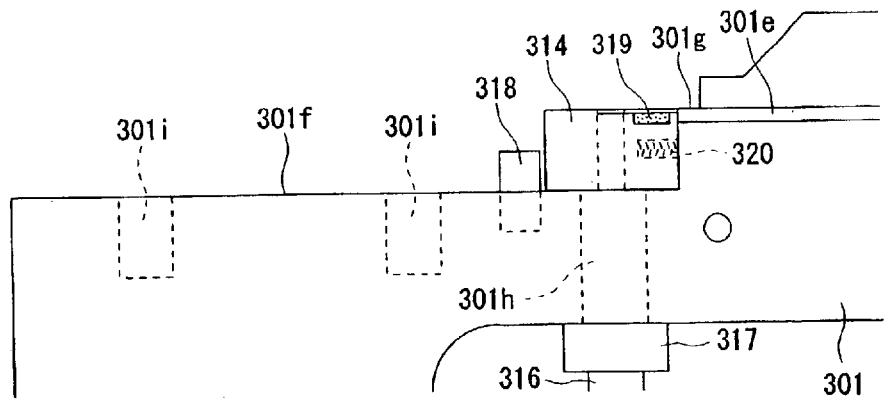
FIG. 56 is a diagram showing the view of FIG. 54 from which the shutter has been removed.
Figure 57:
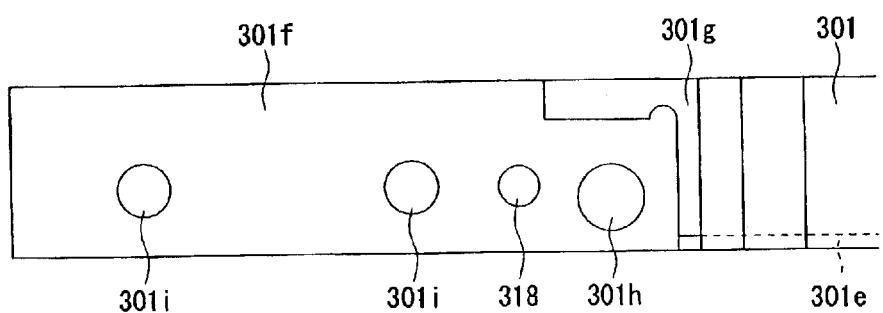
FIG. 57 is a diagram showing the view of FIG. 55 from which the component stopper has been removed.
Figure 58:
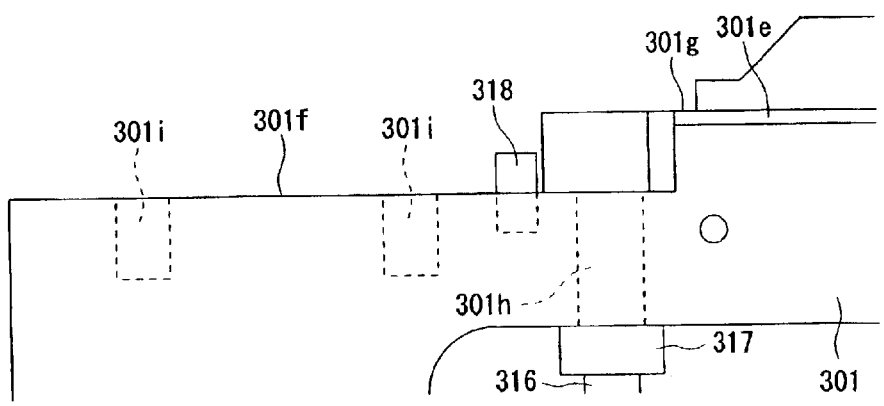
FIG. 58 is a diagram showing the view of FIG. 56 from which the component stopper has been removed.

The above described component stopper 314 and the above described shutter 315 are disposed in the front part of the frame 301 as follows so that they can move back and forth: the component stopper 314 containing the coil spring 320 in the hole 314c is inserted between the rear face of the recess 301f and the stopper pin 318, the shutter 315 is placed in the recess 301f, and a support shaft 321 inserted in the guide holes 315a of the shutter 315 is secured to the screw hole 301i made in the bottom face of the recess 30 If. When the shutter 315 is at its retracted position, the component stopper 314 is pressed backward by the shutter 315 against the force of the coil spring 320, keeping the rear end of the component stopper 314 in contact with the front end of the transport path 313 as shown in FIGS. 53 and 54. The shutter 315 jaw 315c covers the topside of the component stopper 314, surface of the step 301g on the frame 301, and exposed front end of the transport path 313.

Figure 44:
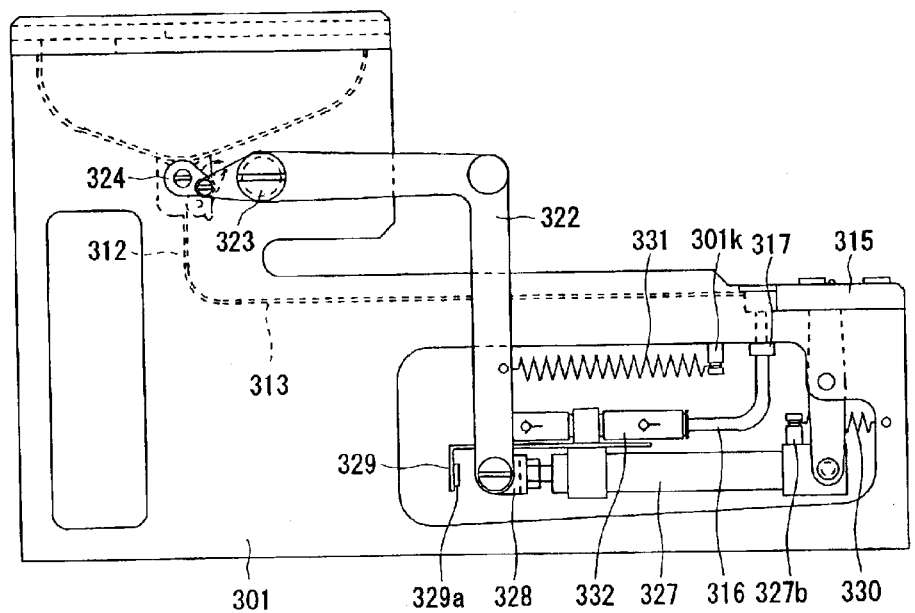
FIG. 44 is a right side view of a third apparatus according to the present invention.
Figure 51:
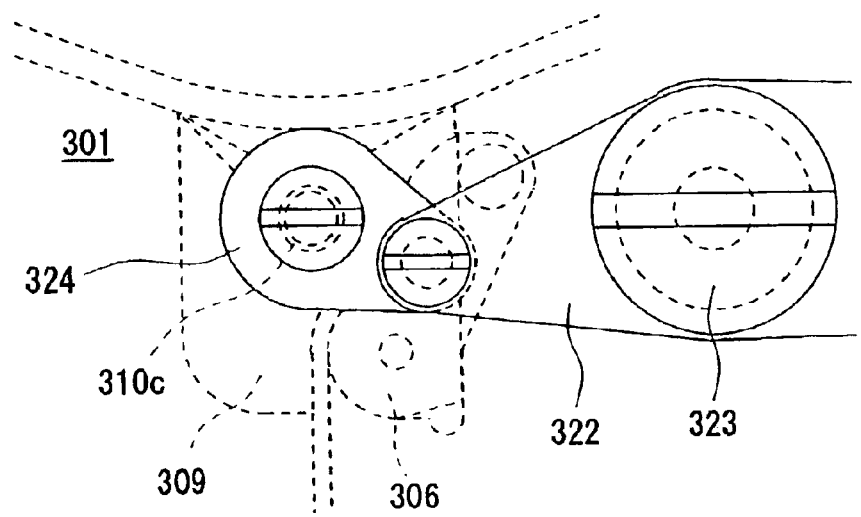
FIG. 51 is an enlarged partial view of FIG. 44.
Figure 52:
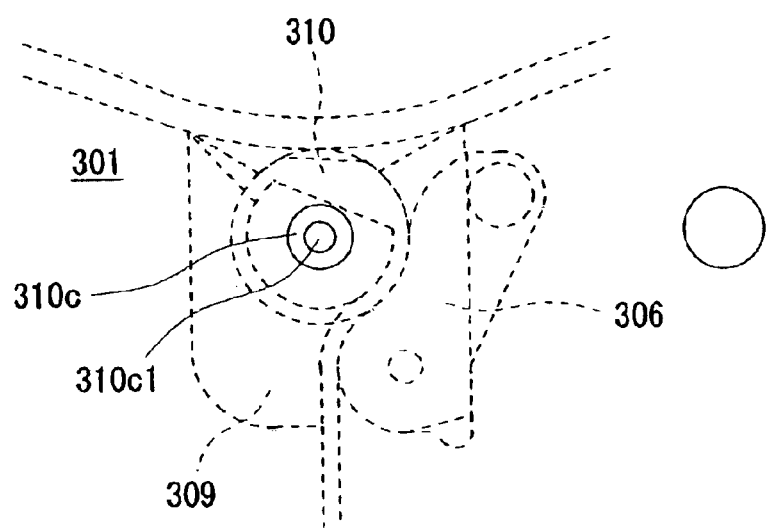
FIG. 52 is a diagram showing the view of FIG. 51 from which the control lever and drive link have been removed.

As shown in FIGS. 43 and 44, a control lever 322, which is roughly L-shaped, has the neighborhood of its rear end rotatably supported by a support shaft 323 secured to the right flank of the frame 301. As shown in FIG. 51, the rear end of the control lever 322 is rotatably coupled with a slot (not shown) in the front end of an oval-shaped drive link 324, which in turn is screwed to the screw hole 310c1 in the shaft 310c of the feeding rotor 310 which protrudes from the right flank of the frame 301.

As shown in FIGS. 43 and 44, a drive lever 325 is rotatably supported at its approximate center by a support shaft 326 secured to the front part of the left flank of the frame 301. In the upper end of the drive lever 325 is a roughly U-shaped engagement groove 325a, which is engaged with the shutter 315 drive pin 315b.

As shown in FIGS. 43 and 44, the air cylinder 327 is a double-acting type with two intake/exhaust ports. It has its front end rotatably coupled to the lower end of the drive lever 325. The tip of the rod 327a of the air cylinder 327 is fitted with a connecting plate 328, which is rotatably coupled to the lower end of the control lever 322. A stopper plate 329 is secured to the air cylinder 327 to limit the retraction stroke of the rod 327a. A cushioning pad 329a made of elastic material such as synthetic rubber or urethane resin is attached to that part of the stopper plate 329 which comes into contact with the tip of the rod 327a. Also, a coil spring 330 is mounted between an engagement pin 301j installed on the frame 301 and an engagement pin 327b installed on the front part of the air cylinder 327 and a coil spring 331 is mounted between an engagement pin 301k installed on the frame 301 and an engagement pin 322a installed on the control lever 322 to load the drive lever 325 and control lever 322 clockwise in FIG. 43.

One intake/exhaust port of the air cylinder 327 is connected with a control valve 332, as shown in FIGS. 43 and 44, to branch the intake and exhaust ports. Specifically, as indicated by valve symbols in FIGS. 43 and 44, the control valve 332 is structured such that its rear side serves as the exhaust port when the rod 327a retracts and that its front side serves as the intake port when the rod 327a advances from the retracted position. The intake port of the control valve 332 is connected with the other end of the above described air tube 316, and the exhaust port is open to the air.

The above described apparatus can handle electronic components EC in the shape of a rectangular prism with predetermined width, height, and length as well as electronic components EC in the shape of a cylinder with predetermined diameter and length. The electronic components EC are chip components such as chip capacitors, chip resistors or chip inductors; composite parts such as LC filters; array components such as capacitor arrays or inductor arrays; or other types of electronic component.

A rectangular cross section can be adopted for the feeding path 312 and transport path 313 regardless of the shape of the electronic components EC. However, it is necessary to adjust the thickness of the second disk 310b of the feeding rotor 310, which defines the width of the parallel space 311, and adjust the difference in the radius of curvature between the first disk 310a and second disk 310b of the feeding rotor 310, the dimensions of the feeding path 312, and the dimensions of the transport path 313 according to the width or height of the electronic component EC if the electronic component has a shape of a rectangular prism or according to the diameter of the electronic component EC if the electronic component has a cylindrical shape.

For example, when feeding an electronic component EC in the shape of a rectangular prism which has a dimensional relationship "length>width=height," the thickness of the second disk 310b of the feeding rotor 310 is set slightly larger than the width or height of the electronic component EC, the difference in the radius of curvature between the first disk 310a and second disk 310b of the feeding rotor 310 is set slightly larger than the width or height of the electronic component EC, the front-to-back spacing and side-to-side spacing of the feeding path 312 are set slightly larger than the width or height of the electronic component EC, and the vertical spacing and side-to-side spacing of the transport path 313 are set slightly larger than the width or height of the electronic component EC.

Also, when feeding an electronic component EC in the shape of a rectangular prism which has a dimensional relationship "length>width>height," the thickness of the second disk 310b of the feeding rotor 310 is set slightly larger than the height and smaller than the width of the electronic component EC, the difference in the radius of curvature between the first disk 310a and second disk 310b of the feeding rotor 310 is set slightly larger than the width of the electronic component EC, the front-to-back spacing of the feeding path 312 is set slightly larger than the width of the electronic component EC, the side-to-side spacing of the feeding path 312 is set slightly larger than the height and smaller than the width and smaller than the width of the electronic component EC, the vertical spacing of the transport path 313 is set slightly larger than the height and smaller than the width of the electronic component EC, and the side-to-side spacing of the transport path 313 is set slightly larger than the width of the electronic component EC. In this case, it is necessary to coordinate the position of the electronic component EC by rotating it 90 degrees around the center line of the electronic component EC when feeding the electronic component EC from the feeding path 312 to the transport path 313. For this positional change, a resin or metal tube with the same internal cross section as the feeding path 312 can be mounted between the feeding path 312 and transport path 313 by twisting it 90 degrees. Of course, it is also possible to cut the transport path 313 at an appropriate place, set the vertical spacing of the transport path connected with the feeding path 312 slightly larger than the width of the electronic component EC and set its side-to-side spacing slightly larger than the height and smaller than the width of the electronic component EC, set the vertical spacing of the transport path unconnected with the feeding path 312 slightly larger than the height and smaller than the width of the electronic component EC and set its side-to-side spacing slightly larger than the width of the electronic component EC, and mount a similar tube for positional change between the two transport paths.

Besides, when feeding a cylindrical electronic component EC, the thickness of the second disk 310b of the feeding rotor 310 is set slightly larger than the diameter of the electronic component EC, the difference in the radius of curvature between the first disk 310a and second disk 310b of the feeding rotor 310 is set slightly larger than the diameter of the electronic component EC, the front-to-back spacing and side-to-side spacing of the feeding path 312 are set slightly larger than the diameter of the electronic component EC, and the vertical spacing and side-to-side spacing of the transport path 313 are set slightly larger than the diameter of the electronic component EC.

The operation of the above described apparatus will be described below with reference to FIGS. 61 to 67, taking the case of an electronic component EC in the shape of a rectangular prism which has a dimensional relationship "length>width=height," for the sake of convenience.

To feed components, the above described apparatus, which is in the stand-by state shown in FIG. 43, starts operation with thousands to tens of thousands of electronic components EC stored in bulk in the storeroom 305. When the operation starts, the bend of the control lever 322 is pressed down for a predetermined distance by the application of an external force as shown in FIG. 61, and then the force is removed to return the control lever 322 under the force of the coil spring 331: this cycle is repeated at a predetermined frequency.

Figure 61:
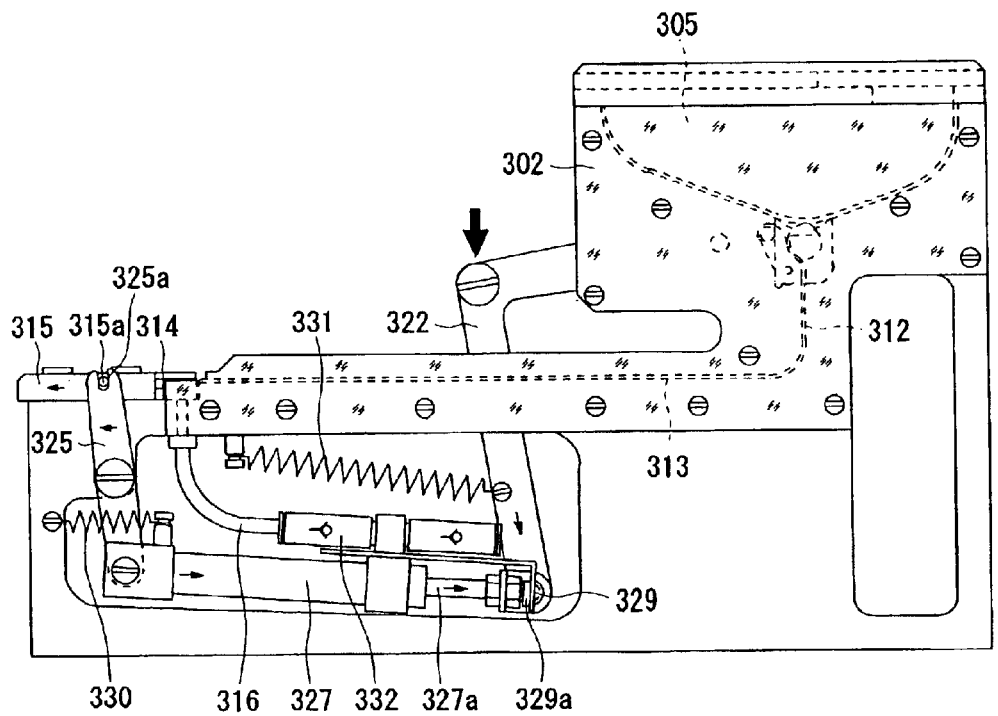
FIG. 61 is a diagram illustrating the operation of the apparatus shown in FIG. 43.
Figure 62:
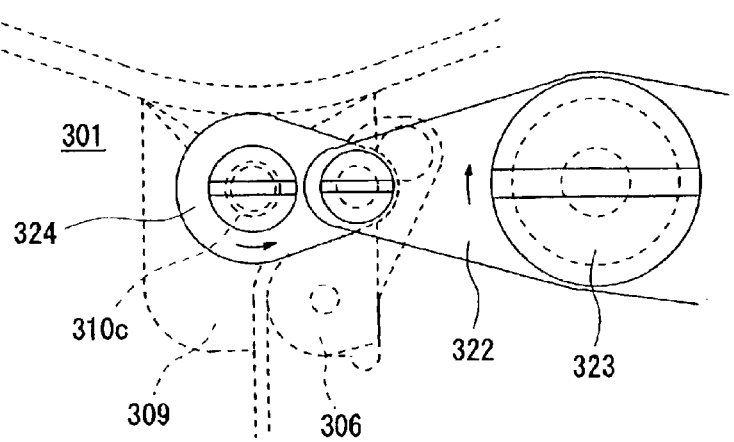
FIG. 62 is a diagram illustrating the operation of the apparatus shown in FIG. 43.

Referring to FIG. 61, when the bend of the control lever 322 is pressed down, the control lever 322 rotates counterclockwise by a predetermined angle, which causes the drive link 324 to rotate clockwise by a predetermined angle and the rod 327a of the air cylinder 327 to retract until it touches the cushioning pad 329a of the stopper plate 329. Then the air cylinder 327 retracts and the drive lever 325 rotates counterclockwise by a predetermined angle. On the other hand, when the force is removed from the bend of the control lever 322; the drive lever 325 returns by rotating in reverse under the force of the coil spring 330, the air cylinder 327 returns by retracting, and the control lever 322 returns by rotating in reverse under the force of the coil spring 331, causing the drive link 324 to return by rotating in reverse and the rod 327a of the air cylinder 327 to return by advancing from the retracted position.

Figure 63:
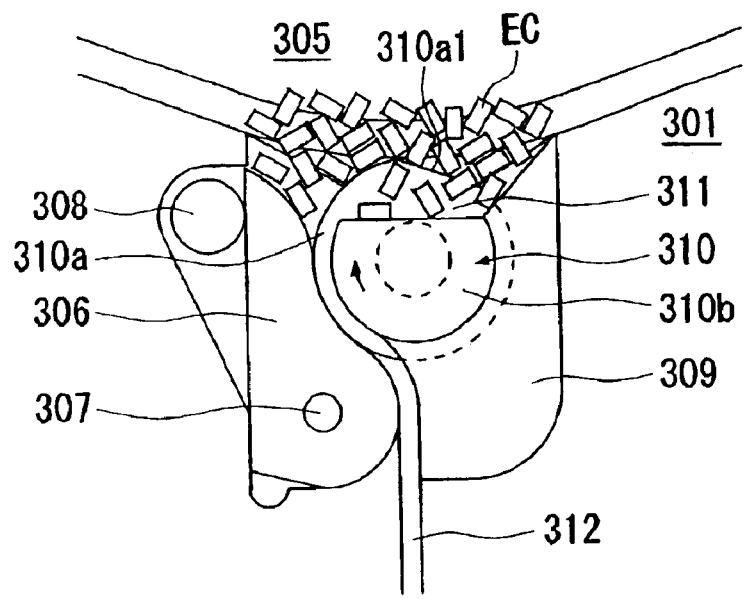
FIG. 63 is a diagram illustrating the operation of the apparatus shown in FIG. 43.
Figure 64:
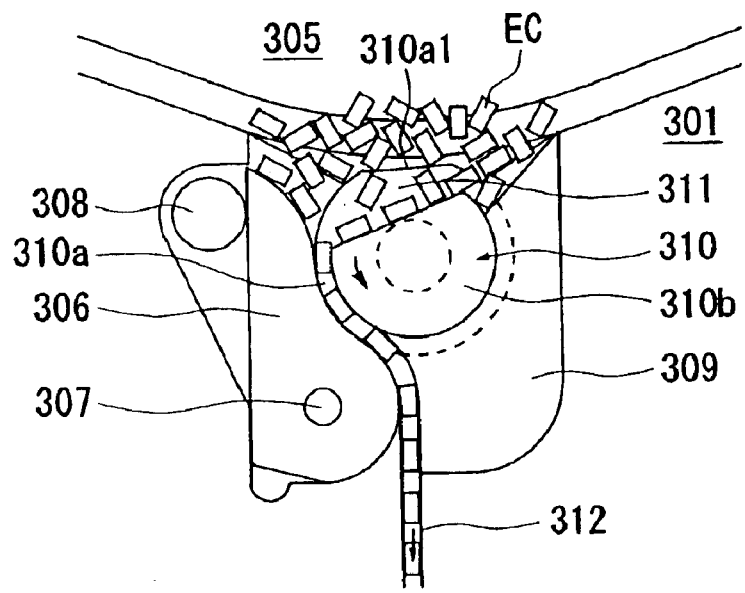
FIG. 64 is a diagram illustrating the operation of the apparatus shown in FIG. 43.

As shown in FIG. 61, when the drive link 324 rotates clockwise by a predetermined angle, the feeding rotor 310 rotates together in the same direction by the same angle as shown in FIG. 63. On the other hand, when the drive link 324 returns by rotating in reverse, the feeding rotor 310 rotates together in the same direction by the same angle as shown in FIG. 64. In the figure, the position in which the bottom face of the parallel space 311 (crena of the second disk 310b) is tilted is established as the stand-by position of the feeding rotor 310 and the feeding rotor 310 oscillates between that position and a position in which the bottom face of the parallel space 311 becomes approximately horizontal. However, it is also possible to set the stand-by position of the feeding rotor 310 at a position where the bottom face of the parallel space 311 is tilted and to rotate the feeding rotor 310 until it tilts less. Of course, by reversing the rotational direction of the feeding rotor 310, it is also possible to set the stand-by position of the feeding rotor 310 at a position where the bottom face of the parallel space 311 is approximately horizontal and to rotate the feeding rotor 310 until the bottom face of the parallel space 311 becomes tilted.

As shown in FIGS. 63 and 64, the electronic components EC stored in bulk in the storeroom 305 move downward along the bottom slopes of the recess 301a. A plurality of electronic components EC reach the outer periphery of the first disk 310a of the feeding rotor 310.

In this state, as the feeding rotor 310 oscillates within a predetermined angular range, the electronic components EC on the upper side of the first disk 310a are agitated by the agitator 310a1 and the agitated electronic components EC are taken into the parallel space 311 with one of their four side faces approximately parallel to the left flank of the first disk 310a. A plurality of electronic components EC can be taken simultaneously into the parallel space 311, which has a sufficiently large extent. The position of the parallel space 311 changes with the rotation of the feeding rotor 310, but components continue to be taken into the parallel space 311 regardless of this change.

During the oscillation of the feeding rotor 310, when the bottom face of the parallel space 311 (crena of the second disk 310b) tilts down toward the feeding path 312, the electronic components EC taken into the parallel space 311 move along the bottom slope toward the upper end of the feeding path 312, and being guided by the sliding surface 306c of the guide plate 306, they are taken one by one into the feeding path 312 with their four side faces approximately parallel to the four faces of the feeding path 312.

When an electronic component EC is taken out of the parallel space 311 into the feeding path 312, if the electronic component EC is pinched between the second disk 310b of the feeding rotor 310 and the guide plate 306, the guide plate 306 rotates counterclockwise against the elastic force of elastic material 308 to evacuate its upper part from the second disk 310b, as is the case with the first apparatus. This protects the electronic component EC pinched between the second disk 310b and guide plate 306 from excessive force, preventing damage to the electronic component EC and the feeding rotor 310. The guide plate 306 powered by the elastic material 308 automatically corrects the attitude of the electronic component EC pinched between the second disk 310b of the feeding rotor 310 and the guide plate 306 and frees the pinched electronic component EC.

Since the feeding rotor 310 oscillates at a predetermined frequency, the process of taking components from the storeroom 305 into the parallel space 311 and the process of taking components from the parallel space 311 into the feeding path 312 are performed practically continuously. The electronic components EC taken into the feeding path 312 move downward along the vertical feeding path 312 by gravity, have their attitude changed from vertical to horizontal while they are passing through the curve in the back of the transport path 313, and then taken into the horizontal transport path 313.

Incidentally, when feeding an electronic component EC in the shape of a rectangular prism which has a dimensional relationship "length>width=height," the components can be taken in similarly even if the thickness of the second disk 310b of the feeding rotor 310, difference in the radius of curvature between the first disk 310a and second disk 310b of the feeding rotor 310, and front-to-back spacing and side-to-side spacing of the feeding path 312 described above are set slightly larger than the diagonal on the end face of the electronic component EC and smaller than twice the width or height of the electronic component EC. In that case, the electronic components EC will be taken into the parallel space 311 and feeding path 312 with one of their four side faces forming an angle of up to 45 degrees with the left flank of the first disk 310a. However, this will not hinder component feeding because the orientation of the electronic components will be corrected to make their four side faces approximately parallel to the four faces of each path when the electronic components EC pass through the feeding path 312 or the curve in the transport path 313.

When the rod 327a of the air cylinder 327 retracts until it touches the cushioning pad 329a of the stopper plate 329, since the rear side of the control valve 332 serves as an exhaust port, air is released outside through the exhaust port along with the retraction of the rod 327a. On the other hand, when the rod 327a of the air cylinder 327 returns by advancing from the retracted position, since the front side of the control valve 332 serves as an intake port, an air suction force works to suck air into the transport path 313 through the air tube 316, the suction hole 301h in the frame 301, and the suction hole 314a and groove 314b in the component stopper 314 along with the advancement of the rod 327a. Incidentally, it is not that this air suction force is generated at the same time as the rod 327a of the air cylinder 327 starts to advance. Actually, the air suction force begins to be generated later than the rod 327a starts to advance.

Figure 65:
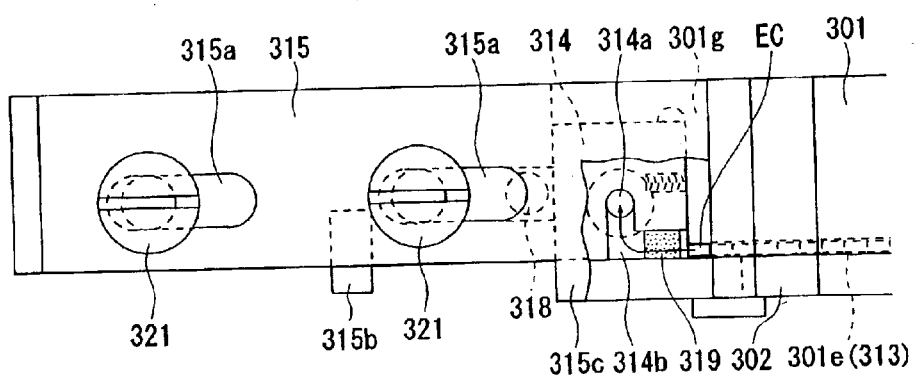
FIG. 65 is a diagram illustrating the operation of the apparatus shown in FIG. 43.

If the air suction force acts in the transport path 313 with the front end of the transport path 313 placed in contact with the rear end of the component stopper 314 and with the suction hole 314a and groove 314b in the component stopper 314 and the exposed front end (component output port) of the transport path 313 covered by the shutter 315 as shown in FIGS. 53 and 54, an air flow as indicated by the solid arrow in FIG. 65 is generated in the transport path 313. Consequently, the electronic components EC taken into the horizontal transport path 313 are drawn forward by the air flow and transported forward in aligned form in the transport path 313. The electronic components EC transported forward in aligned form in the transport path 313 stop when the headmost electronic component EC touches the component stopper 314 as shown in FIG. 65. Then the headmost electronic component EC is drawn to the component stopper 314 by means of a permanent magnet 319.

Then, as the drive lever 325 rotates counterclockwise by a predetermined angle against the force of the coil spring 330, the shutter 315, with its drive pin 315a in engagement with the engagement groove 325a of the drive lever 325, starts to advance from its retracted position while the component stopper 314, whose forward travel was restricted by the shutter 315, starts to advance, being driven by the force of the coil spring 320. On the other hand, when the drive lever 325 returns by rotating in reverse, being driven by the force of the coil spring 330, the shutter 315 returns by retracting from its advanced position, and the component stopper 314 returns by retracting from its advanced position, being pushed by the shutter 315.

Figure 66:
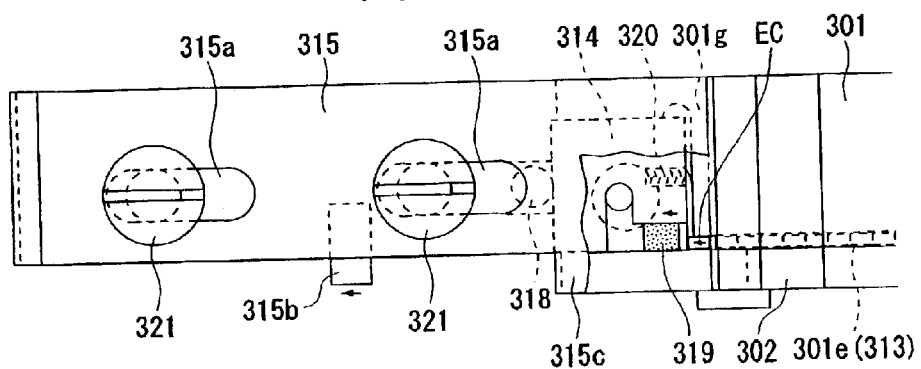
FIG. 66 is a diagram illustrating the operation of the apparatus shown in FIG. 43.
Figure 67:
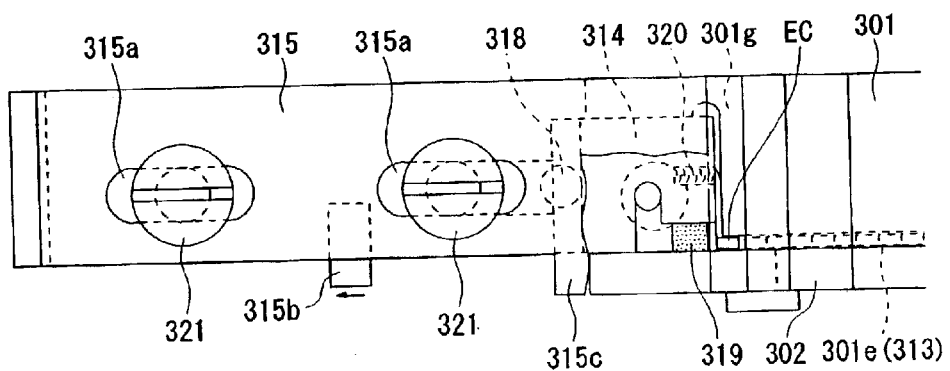
FIG. 67 is a diagram illustrating the operation of the apparatus shown in FIG. 43.

When the shutter 315 starts to advance with the electronic components EC lined up in the transport path 313 and with the headmost electronic component EC placed in contact with the component stopper 314 as shown in FIG. 65, the component stopper 314 advances the distance defined by the clearance between itself and the stopper pin 318 as shown in FIG. 66, the rear end of the component stopper 314 leaves the front end of the transport path 313, the headmost electronic component EC sticking to the component stopper 314 is separated from the succeeding electronic components EC by moving slightly forward, and a gap is formed between the headmost electronic component EC and the next electronic component EC. The shutter 315 advances further even after the component stopper 314 ceases to advance as shown in FIG. 67. This opens up the front end of the transport path 313 as well as part of the component stopper 314 groove 314b. The separated headmost electronic component EC is taken out, in the state shown in FIG. 67, through the front end (component output port) of the transport path 313 by a suction nozzle or the like.

After the separated headmost electronic component EC is taken out, when the shutter 315 returns by retracting from its advanced position, the component stopper 314 returns by retracting from its advanced position by the pressure of the shutter 315, and the suction hole 314a and groove 314b in the component stopper 314 and the front end of the transport path 313 are covered again by the shutter 315.

Thus, by oscillating the feeding rotor 310 within a predetermined angular range, the electronic component feeding apparatus described above can take the electronic components EC stored in bulk in the storeroom 305 into the parallel space 311 in such an orientation that the center line of the electronic components EC will be parallel to the feeding path 312, and each time the bottom of the parallel space 311 tilts down toward the feeding path 312 during an oscillation of the feeding rotor 310, the apparatus can move the electronic components EC in the parallel space 311 toward the feeding path 312, take one electronic component EC at a time into the feeding path 312 in such an orientation that the center line of the electronic component EC will be parallel to the feeding path 312, and allow the electronic component EC taken into the feeding path 312 to move downward under its own weight. Thus, by simply oscillating the feeding rotor 310 within a predetermined angular range, the apparatus can feed, in aligned form, the electronic components EC stored in bulk in the storeroom 305, in an efficient and stable manner. In this way, the apparatus provides feeding performance capable of keeping pace with component retrieval in a fast cycle time of 0.1 second or less.

Also, since the present invention can perform the aligned feeding described above by using only the feeding rotor 310, it can simplify and downsize the configuration of the feeding means existing between the storeroom 305 and feeding path 312 and eventually contribute to simplification, downsizing, and cost reduction of the apparatus.

Furthermore, by adjusting the thickness of the second disk 310b of the feeding rotor 310, which defines the width of the parallel space 311, and adjusting the difference in the radius of curvature between the first disk 310a and second disk 310b of the feeding rotor 310, the dimensions of the feeding path 312, and the dimensions of the transport path 313, it is possible to handle electronic components EC in the shape of a rectangular prism which has a dimensional relationship "length>width=height," electronic components EC in the shape of a rectangular prism which has a dimensional relationship "length>width>height," or electronic components EC in the shape of a cylinder.

Furthermore, since the agitator 310a1 consisting of an inclined surface is provided in the outer periphery of the first disk 310a of the feeding rotor 310, the electronic components EC on the upper side of the first disk 310a can be agitated efficiently while the feeding rotor 310 oscillates within a predetermined angular range, facilitating the process of taking the electronic components EC into the parallel space 311.

Furthermore, the feeding mechanism including the feeding rotor 310 can be exposed by removing the cover 302 from the frame 301. This makes the maintenance and repair of the feeding mechanism easier to perform.

Since part of the feeding path 312 adjacent to the feeding rotor 310 consists of the rotatable guide plate 306, if an electronic component EC is pinched between the second disk 310b of the feeding rotor 310 and the guide plate 306 when it is taken out of the parallel space 311 into the feeding path 312, the guide plate 306 can rotate counterclockwise against the elastic force of the elastic material 308 to evacuate its upper part from the second disk 310b. This protects the electronic component EC pinched between the second disk 310b and guide plate 306 from excessive force, preventing damage to the electronic component EC and the feeding rotor 310. The guide plate 306 powered by the elastic material 308 automatically corrects the attitude of the electronic component EC pinched between the second disk 310b of the feeding rotor 310 and the guide plate 306 and frees the pinched electronic component EC.

Furthermore, since the air cylinder 327 is used to provide the air suction force for transporting the electronic components EC taken into the transport path 313 from the feeding path 312, and it is mounted on the frame 301 so that it can be operated with a control lever 322, there is no need to install a separate suction source such as a vacuum pump for generating the suction force within the transport path 313 or to install complicated air piping from such a suction source. This also contributes to simplification, downsizing, and cost reduction of the apparatus.

Furthermore, after the electronic components EC transported forward in aligned form through the transport path 313 are stopped by the component stopper 314, the headmost electronic component EC sticking to the component stopper 314 by the magnetic force of the permanent magnet 319 can be separated from the succeeding electronic components EC by moving it slightly forward together with the component stopper 314 being advanced a predetermined distance. This prevents the headmost electronic component EC from interfering with the succeeding electronic components EC when it is taken out from the front end of the transport path 313 by a suction nozzle or the like, and thus ensures proper component retrieval operations.

Incidentally, although the apparatus described above employs the double-acting type air cylinder 327 comprising two intake/exhaust ports, connecting one of them with the control valve 332 and exposing the other to the air, it is also possible to install a filter at the exposed intake/exhaust port to avoid drawing dust into the air cylinder 327 together with air during the retraction of the rod 327a. Also, a filter may be installed in the air tube 316 or at the intake port of the control valve 332 to avoid drawing dust into the control valve 332 or air cylinder 327 together with the air drawn into the control valve 332 through the air tube 316. Of course, the air cylinder 327 may be a single-acting type with a single intake/exhaust port.

Also, in the apparatus described above, the frame 301 and cover 302 for the feeding rotor 310 are screwed together detachably. If a positioning pin and a positioning hole are provided on/in the left flank of the frame 301 and in the inner surface of the cover 302, respectively, or vice versa, the positioning accuracy in joining the frame 301 and cover 302 can be improved. Besides, the frame 301 and the cover 302 may be joined not only by screws, but also, for example, by attraction between permanent magnets or by attraction between a permanent magnet and ferromagnetic material as long as the required bonding power is ensured.

Furthermore, although in the apparatus described above, the headmost electronic component EC sticking to the component stopper 314 by the magnetic force of the permanent magnet 319 is separated from the succeeding electronic components EC by moving it slightly forward together with the component stopper 314, it is also possible to use the component stopper 314 without the permanent magnet 319. Then, the force applied to the headmost electronic component EC can be removed by taking away the component stopper 314 from the headmost electronic component EC.

Furthermore, although in the apparatus described above, the feeding rotor 310 is arranged with its shaft 310c placed approximately horizontal, similar feed operation can be performed even if the feeding rotor 310 is arranged with its shaft 310c tilted or if it is arranged such that the feeding path 312 will tilt together with the feeding rotor 310.

Furthermore, although the apparatus described above transports electronic components EC by supplying air suction force into the transport path 313 through its front end, it is also possible to transport electronic components EC by blowing air into the transport path 313 through its rear end.

Figure 68A:
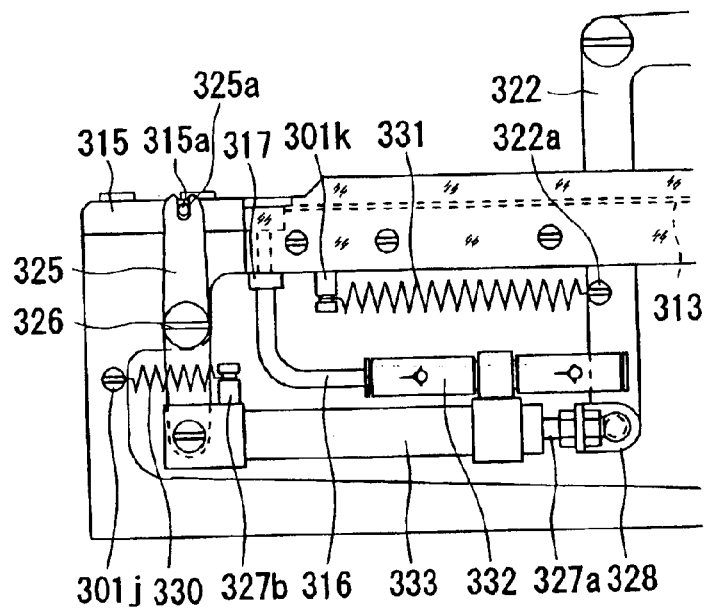
FIGS. 68A and 68B are diagrams showing a variation of the air cylinder of the apparatus shown in FIG. 43.
Figure 68B:
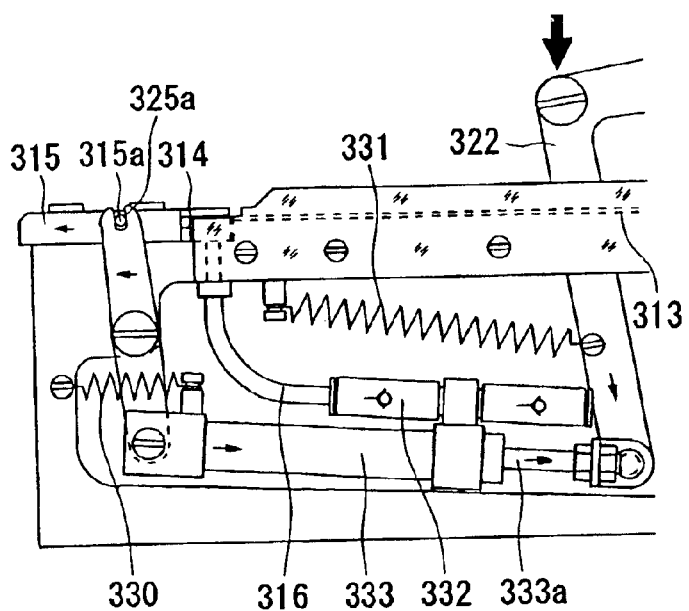

FIGS. 68A and 68B show a variation of the air cylinder 327 mounted between the control lever 322 and drive lever 325.

The air cylinder 333 shown in FIGS. 68A and 68B does not have a stopper plate such as the stopper plate 329 of the air cylinder 327, and the retraction stroke of the rod 333a is determined by the air cylinder 333 itself. Specifically, when the control lever 322 rotates as shown in FIG. 68B, the rod 333a of the air cylinder 333 retracts to its limits, and then the air cylinder 333 retracts along with the rotation of the control lever 322, causing the drive lever 325 to rotate counter-clockwise by a predetermined angle.

[Other Embodiments]

FIGS. 69A to 69J show variations of the first disk which are applicable to the feeding rotor 110 of the first apparatus, feeding rotor 216 of the second apparatus, and feeding rotor 310 of the third apparatus. Incidentally, the second disk and shaft are omitted in FIGS. 69A to 69J.

Figure 69A:
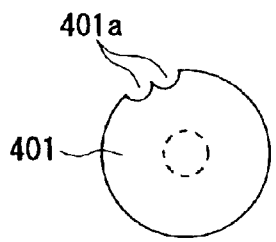
FIGS. 69A to 69J are diagrams showing variations of the first disk which are applicable to the feeding rotor of the first apparatus, feeding rotor of the second apparatus, and feeding rotor of the third apparatus.
Figure 69B:
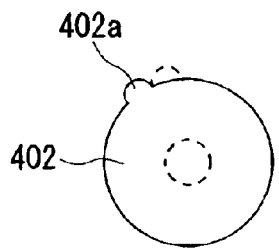
Figure 69C:
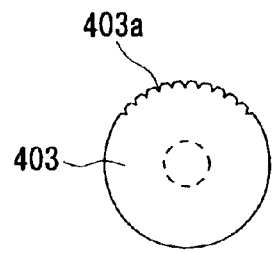
Figure 69D:
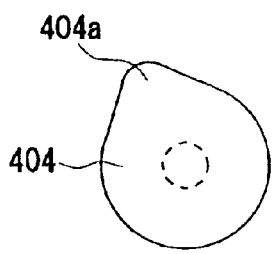
Figure 69E:
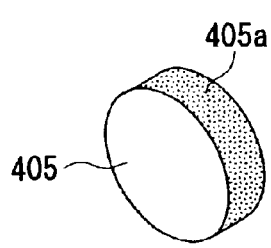
Figure 69F:
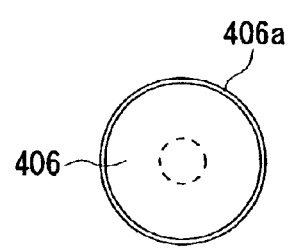
Figure 69G:
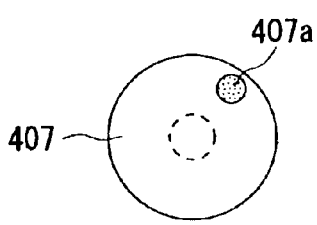
Figure 69H:
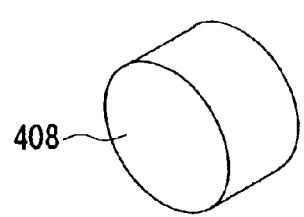
Figure 69I:
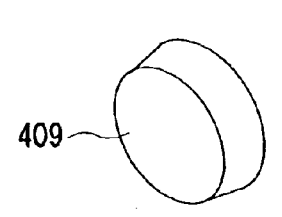
Figure 69J:
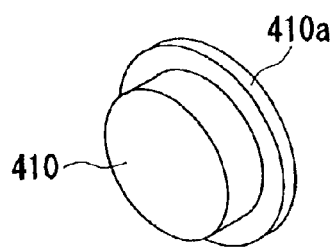

FIG. 69A shows a first disk 401 whose outer periphery is provided with an agitator 401a consisting of two semicircular grooves. FIG. 69B shows a first disk 402 whose outer periphery is provided with an agitator 402a consisting of at least one semicircular protrusion. FIG. 69C shows a first disk 403 whose outer periphery is provided with a knurled agitator 403a consisting of many long, narrow grooves. FIG. 69D shows a first disk 404 whose outer periphery is provided with an agitator 404a consisting of such a projection that makes the longitudinal section of the first disk 404 oval. FIG. 69E shows a first disk 405 whose outer periphery is provided with an agitator 405a consisting of a roughened surface with fine irregularities. FIG. 69F shows a first disk 406 whose outer periphery is provided with an agitator 406a consisting of a layer of flexible material such as synthetic rubber. FIG. 69G shows a first disk 407 whose outer periphery is embedded with a permanent magnet 407a such as a samarium-cobalt magnet to agitate electronic components EC by attracting them to the outer periphery of the first disk 407. When using such a first disk 407, it is advisable to dispose the permanent magnet 407a such that the magnetic attraction acting on the electronic components EC will become zero or drop sharply at one point during the rotation of the first disk 407. FIG. 69H shows a first disk 408 whose thickness is increased to increase the area of contact with electronic components EC. FIG. 69I shows a first disk 409 which has a shape of a truncated cone to guide electronic components EC on the outer periphery of the first disk 409 actively into the parallel space. FIG. 69J shows a first disk 410 provided with a large-diameter collar serving as an agitator 410a.

As described above, the first apparatus has the agitator 110a1 consisting of a semicircular groove in the outer periphery of the first disk 110a, the second apparatus has an agitator 216a1 consisting of a roughly U-shaped groove in the outer periphery of the first disk 216a, and the third apparatus has an agitator 310a1 consisting of an inclined surface on the outer periphery of the first disk 310a. However, desired agitation can be accomplished by using any of the first disks shown in FIGS. 69A to 69J.

FIGS. 70A to 70I show variations of the second disk which are applicable to the feeding rotor 110 of the first apparatus, feeding rotor 216 of the second apparatus, and feeding rotor 310 of the third apparatus. Incidentally, the first disk and shaft are omitted in FIGS. 70A to 70I.

Figure 70A:
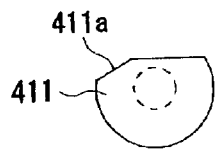
FIGS. 70A to 70I show variations of the second disk which are applicable to the feeding rotor of the first apparatus, feeding rotor of the second apparatus, and feeding rotor of the third apparatus.
Figure 70B:
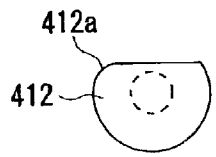
Figure 70C:
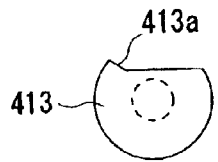
Figure 70D:
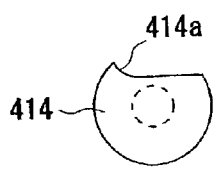
Figure 70E:
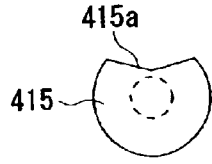
Figure 70F:
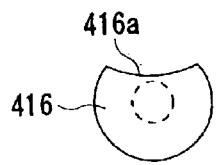
Figure 70G:
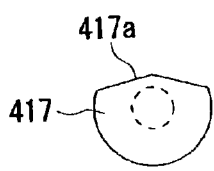
Figure 70H:
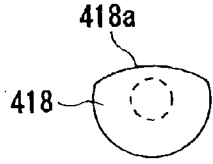
Figure 70I:
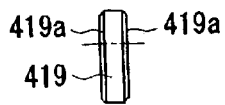

FIG. 70A shows a second disk 411 that has a crena (recess) 411a forming a flat surface and an inclined surface sloping down to the left, with the two surfaces meeting each other. FIG. 70B shows a second disk 412 that has a crena (recess) 412a forming a flat surface and a curved face sloping down to the left, with the two surfaces meeting each other. FIG. 70C shows a second disk 413 that has a crena (recess) 413a forming a flat surface and an inclined surface sloping up to the left, with the two surfaces meeting each other. FIG. 70D shows a second disk 414 that has a crena (recess) 414a forming a flat surface and a curved face sloping up to the left, with the two surfaces meeting each other. FIG. 70E shows a second disk 415 that has a crena (recess) 415a forming a V-shaped inclined surface. FIG. 70F shows a second disk 416 that has a crena (recess) 416a forming a concave curved surface. FIG. 70G shows a second disk 417 that has a crena (recess) 417a forming an inverted V-shaped inclined surface. FIG. 70H shows a second disk 418 that has a crena (recess) 418a forming a convex curved surface. FIG. 70I shows a second disk 419 whose cut surface has chamfers 419a.

The first to third apparatus described above have the respective crenas 110b1, 216b1, and 310b1 that form a flat surface on the second disks 110b, 216b, and 310b, respectively. However, the process of taking components from the storeroom into the parallel space and the process of taking components from the parallel space into the feeding path can be performed similarly by using any of the second disks shown in FIGS. 70A to 70I.

FIGS. 71A and 71B, 72A and 72B show variations of the feeding rotor which are applicable to the first apparatus, second apparatus, and third apparatus.

Figure 71A:
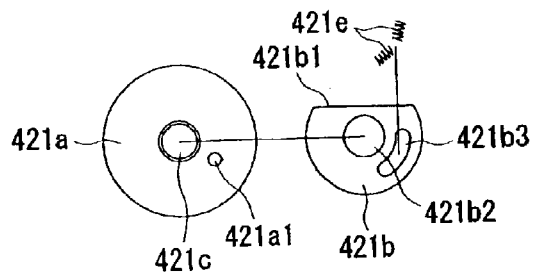
FIGS. 71A and 71B show such a variation of the feeding rotor that is applicable to the first apparatus, second apparatus, and third apparatus.
Figure 71B:
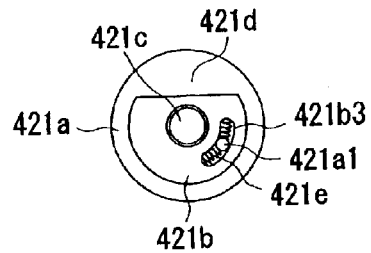

The feeding rotor 421 shown in FIGS. 71A and 71B comprises a first disk 421a, a second disk 421b having a radius of curvature smaller than that of the first disk 421a, and a shaft 421c prepared as an integral part of the first disk 421a. The second disk 421b has a crena 421b1 for forming a recess 421d for the parallel space, a hole 421b2 located at the center of curvature and capable of being fitted rotatably over the shaft 421c, and a slot 421b3 for housing a coil spring 421e. The first disk 421a has a pin 421a1 that can be inserted in the approximate center of the slot 421b3. The second disk 421b has the shaft 421c inserted in its hole 421b2, the pin 421a1 inserted in its slot 421b3, and the coil spring 421e disposed on both sides of the pin 421a1 in its slot 421b3.

The feeding rotor 421 has the capability to avoid overload by rotating the second disk 421b independently against the force of the coil spring 421e if the load on the second disk 421b increases. Thus, if excessive loading occurs due to jamming of electronic components EC or some other cause during the transport of electronic components EC from the parallel space to the feeding path, this capability protects the second disk 421b from overload and prevents damage to electronic components EC, the feeding rotor, etc.

Figure 72A:
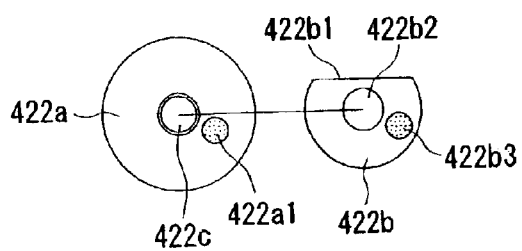
FIGS. 72A and 72B show such a variation of the feeding rotor that is applicable to the first apparatus, second apparatus, and third apparatus.
Figure 72B:
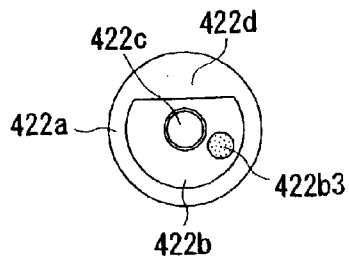

The feeding rotor 422 shown in FIGS. 72A and 72B comprises a first disk 422a, a second disk 422b having a radius of curvature smaller than that of the first disk 422a, and a shaft 422c prepared as an integral part of the first disk 422a. The second disk 422b has a crena 422b1 for forming a recess 422d for the parallel space, has a hole 422b2 located at the center of curvature and capable of being fitted rotatably over the shaft 422c, and is embedded with a permanent magnet 422b3 such as a samarium-cobalt magnet. The first disk 422a is embedded with a similar permanent magnet 422b3 or ferromagnetic material in the location corresponding to the location of the permanent magnet 422b3 in the second disk 422b.

The feeding rotor 422 has the capability to avoid overload by rotating the second disk 422b independently against the attraction of the permanent magnet if the load on the second disk 422b increases. Thus, if excessive loading occurs due to jamming of electronic components EC or some other cause during the transport of electronic components EC from the parallel space to the feeding path, this capability protects the second disk 422b from overload and prevents damage to electronic components EC, the feeding rotor, etc.

FIGS. 73 to 76 show the layout and construction of a feeding rotor with a configuration different from those of the feeding rotors used in the first, second, and third apparatus. Incidentally, the drawings illustrate a form adapted to the second apparatus.

As shown in FIGS. 73A to 73C, a feeding rotor 431 comprises two first disks 431a, a second disk 431b which has a radius of curvature smaller than that of the first disk 431a and which is installed concentrically between the two first disks 431a, and a shaft 431c installed coaxially with the centers of curvature of the two first disks 431a and second disk 431b. The second disk 431b has a crena 431b1 for forming a recess 431d. In this feeding rotor 431, the recess 431d provided between the two first disks 431a forms a parallel space 432 defined by the thickness of the second disk 431b.

Although the feeding rotor 431 shown in the drawings is produced by inserting the shaft 431c prepared as an integral part of one first disk 431a into the center holes of the second disk 431b and the other first disk 431a, it is also possible to produce the feeding rotor 431 by preparing the two first disks 431a, the second disk 431b, and the shaft 431c as a single piece, or by inserting the shaft 431c into the center holes of the two first disks 431a and the second disk 431b.

Figure 76:
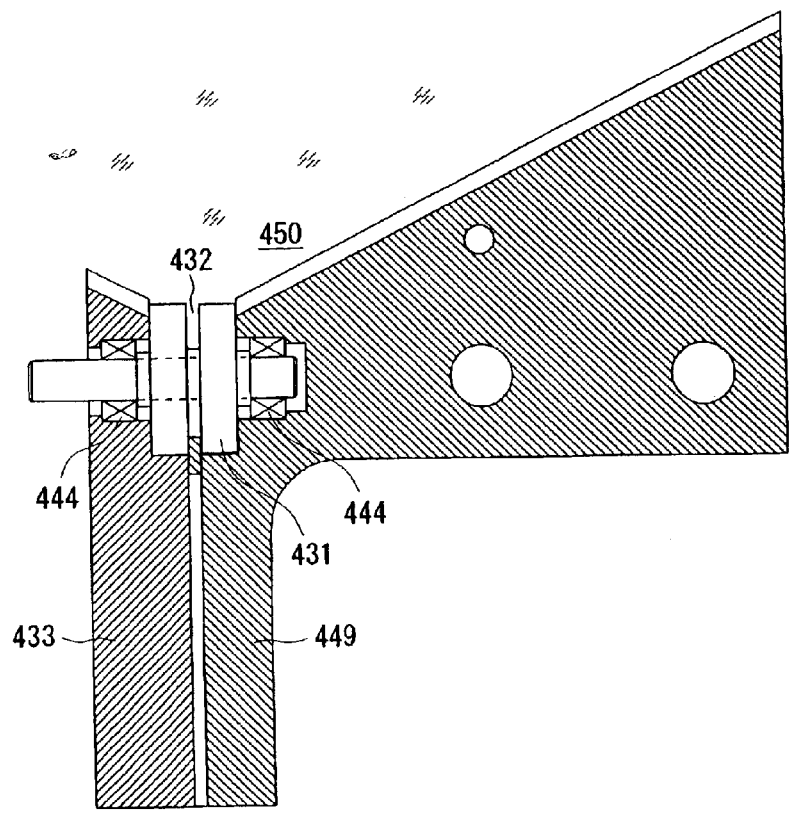
FIG. 76 is a diagram showing the layout and construction of the feeding rotor shown in FIGS. 73A to 73C.

As shown in FIGS. 74A and 76, a concave sliding surface 433a sloping downward to the rear is formed on the topside of a first support member 433. In the rear face of the first support member 433 is a circular recess 433b with a depth approximately equal to the total thickness of the first disks 431a and second disk 431b of the feeding rotor 431 and with a radius of curvature approximately equal to that of the first disk 431a. The upper part of the circular recess 433b is open to the sliding surface 433a, and the open end is provided with an inclined surface 433b1. Inside the circular recess 433b are a circular recess 433c fitted with a bearing 444, and a circular hole 433d for accepting the shaft 431c of the feeding rotor 431. Besides, a recess 433e with a depth approximately equal to the thickness of the second disk 431b of the feeding rotor 431 is provided to the left of the recess 433b in the rear face of the first support member 433 to house a guide plate 445, which is rotatably supported by a pin 433f in the recess 433e. Also, a recess 433g is provided to the lower right of the recess 433b in the rear face of the first support member 433, forming a groove of the feeding path, to house a support plate 446 for supporting the outer periphery of the second disk 431b of the feeding rotor 431. Two pins 433h are provided in the recess 433g. The support plate 446 has two holes 446b as well as a curved surface 446a with a curvature approximately corresponding to the radius of curvature of the second disk 431b of the feeding rotor 431. As shown in FIG. 74B, when the support plate 446 is placed in the recess 433g, a vertical groove 433i for the feeding path is formed in the rear face of the first support member 433. Furthermore, a board 447 that defines the stationary position of the guide plate 445 is screwed to the left flank of the first support member 433 and a plate spring 448 that supports the upper left edge of the guide plate 445 is screwed above it.

Figure 75A:
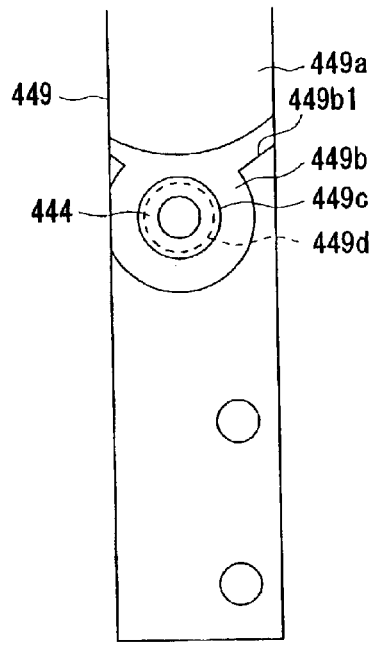
FIGS. 75A and 75B are diagrams showing the second support member used to mount the feeding rotor shown in FIGS. 73A to 73C.
Figure 75B:
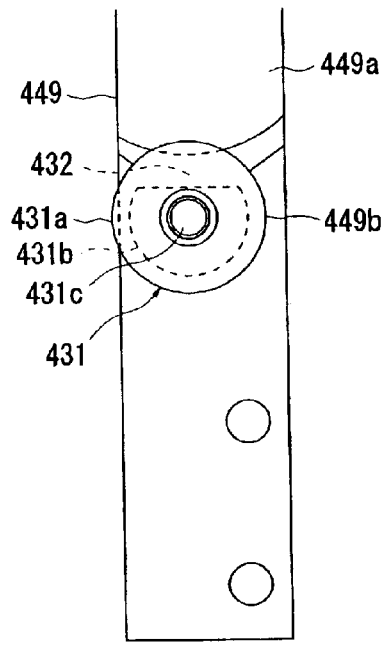

As shown in FIGS. 75A and 76, a concave sliding surface 449a sloping downward to the front is formed on the topside of the second support member 449. In the front face of the second support member 449 is a circular recess 449b with a depth approximately equal to the thickness of the first disk 431a of the feeding rotor 431 and with a radius of curvature approximately equal to that of the first disk 431a. The upper part of the circular recess 449b is open to the sliding surface 449a, and the open end is provided with an inclined surface 449b1. Inside the recess 449b are a circular recess 449c fitted with a bearing 444, and a circular hole 449d for accepting the shaft 431c of the feeding rotor 431.

To house the above described feeding rotor 431 in the first support member 433 and second support member 449, one end of the shaft 431c is inserted in the circular hole 433d and bearing 444 in the first support member 433, and then a hole 446b in the support plate 446 is fitted over a pin 443h while inserting one of the first disks 431a in the circular recess 433b. Then the other end of the shaft 431c is inserted in the circular hole 449d and bearing 444 in the second support member 449, and then the first support member 433 is screwed to the second support member 449 with the rear face of the first support member 433 placed against the front face of the second support member 449 so that the other first disk 431a will be inserted in the circular recess 449b. When the feeding rotor 431 is housed in the first support member 433 and the second support member 449, part of the outer peripheries of the two first disks 431a faces on a storeroom 450, and the parallel space 432 formed between the two first disks 431a communicates with the storeroom 450, as shown in FIG. 76.

The feeding rotor with its layout and construction shown in FIGS. 73 to 76 can agitate electronic components EC effectively with the two first disks 431a, improving the stability of component retrieval into the parallel space 432. Incidentally, the first disks 431a of the feeding rotor 431 may also employ the geometry of any of the first disks used in the first to third apparatus or shown in FIGS. 69A to 69J while the second disk 431b may employ the geometry of any of the second disks shown in FIGS. 70A to 70I.

FIGS. 77 to 80 show the layout and construction of a feeding rotor with a configuration different from those of the feeding rotors used in the first, second, and third apparatus. Incidentally, the drawings illustrate a form adapted to the second apparatus.

As shown in FIGS. 77A to 77C, a feeding rotor 451 comprises two first disks 451a, a second disk 451b which has a radius of curvature equal to that of the first disk 451*a* and which is installed concentrically between the two first disks 451*a*, and a shaft 451*c* installed coaxially with the centers of curvature of the two first disks 451*a* and second disk 451*b*. The second disk 451*b* has a crena 451*b*1 for forming a recess 451*d*. In this feeding rotor 451, the recess 451*d* provided between the two first disks 451*a* forms a parallel space 452 defined by the thickness of the second disk 451*b*.

Although the feeding rotor 451 shown in the drawings is produced by inserting the shaft 451*c* prepared as an integral part of one first disk 451*a* into the center holes of the second disk 451*b* and the other first disk 451*a*, it is also possible to produce the feeding rotor 451 by preparing the two first disks 451*a*, the second disk 451*b*, and the shaft 451*c* as a single piece, or by inserting the shaft 451*c* into the center holes of the two first disks 451*a* and the second disk 451*b*.

Figure 80:
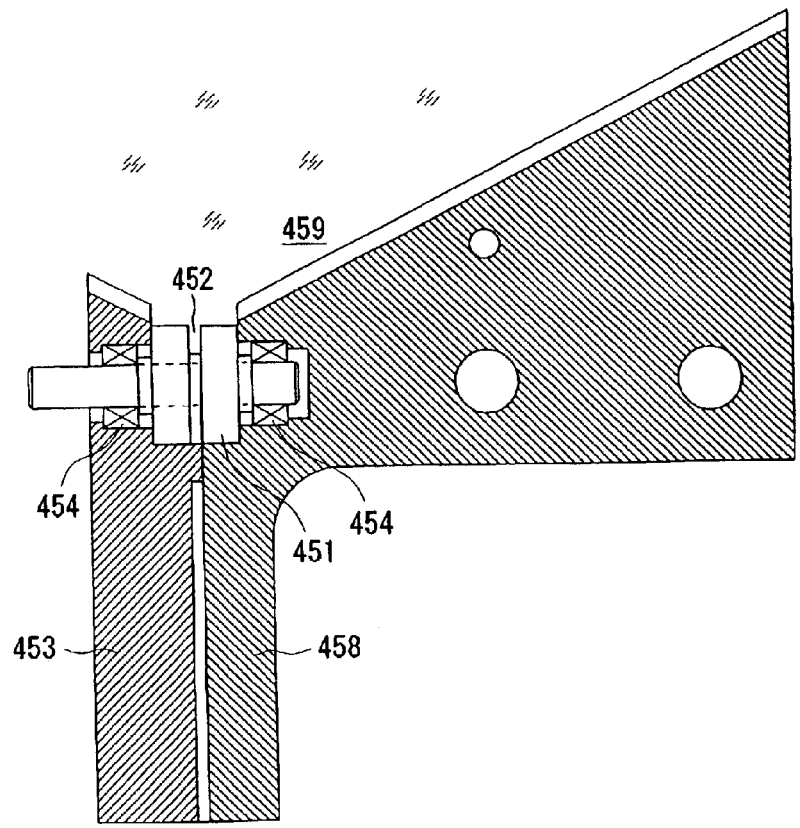
FIG. 80 is a diagram showing the layout and construction of the feeding rotor shown in FIGS. 77A to 77C.

As shown in FIGS. 78A and 80, a concave sliding surface 453*a* sloping downward to the rear is formed on the topside of a first support member 453. In the rear face of the first support member 453 is a circular recess 453*b* with a depth approximately equal to the total thickness of the first disks 451*a* and second disk 451*b* of the feeding rotor 451 and with a radius of curvature approximately equal to that of the first disk 451*a*. The upper part of the circular recess 453*b* is open to the sliding surface 453*a*, and the open end is provided with an inclined surface 453*b*1. Inside the circular recess 453*b* are a circular recess 453*c* fitted with a bearing 454, and a circular hole 453*d* for accepting the shaft 451*c* of the feeding rotor 451. Besides, a recess 453*e* with a depth approximately equal to the thickness of the second disk 451*b* of the feeding rotor 451 is provided to the left of the recess 453*b* in the rear face of the first support member 453 to house a guide plate 455, which is rotatably supported by a pin 453*f* in the recess 453*e*. Also, a groove 453*g* for the feeding path is formed under the recess 453*b* in the rear face of the first support member 453. The upper right flank of the groove 453*g* is bent as if to trace the curved surface of the circular recess 453*b* while the upper left flank of the groove 453*g* is bent as if to trace the lower curved surface of the guide plate 455. Furthermore, a board 456 that defines the stationary position of the guide plate 455 is screwed to the left flank of the first support member 453 and a plate spring 457 that supports the upper left edge of the guide plate 455 is screwed above it.

Figure 79A:
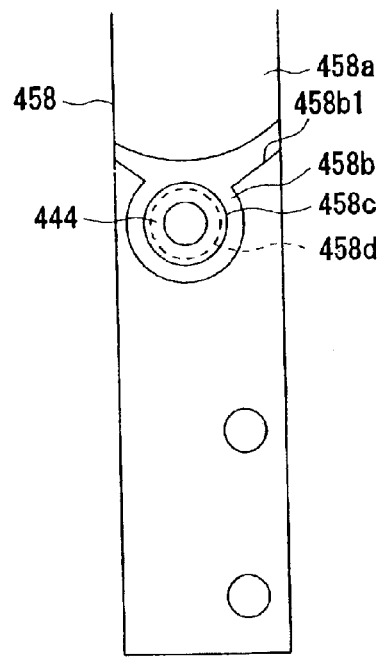
FIGS. 79A and 79B are diagrams showing the second support member used to mount the feeding rotor shown in FIGS. 77A to 77C.
Figure 79B:
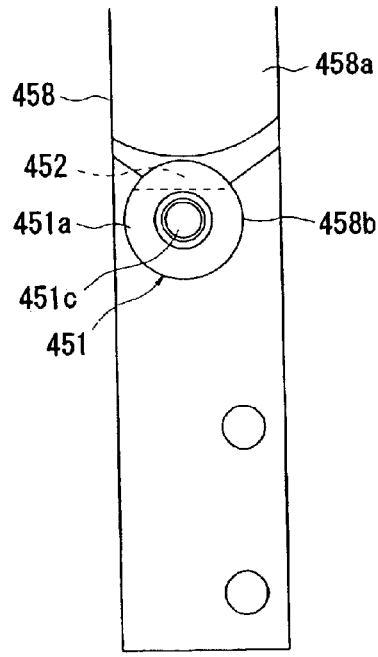

As shown in FIGS. 79A and 80, a concave sliding surface 458*a* sloping downward to the front is formed on the topside of the second support member 458. In the front face of the second support member 458 is a circular recess 458*b* with a depth approximately equal to the thickness of the first disk 451*a* of the feeding rotor 451 and with a radius of curvature approximately equal to that of the first disk 451*a*. The upper part of the circular recess 458*b* is open to the sliding surface 458*a*, and the open end is provided with an inclined surface 458*b*1. Inside the circular recess 458*b* are a circular recess 458*c* fitted with a bearing 454, and a circular hole 458*d* for accepting the shaft 451*c* of the feeding rotor 451.

To house the above described feeding rotor 451 in the first support member 453 and second support member 458, one end of the shaft 451*c* is inserted in the circular hole 453*d* and bearing 454 in the first support member 453, and one of the first disks 451*a* is inserted in the circular recess 453*b*. Then the other end of the shaft 451*c* is inserted in the circular hole 458*d* and bearing 454 in the second support member 458, and then the first support member 453 is screwed to the second support member 458 with the rear face of the first support member 453 placed against the front face of the second support member 458 so that the other first disk 451*a* will be inserted in the circular recess 458*b*. When the feeding rotor 451 is housed in the first support member 453 and the second support member 458, part of the outer periphery of the two first disks 451*a* faces on a storeroom 459, and a parallel space 452 formed between the two first disks 451*a* communicates with the storeroom 459, as shown in FIG. 80.

The feeding rotor with its layout and construction shown in FIGS. 77 to 80 can agitate electronic components EC effectively with the two first disks 451*a*, improving the stability of component retrieval into the parallel space 452. Incidentally, the first disks 451*a* of the feeding rotor 451 may also employ the geometry of any of the first disks used in the first to third apparatus or shown in FIGS. 69A to 69J while the second disk 451*b* may employ the geometry of any of the second disks shown in FIGS. 70A to 70I.

Figure 81:
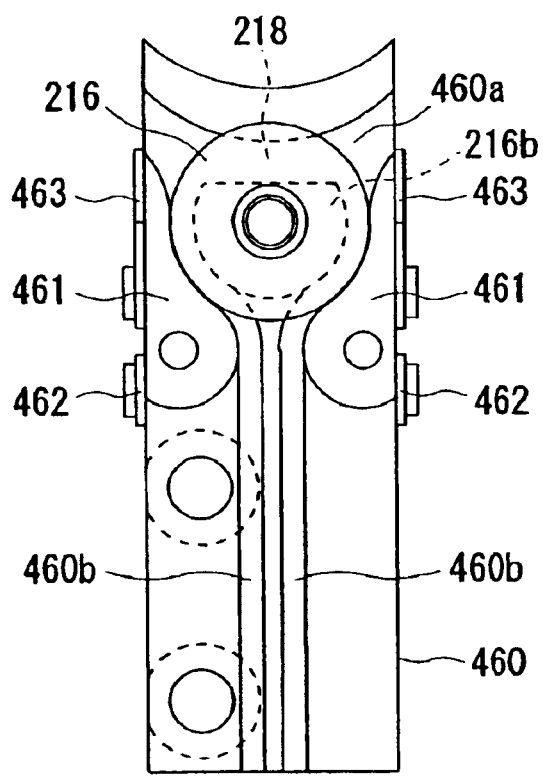
FIG. 81 is a diagram showing a variation of the first support member used in the first, second, and third apparatus.

FIG. 81 shows a variation of the first support member used in the first, second, and third apparatus. Incidentally, the drawing illustrates a form adapted to the first support member 203 of the second apparatus, and the same reference numerals—216 and 218—as with the second apparatus are used to denote the feeding rotor and parallel space.

The first support member 460 shown in FIG. 81 differs from the first support member 203 of the second apparatus in that a recess 460*a* which has a depth approximately equal to the thickness of the second disk 216*b* of the feeding rotor 216 is provided in the top center of the rear face, that two vertical grooves 460*b* with a rectangular cross section approximately as deep as the recess 460*a* are formed extending downward from both ends of the second disk 216*b*, and that with guide plates 461 disposed symmetrically on both sides of the second disk 216*b*, boards 462 which define the stationary position of the guide plates 461 as well as plate springs 463 which support the upper side edges of the guide plates 461 are provided on left and right sides.

The configuration of the support member 460 shown in FIG. 81 will allow the electronic components EC taken into the parallel space 218 to be sent simultaneously to two feeding paths consisting of two grooves 460*b*, by oscillating the feeding rotor 216 in such an angular range that the bottom face of the parallel space 218 will tilt at the same tilt angle in the clockwise and counterclockwise directions. In short, this configuration allows the single feeding rotor 216 to form two component feeding paths.

FIGS. 82A and 82B, 83A and 83B, and 84A and 84B show variations of the feeding rotor drive mechanism which are applicable to the first apparatus, second apparatus, and third apparatus.

Figure 82A:
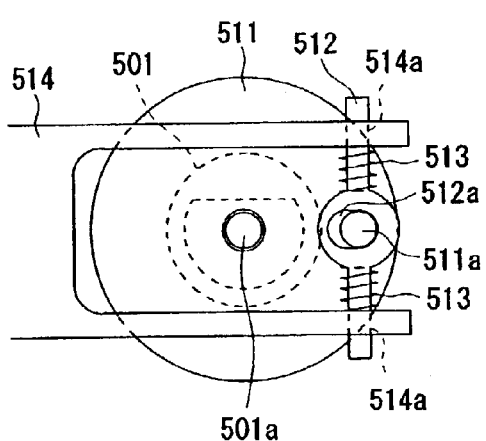
FIGS. 82A and 82B are diagrams showing such a variation of the feeding rotor drive mechanism that is applicable to the first apparatus, second apparatus, and third apparatus.
Figure 82B:
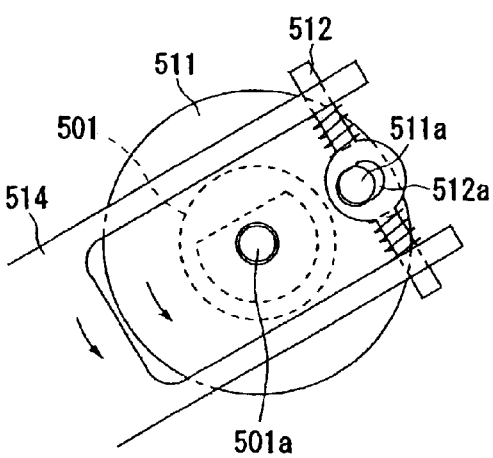

The feeding rotor drive mechanism shown in FIGS. 82A and 82B comprises a disk 511 having a drive pin 511*a* on one face and coupled to a shaft 501*a* of a feeding rotor 501, a rod 512 with a hole 512*a* in the center to insert the drive pin 511*a*, overload protecting coil springs 513 fitted to both ends of the rod 512, and a rotating lever 514 with holes 514*a* fitted over both ends of the rod 512. As shown in FIG. 82B, when the rotating lever 514 is turned counterclockwise, the disk 511 and feeding rotor 501 rotate in the same direction, and when the rotating lever 514 is turned clockwise from this position, the disk 511 and feeding rotor 501 return by rotating in the same direction. If the feeding rotor 501 is overloaded during oscillation, one of the coil springs 513 is compressed, suppressing the rotation of the feeding rotor 501. Incidentally, if a drive pin similar to the disk 511 drive pin 511*a* is installed on a first disk of the feeding rotor 501 and exposed to the outside, it is possible to eliminate the disk 511 and rotate the feeding rotor 501 directly by the rod 512 fitted in the rotating lever 514.

Figure 83A:
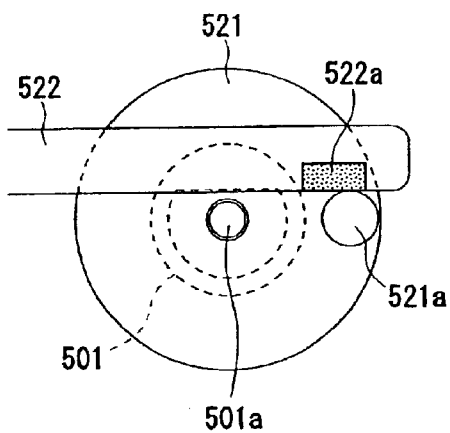
FIGS. 83A and 83B are diagrams showing such a variation of the feeding rotor drive mechanism that is applicable to the first apparatus, second apparatus, and third apparatus.
Figure 83B:
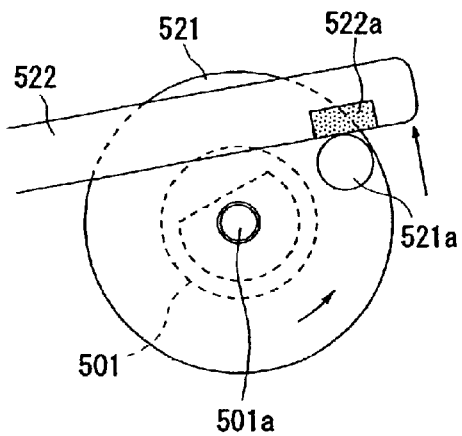

The feeding rotor drive mechanism shown in FIGS. 83A and 83B comprises a disk 521 having a drive pin 521a made of ferromagnetic material such as iron on one face and coupled to the shaft 501a of the feeding rotor 501, and a rotating lever 522 having, at its tip, a drive 522a consisting of a permanent magnet such as a samarium-cobalt magnet that can be drawn to the drive pin 521a. As shown in FIG. 83B, when the rotating lever 522 is turned counterclockwise, the disk 521 and feeding rotor 501 rotate in the same direction, and when the rotating lever 522 is turned clockwise from this position, the disk 521 and feeding rotor 501 return by rotating in the same direction. If the feeding rotor 501 is overloaded during oscillation, the attraction between the disk 521 drive pin 521a and the rotating lever 522 drive 522a is released, suppressing the rotation of the feeding rotor 501. Incidentally, similar results can be obtained if the disk 521 drive pin 521a is made of a permanent magnet such as a samarium-cobalt magnet and the rotating lever 522 drive 522a is made of ferromagnetic material such as iron. Also, if a drive pin similar to the disk 521 drive pin 521a is installed on a first disk of the feeding rotor 501 and exposed to the outside, it is possible to eliminate the disk 521 and rotate the feeding rotor 501 directly by the rotating lever 522 drive 522a.

Figure 84A:
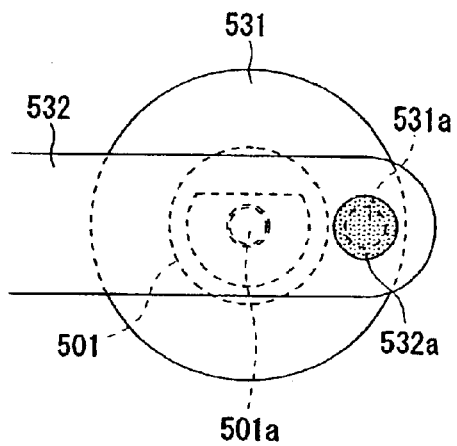
FIGS. 84A and 84B are diagrams showing such a variation of the feeding rotor drive mechanism that is applicable to the first apparatus, second apparatus, and third apparatus.
Figure 84B:
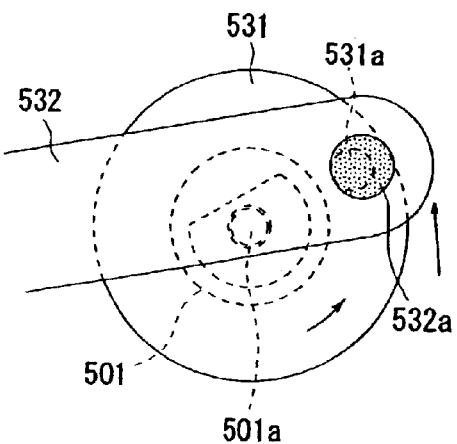

The feeding rotor drive mechanism shown in FIGS. 84A and 84B comprises a disk 531 having a drive portion 531a made of ferromagnetic material such as iron on one face and coupled to the shaft 501a of the feeding rotor 501, and a rotating lever 532 having, at its tip, a drive 532a consisting of a permanent magnet such as a samarium-cobalt magnet that can be drawn to the drive portion 531a. As shown in FIG. 84B, when the rotating lever 532 is turned counterclockwise, the disk 531 and feeding rotor 501 rotate in the same direction, and when the rotating lever 532 is turned clockwise from this position, disk 531 and feeding rotor 501 return by rotating in the same direction. If the feeding rotor 501 is overloaded during oscillation, the attraction between the disk 531 drive portion 531a and the rotating lever 532 drive 532a is released, suppressing the rotation of the feeding rotor 501. Incidentally, similar results can be obtained if the disk 531 drive portion 531a is made of a permanent magnet such as a samarium-cobalt magnet and the rotating lever 532 drive 532a is made of ferromagnetic material such as iron. Also, if a drive pin similar to the disk 531 drive portion 531a is installed on a first disk of the feeding rotor 501 and exposed to the outside, it is possible to eliminate the disk 531 and rotate the feeding rotor 501 directly by the rotating lever 532 drive 532a.

Figure 85:
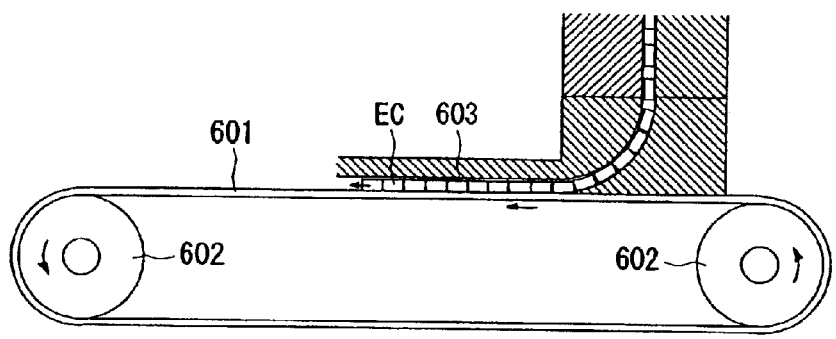
FIG. 85 is a diagram showing such a variation of the part transport mechanism that is applicable to the first apparatus, second apparatus, and third apparatus.
Figure 86:
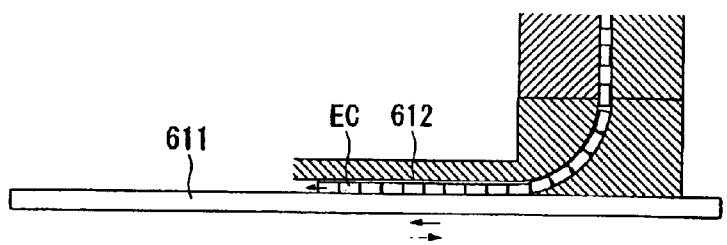
FIG. 86 is a diagram showing such a variation of the part transport mechanism that is applicable to the first apparatus, second apparatus, and third apparatus.

FIGS. 85 and 86 show variations of the part transport mechanism which are applicable to the first apparatus, second apparatus, and third apparatus. Although in the examples of the first, second, and third apparatus described above, electronic components EC are transported by means of the air suction force supplied into the transport path through its front end, FIGS. 85 and 86 show methods in which components are transported by means other than air suction.

The part transport mechanism shown in FIG. 85 comprises an endless belt 601 made of synthetic rubber, flexible resin, or the like; a pair of front and rear pulleys 602 for supporting the endless belt 601; a ratchet mechanism (not shown) for rotating one of the pulleys 602 intermittently at predetermined angular intervals; and a lever (not shown) for operating the ratchet mechanism. The electronic components EC in a transport path 603 are supported by the upper flat part of the endless belt 601. When the ratchet mechanism is operated with the lever, one of the pulleys 602 rotates intermittently at predetermined angular intervals, the endless belt 601 moves intermittently in a predetermined direction in sync with the rotation of the pulley, intermittently advancing the electronic components EC on the endless belt 601 together.

The part transport mechanism shown in FIG. 86 comprises a plate 611 with a flat surface made of metal or the like, a drive mechanism (not shown) for imparting forward motion and backward motion faster than the forward motion to the plate 611, and a lever (not shown) for operating the drive mechanism. The electronic components EC in a transport path 612 are supported by the plate 611. When the drive mechanism is operated with the lever, the plate 611 advances a predetermined distance together with the electronic components EC on it. The plate 611 returns by retracting after the forward travel, but since the backward motion is faster than the forward motion, the plate 611 returns by sliding under the electronic components EC, leaving the electronic components EC in place.

Figure 87:
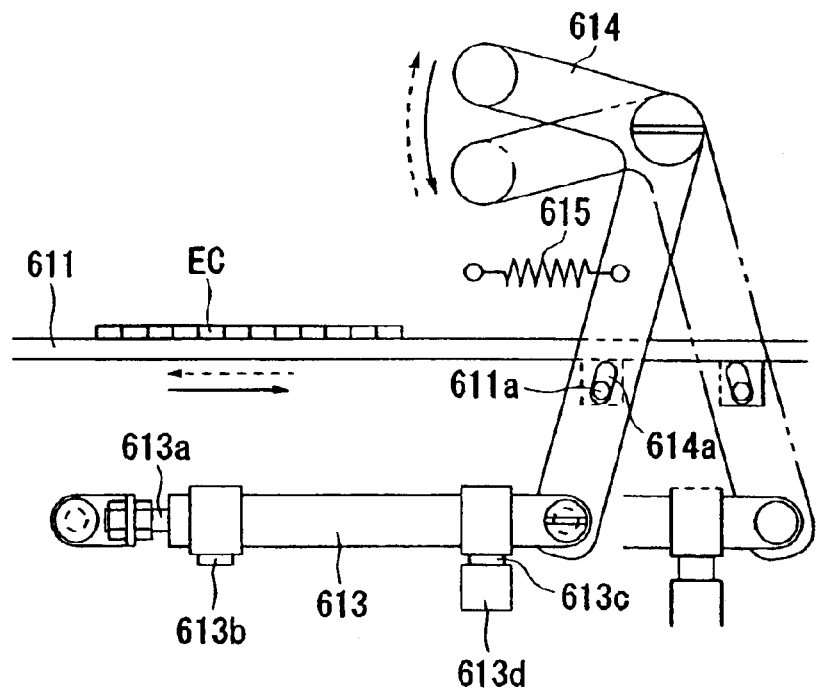
FIG. 87 is a diagram showing an example of the plate drive mechanism in the part transport mechanism shown in FIG. 86.

FIG. 87 shows an example of the above described plate drive mechanism, in which reference numeral 611 denotes a plate, 613 denotes a double-acting type air cylinder with two intake/exhaust ports, 614 denotes a rotatable lever, and 615 denotes a coil spring for returning the lever 614 and air cylinder 613. A pin 611a on the plate 611 is inserted in a slot 614a in the lever 614. The lower end of the lever 614 is rotatably coupled to the rear end of the air cylinder 613. The tip of the rod 613a of the air cylinder 613 is fixed to the frame. The front side intake/exhaust port 613b of the air cylinder 613 is open to the air while the rear side intake/exhaust port 613c is equipped with a flow regulating valve 613d for throttling exhaust flow.

When the lever 614 is turned counterclockwise by a downward push on its front end, the plate 611 and air cylinder 613 retract with air being discharged from the front side intake/exhaust port 613b. When the downward push is removed from the front end of the lever 614, the lever 614 returns by rotating clockwise under the force of a coil spring 615, the plate 611 and air cylinder 613 advance, and air is discharged through the flow regulating valve 613d at the rear side intake/exhaust port 613c. When the plate 611 is retracted by a downward push on the front end of the lever 614, air is discharged from the front side intake/exhaust port 613b along with the retraction of the air cylinder 613 and the plate 611 retracts at a speed proportional to the speed of the above described downward push. On the other hand, when the lever 614 returns by rotating clockwise, since the air discharged from the rear side intake/exhaust port 613b is throttled by the flow regulating valve 613d along with the advancement of the air cylinder 613, causing resistance to the plate 611 advancing under the force of the coil spring 615, the plate 611 advances more slowly than when it retracts.

Figure 88:
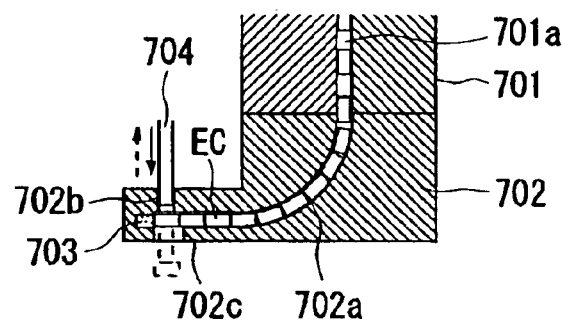
FIG. 88 is a diagram showing a use of the component feeding unit of the first apparatus, second apparatus, and third apparatus.
Figure 89:
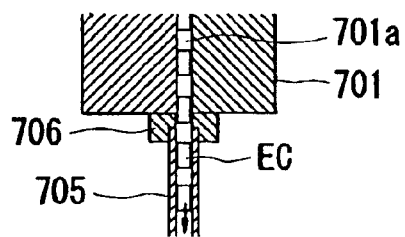
FIG. 89 is a diagram showing a use of the component feeding unit of the first apparatus, second apparatus, and third apparatus.

FIGS. 88 and 89 show uses of the component feeding unit of the first apparatus, second apparatus, and third apparatus, i.e., the unit which includes the storeroom, feeding rotor, and feeding path.

In FIG. 88, a member 702 which contains a transport path 702a continuous with a feeding path 701a of a feeding unit 701 is connected to the lower side of the feeding unit 701. Of the electronic components EC sent from the feeding path 701a into the transport path 702a, the headmost electronic component EC is drawn and held by a permanent magnet 703 and then extruded downward through an outlet 702c formed below the headmost electronic component EC, by an extrusion tool 704 such as a suction nozzle or rod inserted into a hole 702*b* formed above the headmost electronic component EC. The headmost electronic component EC extruded through the outlet 702*c* is mounted on a substrate or the like, the extrusion tool 704 ascends to its original position, and the next electronic component EC moves forward under its own weight and is drawn and held by the permanent magnet 703.

In FIG. 89, a transport tube 705 continuous with the feeding path 701*a* of the feeding unit 701 is connected to the lower side of the feeding unit 701 via a tube connector 706. The electronic components EC sent from the feeding path 701*a* into the transport tube 705 are transported to a desired location via the transport tube 705.

The preferred embodiments described herein are illustrative, not restrictive. The scope of the present invention is defined by the accompanying claims. The present invention covers all variations within the scope of the claims.

What is claimed is:

1. An electronic component feeding apparatus comprising:
    a storage area adapted to store a plurality of electronic components in bulk, said plurality of electronic components each having a predetermined shape;
    a feeding rotor having a curved surface, said feeding rotor being disposed adjacent a portion of said storage area and oriented such that a portion of said feeding rotor faces said storage area;
    a driver adapted to move said feeding rotor; and
    a feeding path having a curved path located at one portion of said feeding path and disposed along said curved surface of said feeding rotor, said feeding path adapted to move said plurality of electronic components retrieved one by one in a predetermined orientation from said storage area, said plurality of electronic components being adapted to be moved downward by gravity by said feeding path, said feeding rotor including a notch disposed on said curved surface thereof, said notch being adapted to retrieve said plurality of electronic components from said storage area in said predetermined orientation, an edge of the notch being arranged to change its position in response to movement of the feeding rotor so as to cause the curved path to change its form.

2. The electronic component feeding apparatus of claim 1, wherein said curved path has a cross-sectional shape corresponding to a cross-sectional shape of said feeding path.

3. The electronic component feeding apparatus of claim 1, wherein said curved path has a wall surface, a portion of said wall surface of said curved path comprising said curved surface of said feeding rotor.

4. The electronic component feeding apparatus of claim 1, wherein said feeding rotor comprises a disk, an outer periphery of said disk comprising said curved surface of said feeding rotor.

5. An electronic component feeding method comprising:
    storing a plurality of electronic components in bulk in a storage area, said plurality of electronic components each having a predetermined shape;
    disposing a feeding rotor having a curved surface adjacent a portion of said storage area and oriented such that a portion of said feeding rotor faces said storage area;
    moving said feeding rotor;
    disposing a feeding path having a curved path at one portion of said feeding path and along said curved surface of said feeding rotor; wherein said curved surface of said feeding rotor has a notch;
    moving said plurality of electronic components retrieved one by one in a predetermined orientation from said storage area with said feeding path, said plurality of electronic components being moved downward by gravity by said feeding path; retrieving said plurality of electronic components from said storage area in said predetermined orientation by using said notch; and
    changing the form of the curved path by changing the position of an edge of the notch by driving the feeding rotor.

6. The electronic component feeding method of claim 5, wherein a cross-sectional shape of said curved path corresponds to a cross-sectional shape of said feeding path.

7. The electronic component feeding method of claim 5, wherein said curved path has a wall surface, a portion of said wall surface of said curved path comprising said curved surface of said feeding rotor.

8. The electronic component feeding method of claim 5, wherein said feeding rotor includes a disk, an outer periphery of said disk comprising said curved surface of said feeding rotor.

9. A component feeding apparatus comprising:
    a feeding rotor having a curved surface; and
    a feeding path having a curved path located at one portion of said feeding path and disposed along said curved surface of said feeding rotor, said feeding path being adapted to move said plurality of components one by one in a predetermined orientation, said plurality of components being adapted to be moved downward by gravity by said feeding path, said feeding rotor including a notch disposed on said curved surface thereof, said notch being adapted to hold said plurality of components in said predetermined orientation, an edge of the notch being arranged to change its position in response to movement of the feeding rotor so as to cause the curved path to change its form.

10. The component feeding apparatus of claim 9, wherein said curved path has a cross-sectional shape corresponding to a cross-sectional shape of said feeding path.

11. The component feeding apparatus of claim 9, wherein said curved path has a wall surface, a portion of said wall surface of said curved path comprising said curved surface of said feeding rotor.

12. The component feeding apparatus of claim 9, wherein said feeding rotor comprises a disk, an outer periphery of said disk comprising said curved surface of said feeding rotor.

13. The component feeding apparatus of claim 9 further including a storage area for storing the components in bulk.

14. The component feeding apparatus of claim 9 wherein the components have the same predetermined shape.

15. The component feeding apparatus of claim 14 wherein the components are electronic components.

16. A component feeding method, the method being performed with a feeding rotor having a curved surface; the method comprising:
    moving said feeding rotor disposing a feeding path having a curved path at one portion of said feeding path and along said curved surface of said feeding rotor, wherein said curved surface of said feeding rotor has a notch;
    moving said plurality of components one by one in a predetermined orientation downward by gravity in said feeding path, holding said plurality of components in said predetermined orientation by using said notch,
    changing the form of the curved path by changing the position of an edge of the notch by driving the feeding rotor.

17. The component feeding method of claim 16, wherein a cross-sectional shape of said curved path corresponds to a cross-sectional shape of said feeding path.

18. The component feeding method of claim 16, wherein said curved path has a wall surface, a portion of said wall surface of said curved path comprising said curved surface of said feeding rotor.

19. The component feeding method of claim 16, wherein said feeding rotor includes a disk, an outer periphery of said disk comprising said curved surface of said feeding rotor.

20. The method of claims 16 further including storing the components in bulk prior to the moving step being performed.

21. The method of claim 16 wherein the components have the same predetermined shape.

22. The method of claim 21 wherein the components are electronic components.

* * * * *